United States Patent
Benkley, III et al.

(10) Patent No.: US 10,687,424 B2
(45) Date of Patent: Jun. 16, 2020

(54) CONFIGURABLE, ENCAPSULATED SENSOR MODULE AND METHOD FOR MAKING SAME

(71) Applicant: IDEX ASA, Fornebu (NO)

(72) Inventors: Fred G. Benkley, III, Andover, MA (US); David N. Light, Los Gatos, CA (US); David Joseph Geoffroy, Amherst, MA (US); Massimo Eugenio Ravelli, East Longmeadow, MA (US)

(73) Assignee: IDEX Biometrics ASA, Oslo (NO)

( * ) Notice: Subject to any disclaimer, the term of this patent is extended or adjusted under 35 U.S.C. 154(b) by 173 days.

(21) Appl. No.: 15/878,600

(22) Filed: Jan. 24, 2018

(65) Prior Publication Data

US 2018/0213646 A1 Jul. 26, 2018

Related U.S. Application Data

(60) Provisional application No. 62/449,875, filed on Jan. 24, 2017.

(51) Int. Cl.
*H05K 1/18* (2006.01)
*H05K 1/11* (2006.01)
(Continued)

(52) U.S. Cl.
CPC ......... *H05K 1/183* (2013.01); *G06K 9/00006* (2013.01); *H04M 1/026* (2013.01); *H04M 1/0277* (2013.01); *H04M 1/67* (2013.01); *H05K 1/0298* (2013.01); *H05K 1/111* (2013.01); *H05K 1/181* (2013.01); *H05K 2201/099* (2013.01);
(Continued)

(58) Field of Classification Search
CPC ...... H05K 1/183; H05K 1/111; H05K 1/0298; H05K 1/181; H05K 2201/10151; G06K 9/00006
See application file for complete search history.

(56) References Cited

U.S. PATENT DOCUMENTS 6,011,859 A * 1/2000 Kalnitsky .......... G06K 9/00053
382/100
6,950,541 B1 9/2005 Setlak et al.
(Continued)

FOREIGN PATENT DOCUMENTS

EP 3 007 102 A2 4/2016

OTHER PUBLICATIONS

International Search Report and Written Opinion dated Apr. 10, 2018 issued in International PAtent Application No. PCT/IB2018/050430. (20 pages).
(Continued)

*Primary Examiner* — Ming Y Hon
(74) *Attorney, Agent, or Firm* — Rothwell, Figg, Ernst & Manbeck, P.C.

(57) ABSTRACT

A fingerprint sensor module includes a fingerprint sensor assembly with a circuit element attached. The fingerprint sensor assembly is electrically connected to a printed circuit board (PCB) substrate with a cutout to accommodate the circuit element. The entire fingerprint sensor assembly and at least part of the PCB are encapsulated in a encapsulating material to produce a structurally robust fingerprint sensor module suitable for integration into an electronics device such as a smartphone or other "Internet of Things" (IOT) electronic device.

31 Claims, 40 Drawing Sheets

(51) Int. Cl.
*H05K 1/02* (2006.01)
*G06K 9/00* (2006.01)
*H04M 1/67* (2006.01)
*H04M 1/02* (2006.01)

(52) U.S. Cl.
CPC ............... *H05K 2201/1003* (2013.01); *H05K 2201/10015* (2013.01); *H05K 2201/10151* (2013.01); *H05K 2201/10545* (2013.01); *H05K 2201/10719* (2013.01); *H05K 2201/10734* (2013.01)

(56) References Cited

U.S. PATENT DOCUMENTS

| | | |
|---|---|---|
| 7,751,601 B2 | 7/2010 | Benkley, III |
| 8,224,044 B2 | 7/2012 | Benkley, III |
| 8,378,508 B2 | 2/2013 | Bond et al. |
| 8,736,001 B2 | 5/2014 | Salatino et al. |
| 8,867,799 B2 | 10/2014 | Benkley, III |
| 9,030,440 B2 | 5/2015 | Pope et al. |
| 9,135,495 B1 | 9/2015 | Pope et al. |
| 9,152,838 B2 | 10/2015 | Wickboldt et al. |
| 9,177,191 B2 | 11/2015 | Benkley, III |
| 9,268,989 B2 | 2/2016 | Pope et al. |
| 9,569,654 B2 | 2/2017 | Benkley, III |
| 9,576,178 B2 | 2/2017 | Pope et al. |
| 9,651,513 B2 | 5/2017 | Dunlap et al. |
| 2004/0188838 A1 | 9/2004 | Okada et al. |
| 2006/0083411 A1* | 4/2006 | Benkley, III ....... G06K 9/00053 382/124 |
| 2011/0254108 A1 | 10/2011 | Gozzini et al. |
| 2013/0108124 A1 | 5/2013 | Wickboldt et al. |
| 2013/0271422 A1* | 10/2013 | Hotelling ................ G06F 3/044 345/174 |
| 2013/0320464 A1 | 12/2013 | Bond et al. |
| 2014/0354596 A1* | 12/2014 | Djordjev ............... G06K 9/0002 345/175 |
| 2015/0036065 A1* | 2/2015 | Yousefpor .............. G06K 9/228 349/12 |
| 2015/0091588 A1* | 4/2015 | Wickboldt ......... G06K 9/00013 324/661 |
| 2015/0187707 A1 | 7/2015 | Lee et al. |
| 2015/0296622 A1* | 10/2015 | Jiang ...................... G01L 1/2268 361/750 |
| 2016/0004899 A1* | 1/2016 | Pi ......................... G06F 1/1626 345/173 |
| 2016/0131505 A1 | 5/2016 | Rao et al. |
| 2017/0147852 A1* | 5/2017 | Benkley ............. H01L 23/5387 |
| 2017/0280561 A1* | 9/2017 | Haney ................... H05K 1/181 |

OTHER PUBLICATIONS

International Preliminary Report on Patentability dated Aug. 8, 2019 issued in International Application No. PCT/IB2018/050430. (14 pages).

\* cited by examiner

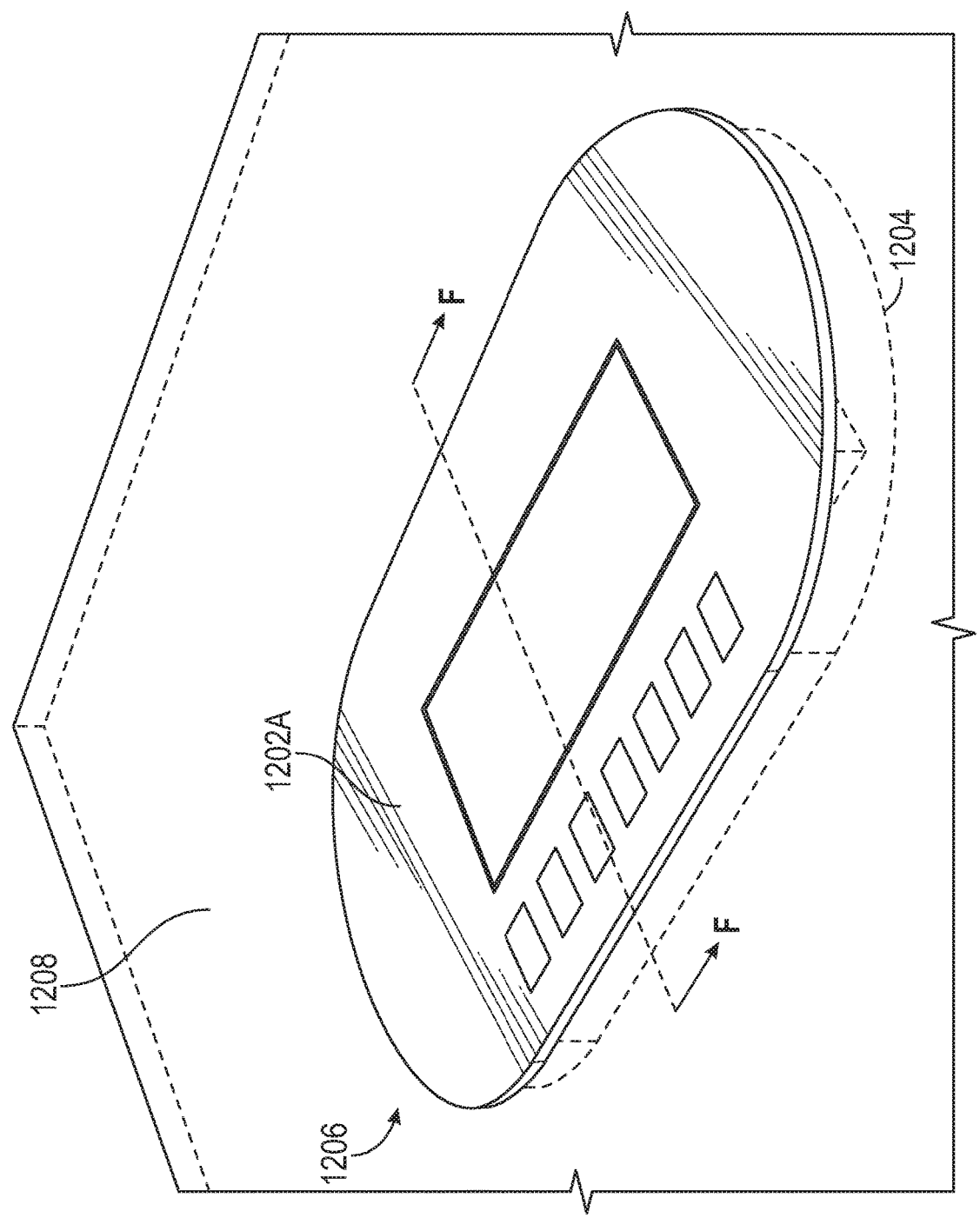

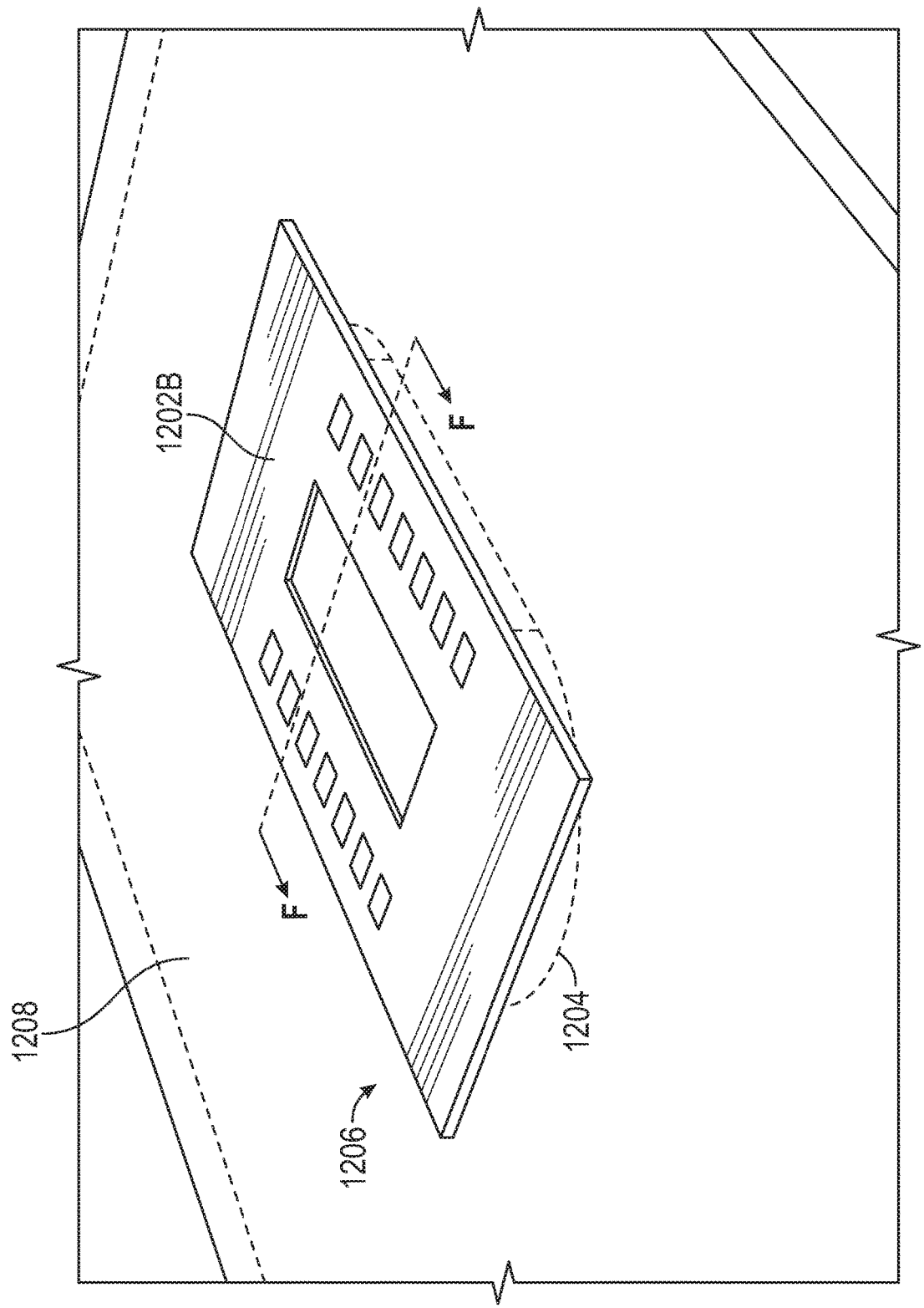

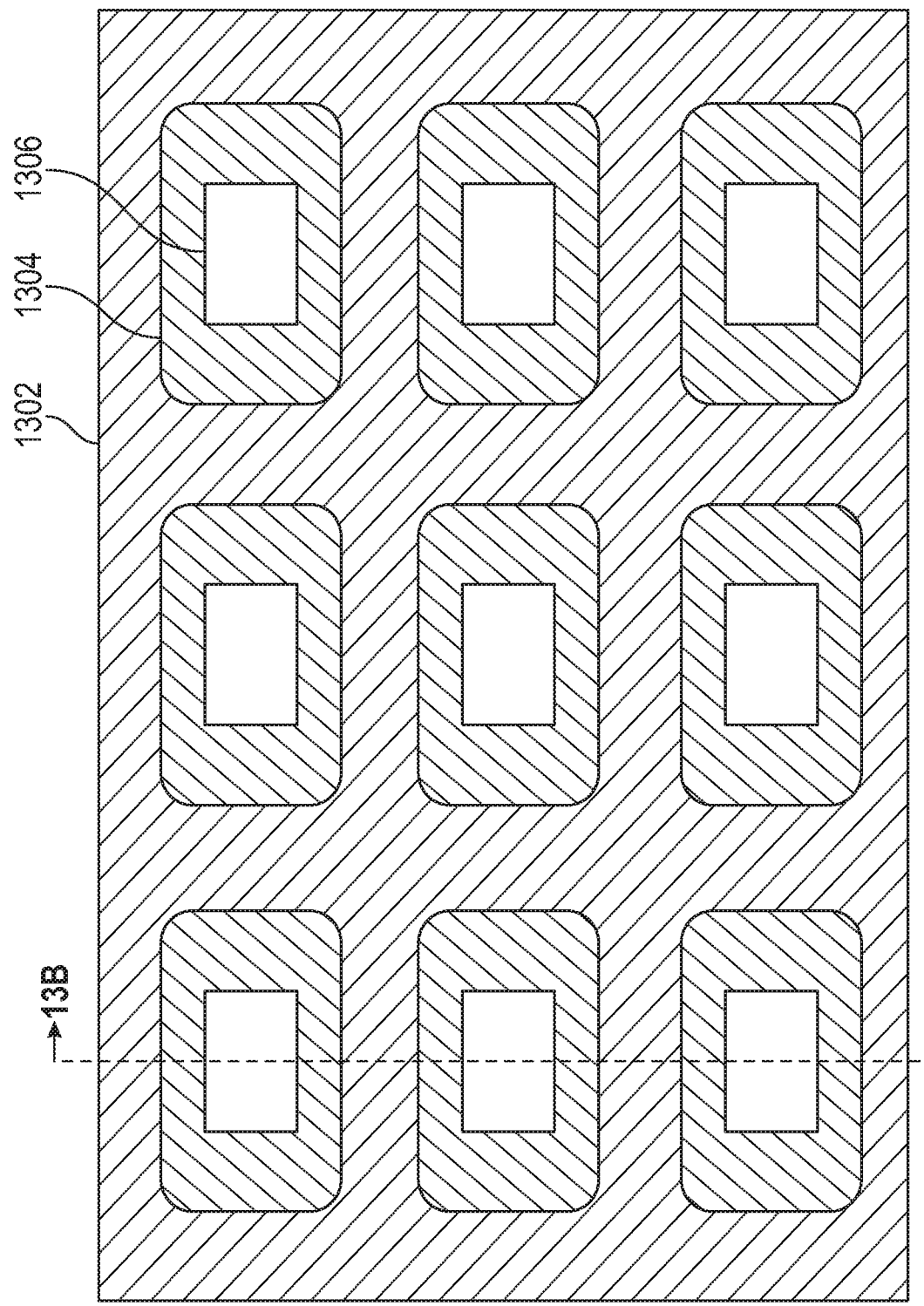

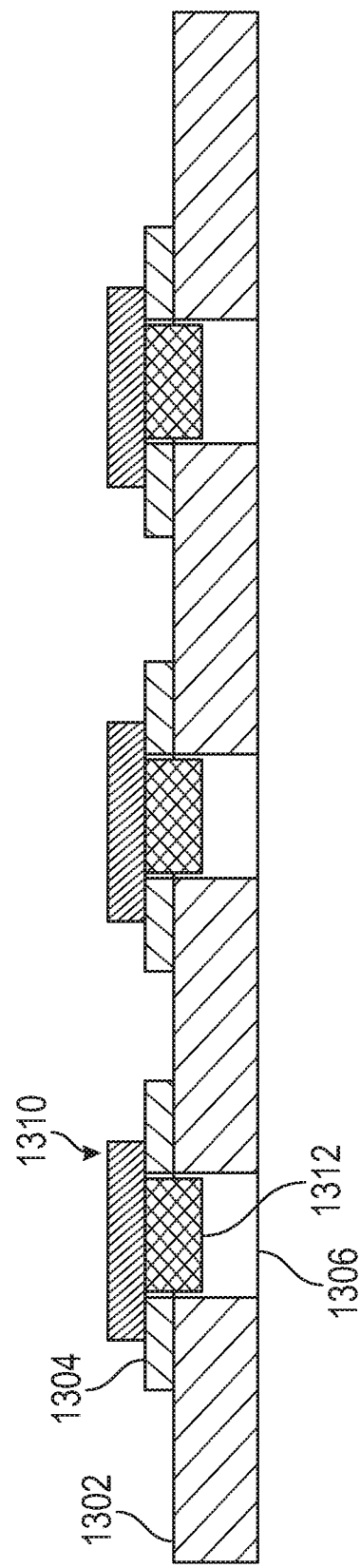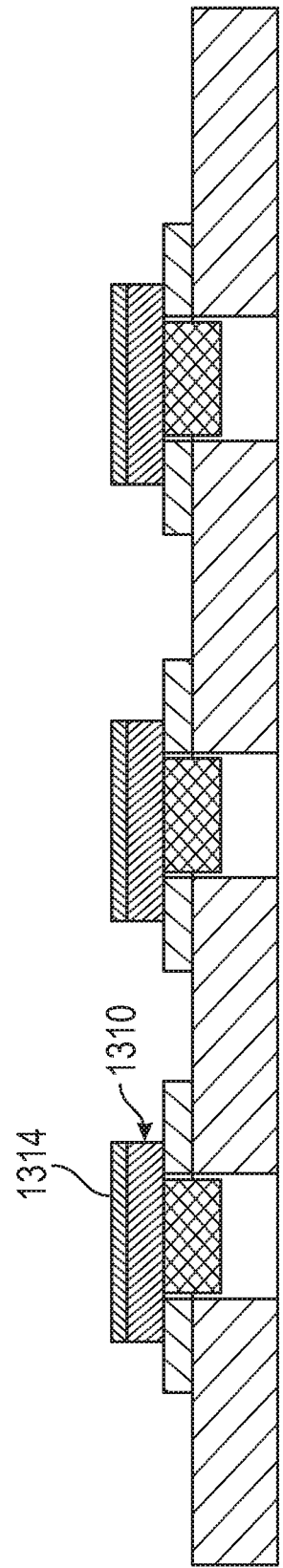
FIG. 13E
FIG. 13F

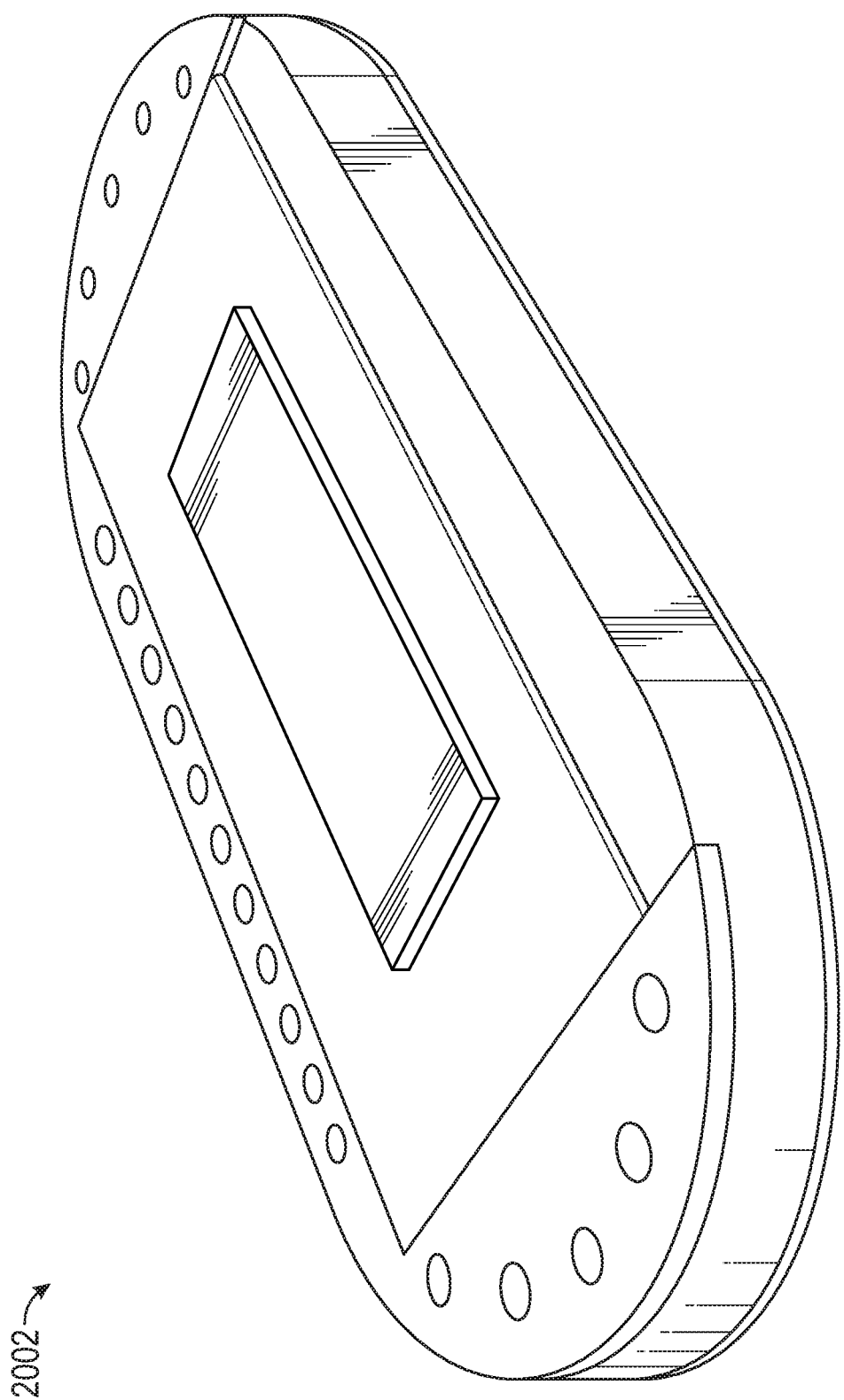

CONFIGURABLE, ENCAPSULATED SENSOR MODULE AND METHOD FOR MAKING SAME

CROSS REFERENCE OF RELATED APPLICATION

This application claims the benefit under 35 U.S.C. § 119(e) of the filing date of provisional patent application Ser. No. 62/449,875 filed Jan. 24, 2017, the disclosure of which is incorporated herein by reference.

FIELD OF THE DISCLOSURE

This disclosure relates to a structurally robust fingerprint sensor module suitable for integration into electronic devices such as, for example, smartphones, computers (e.g., laptop, desktop, or tablet computers) and "Internet of Things" (IOT) electronic devices.

BACKGROUND

In the electronic sensing market, there are a wide variety of sensors for sensing objects at a given location. Such sensors are configured to sense detectable and/or measurable characteristics of an object in order to sense the presence of an object near or about the sensor and other features and characteristics of the object being sensed. Such "sense characteristics" may include a variety of detectable characteristics, such as electronic, electromagnetic, ultrasonic, thermal, optical characteristics, among others.

Recent efforts have been made to incorporate sensors into the thin display panels of host devices. For example, efforts have been made to incorporate low profile finger print sensors into devices such as smart phones and computers (referred to generically as a "host device") by incorporating that sensor into a glass panel, such as a display and/or interface panel of the device. Such sensors must be very thin and rigid so that they do not expand or contract differentially with respect to the glass panel, and the panel should have a smooth, continuous outer surface, even in the vicinity of the sensor. Current implementations are complex and expensive, typically requiring delicate silicon circuitry to be placed directly behind a chemically thinned or milled section of the host device cover.

Conventional methods include fingerprint sensors placed under the chemically strengthened glass used in modern electronic devices. However, these typically have degraded performance of the fingerprint sensor due to the thickness and the electrical properties of the glass. An alternative is to locally thin the glass in the area of the sensor. This is difficult to do at a low cost and weakens the mechanical robustness of an entire host device panel. Other methods include a wrapped fingerprint sensor assembly that can be integrated into a cutout in the host device panel. However, these designs have limitations in regards to the difficulties of integrating the wrapped sensor core into a low cost module using industry standard manufacturing processes.

To keep costs down, there is a need for a fingerprint sensor assembly that can be manufactured in high volumes in a cost-efficient manner. Ideally the sensor assembly should be a "module" that can be easily incorporated by a device manufacturer into the host device panel. In many smartphone designs, the resulting incorporated module becomes a "button" on the host device panel.

U.S. Provisional Application Nos. 62/258,284; 62/349,256; and 62/374,339, and U.S. Non-Provisional application Ser. No. 15/354,426 (U.S. Patent Application Publication No. 2017/0147852) "Electronic Sensor Supported on Rigid Substrate," the respective disclosures of which are hereby incorporated by reference, describe "wrapped sensor" designs covered with a glass cover member. Such wrapped sensor designs comprise a rigid substrate wrapped in a flexible circuit subassembly comprising conductive traces, a circuit element such as an integrated circuit or application specific integrated circuit ("ASIC"), and conductive interconnects connecting the traces to the circuit element all disposed on a flexible substrate material.

U.S. Provisional Application No. 62/354,210, U.S. Non-Provisional application Ser. No. 15/628,003 (U.S. Patent Application Publication No. 2017-0372112) "Reinforcement Panel for Fingerprint Sensor Cover" the disclosure of which is hereby incorporated by reference, describes "wrapped sensor" designs covered with a glass cover member reinforced with a ceramic layer to enhance robustness of the installed sensor assembly.

U.S. Provisional Application No. 62/382,864, U.S. Non-Provisional application Ser. No. 15/693,882 "Method of Securing a Fingerprint Sensor onto a Glass Cover Member Incorporated within a Glass Cover of a Mobile Device" the disclosure of which is hereby incorporated by reference, describes a method that can be used to secure the fingerprint sensor assembly disclosed in the current application onto a cover panel.

U.S. Provisional Application No. 62/382,884, U.S. Non-Provisional application Ser. No. 15/693,817 "Method of Manufacturing a Cover Member Suitable for a Fingerprint Sensor" the disclosure of which is hereby incorporated by reference, describes a method of manufacturing a cover panel suitable for being attached to the fingerprint sensor assembly described in the current application.

SUMMARY

The following presents a simplified summary in order to provide a basic understanding of some aspects described herein. This summary is not an extensive overview of the claimed subject matter. It is intended to neither identify key or critical elements of the claimed subject matter nor delineate the scope thereof. Its sole purpose is to present some concepts in a simplified form as a prelude to the more detailed description that is presented later.

A flexible circuit subassembly with a mounted ASIC is wrapped around and attached to a rigid substrate to form a wrapped fingerprint sensor assembly, and the wrapped fingerprint sensor assembly is electrically connected to a rigid printed circuit board (PCB) substrate with a cutout to accommodate the ASIC to form a fingerprint module subassembly. The fingerprint module subassembly is partially encapsulated in a non-electrically-conductive dielectric material in such a way that a sensor surface of the wrapped fingerprint sensor assembly and electrical contacts of the fingerprint module subassembly remain operatively exposed to produce a structurally robust fingerprint sensor module suitable for integration into an electronics device such as a smartphone or other "Internet of Things" (JOT) electronic device.

In another embodiment, a back end process for manufacturing the fingerprint sensor module is described. The manufacturing process is a high volume manufacturing process that takes one or more individual wrapped fingerprint sensor assemblies, attaches each wrapped fingerprint sensor assembly to a PCB panel, attaches a cover panel over the sensing surface of each fingerprint sensor subassembly, encapsulates each entire assembly, and then singulates each encapsulated assembly to produce individual fingerprint sensor modules. The manufacturing process enables large panels of fingerprint sensor modules to be produced simultaneously and singulated into individual fingerprint sensor modules to enhance cost efficiency and manufacturing speed. Furthermore, the manufacturing process allows different shaped modules to be manufactured with only minimal tooling changes.

Other features and characteristics of the subject matter of this disclosure, as well as the methods of operation, functions of related elements of structure and the combination of parts, and economies of manufacture, will become more apparent upon consideration of the following description and the appended claims with reference to the accompanying drawings, all of which form a part of this specification, wherein like reference numerals designate corresponding parts in the various figures.

BRIEF DESCRIPTION OF THE DRAWINGS

The accompanying drawings, which are incorporated herein and form part of the specification, illustrate various embodiments of the subject matter of this disclosure. In the drawings, like reference numbers indicate identical or functionally similar elements.

FIG. 12C is a bottom perspective view of the fingerprint sensor module with an oversized PCB (relative to the package form factor) in a cutout in a host device panel.

FIG. 12D is a bottom perspective view of the fingerprint sensor module with a rectangular oversized PCB (relative to the package form factor) in a cutout in a host device panel.

FIGS. 13A-13M illustrate beginning, intermediate, and finals steps for assembling multiple fingerprint sensor modules.

FIG. 20 is a bottom perspective view of a fingerprint sensor module of FIG. 18 and a cover panel.

DETAILED DESCRIPTION

Figure 1:
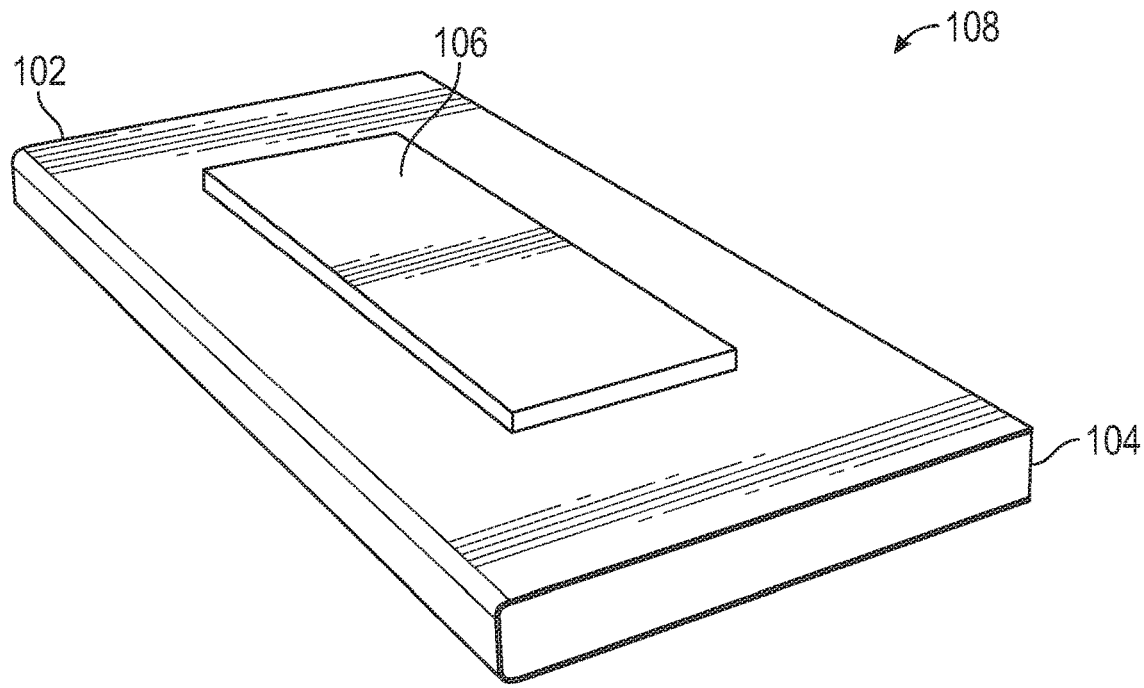
FIG. 1 is a bottom perspective view of a wrapped fingerprint sensor assembly comprising a flexible circuit subassembly wrapped around and secured to a rigid substrate.

While aspects of the subject matter of the present disclosure may be embodied in a variety of forms, the following description and accompanying drawings are merely intended to disclose some of these forms as specific examples of the subject matter. Accordingly, the subject matter of this disclosure is not intended to be limited to the forms or embodiments so described and illustrated.

Unless defined otherwise, all terms of art, notations and other technical terms or terminology used herein have the same meaning as is commonly understood by one of ordinary skill in the art to which this disclosure belongs. All patents, applications, published applications and other publications referred to herein are incorporated by reference in their entirety. If a definition set forth in this section is contrary to or otherwise inconsistent with a definition set forth in the patents, applications, published applications, and other publications that are herein incorporated by reference, the definition set forth in this section prevails over the definition that is incorporated herein by reference.

Unless otherwise indicated or the context suggests otherwise, as used herein, "a" or "an" means "at least one" or "one or more."

This description may use relative spatial and/or orientation terms in describing the position and/or orientation of a component, apparatus, location, feature, or a portion thereof. Unless specifically stated, or otherwise dictated by the context of the description, such terms, including, without limitation, top, bottom, above, below, under, on top of, upper, lower, left of, right of, in front of, behind, next to, adjacent, between, horizontal, vertical, diagonal, longitudinal, transverse, radial, axial, etc., are used for convenience in referring to such component, apparatus, location, feature, or a portion thereof in the drawings and are not intended to be limiting.

Furthermore, unless otherwise stated, any specific dimensions mentioned in this description are merely representative of an exemplary implementation of a device embodying aspects of the disclosure and are not intended to be limiting.

As used herein, the term "adjacent" refers to being near or adjoining. Adjacent objects can be spaced apart from one another or can be in actual or direct contact with one another. In some instances, adjacent objects can be coupled to one another or can be formed integrally with one another.

As used herein, the terms "substantially" and "substantial" refer to a considerable degree or extent. When used in conjunction with, for example, an event, circumstance, characteristic, or property, the terms can refer to instances in which the event, circumstance, characteristic, or property occurs precisely as well as instances in which the event, circumstance, characteristic, or property occurs to a close approximation, such as accounting for typical tolerance levels or variability of the embodiments described herein.

As used herein, the terms "optional" and "optionally" mean that the subsequently described, component, structure, element, event, circumstance, characteristic, property, etc. may or may not be included or occur and that the description includes instances where the component, structure, element, event, circumstance, characteristic, property, etc. is included or occurs and instances in which it is not or does not.

An embodiment of fingerprint sensor module as disclosed herein comprises wrapped fingerprint sensor assembly comprising a flexible circuit subassembly wrapped around one or two edges of a rigid core with an ASIC mounted on one surface of the wrapped fingerprint sensor assembly, as described in U.S. Provisional Application Nos. 62/258,284; 62/349,256; and 62/374,339, and U.S. Non-Provisional application Ser. No. 15/354,426 (U.S. Patent Application Publication No. 2017/0147852) "Electronic Sensor Supported on Rigid Substrate." The fingerprint sensor module further comprises a substantially rigid PCB on which the wrapped fingerprint sensor assembly is mounted with a cutout to provide clearance for the ASIC, non-conductive dielectric material to encapsulate the wrapped fingerprint sensor assembly and the PCB, and a sensor cover panel mounted over a sensing surface of the wrapped sensor assembly. The PCB may comprise two or more layers and may be a combination of rigid and flexible layers. In this context, a "substantially rigid" PCB is one that will not appreciably bend or deflect under its own weight when supported at an edge thereof. Passive components, such as capacitors, inductors, resistors, etc., can be mounted on the PCB, rather than on the flexible circuit subassembly, for example, as described in the Provisional and Non-Provisional Patent Applications incorporated by reference above. Mounting the passive components on the PCB rather than on the flexible circuit subassembly makes the flexible circuit subassembly easier to manufacture since mounting passive components on the flexible circuit is less compatible with Chip on Film (COF) infrastructure.

In an alternate embodiment, the fingerprint sensor module comprises a fingerprint sensor assembly that is not a wrapped fingerprint sensor assembly, but instead comprises a rigid body having a opposed top and bottom surfaces wherein the top surface defines a sensor, or sensing, surface, and a circuit element, such as an ASIC, is disposed on the bottom surface. The fingerprint sensor assembly may include features enabling electronic connection with the PCB, and the ASIC of the fingerprint sensor assembly may be disposed within a cutout of the PCB when the fingerprint sensor assembly is attached to the PCB. Although the fingerprint sensor module disclosed herein is not limited to a wrapped fingerprint sensor assembly, embodiments described herein will generally include a wrapped fingerprint sensor assembly.

The fingerprint sensor module is an integrated device configured to provide fingerprint sensing functionality, via the wrapped fingerprint sensor assembly for other fingerprint sensor element, with a smooth, robust sensing surface, via the sensor cover panel, and connectivity to a host device, via the printed circuit board. The fingerprint sensor module may be installed into a cutout formed into a panel of the host device, such as a display screen, a touch-sensitive panel, or a non-functional portion of the host device, such as a frame or bezel adjacent a display screen or touchscreen or alternately on the back side of the host device. The fingerprint sensor module may be mechanically retained in the cut out in the host device by a suitable adhesive, a curable fill material (e.g., a potting material) poured into gaps between the fingerprint sensor module and the cutout, a mounting frame wholly or partially surrounding a peripheral edge of the fingerprint sensor module, or some combination of two or more of these techniques. Alternatively, the fingerprint sensor module may be attached in the cutout to a mechanical button (e.g., an on/off switch) that is movable with respect to the surrounding host device panel surface. The fingerprint sensor module may be attached to, or form all or part of, a button of the host device. The button maybe a mechanical button that is movable with respect to the surrounding host device panel service, as described above, or it may be a non-movable, touch-sensitive button forming a portion of a host device panel. Alternatively, the fingerprint sensor module may be installed in a portion of a host device panel that is non-functional, other than providing fingerprint sensing functionality. Still alternatively, the fingerprint sensor module may be installed in a portion of a host device panel that provides functionality in addition to fingerprint sensing, such as a portion of a display screen and/or a portion of a touch-sensitive screen or panel.

The installation of the fingerprint sensor module into a host device panel, whether integrated as part of a button or a non-functioning part of a panel, will be referred to herein as the installation package or simply the package. The package for a given host device panel will have a unique form factor (e.g., shape, size (i.e., thickness and transverse dimensions, such as length, width, radius, diameter, etc.)), and the size and shape of a fingerprint sensor module can be customized to the package form factor of any host device installation.

Although exemplary embodiments of the fingerprint sensor module will be described herein in the context of their integration into a button, it should be understood that the fingerprint sensor module described herein could be integrated into and customized to any installation package of a host device, including, but not limited to, a button or to the front surface of the device.

Further, in the fingerprint sensor module, the form factors (e.g., size and peripheral shape) of the wrapped fingerprint assembly and the PCB to which it is mounted are defined so that margins are provided around the wrapped fingerprint sensor assembly so that the outer dimension of the wrapped fingerprint sensor assembly is not directly in contact with an interface to the host device panel of the electronic device. This enables the incorporation of a service loop (larger bend radius), for example, as described in co-owned non-provisional U.S. application Ser. No. 15/354,426 (U.S. Patent Application Publication No. 2017/0147852), the disclosure of which is incorporated by reference, during the folding of the flexible circuit subassembly over the rigid substrate. The margins or gaps around the wrapped fingerprint sensor assembly are filled with an encapsulating material, such as a non-conductive dielectric material, to fill the marginal gaps and make up the difference between the final fingerprint sensor module outer dimension and the wrapped fingerprint sensor assembly outer dimension. Subsequent machining or milling may be required to integrate the final fingerprint sensor module into an opening in the host device cover panel.

Advantages provided by embodiments disclosed herein include: (1) the fingerprint sensor module comprising a PCB with a cutout to receive the ASIC of the wrapped fingerprint sensor assembly creates an efficient self-contained module that can be panelized for low cost assembly; (2) the non-conductive dielectric material encapsulates the wrapped fingerprint sensor assembly and the PCB, and a sensor cover panel mounted over a sensing surface of the wrapped fingerprint sensor assembly provides a mechanically robust, flat, hard, and scratch resistant sensing surface on the fingerprint sensor module that also minimizes the distance between the sensing elements and the user finger; and (3) a wrapped fingerprint sensor assembly of a single, generic size and shape may be used as the base core for a variety of larger package form factors, such as buttons, incorporated into a host device such as a mobile phone—i.e. a fingerprint sensor assembly that can be used in a customized fingerprint sensor shape and size.

FIG. 1 is a bottom perspective view of a wrapped fingerprint sensor assembly 108 comprising a flexible circuit subassembly 102 wrapped around a rigid substrate 104. In the illustrated embodiment, the flexible circuit subassembly 102 is wrapped around one edge of the rigid substrate 104. The wrapped fingerprint sensor assembly includes, but is not limited to, those described in provisional U.S. Applications Nos. 62/258,284, 62/374,339, and 62/349,256, and non-provisional U.S. application Ser. No. 15/354,426 (U.S. Patent Application Publication No. 2017/0147852), which are herein incorporated by reference in their entirety. A wrapped fingerprint sensor assembly as referenced herein comprises a flexible sensor subassembly 102 wrapped around a substantially rigid substrate 104. In various embodiments, the flexible sensor subassembly 102 includes a flexible substrate on which sensor elements are disposed. In some embodiments, the flexible sensor subassembly 102 comprises a circuit subassembly in which the flexible substrate comprises a flexible dielectric substrate, which may be a polymer-based substrate, such as polyimide materials, including those known by the trade names Kapton® or Upilex®, or other flexible materials such as polyesters, and the sensor elements comprise a plurality of conductive lines or traces made of a suitable conductive material, such as copper, tin, silver, nickel, aluminum, or gold and formed, etched, deposited, plated, printed, or otherwise applied to or embedded into the flexible substrate.

The wrapped fingerprint sensor assembly may comprise a flexible circuit subassembly having a flexible substrate with conductive traces disposed thereon. The conductive traces may comprise a plurality of first conductive traces arranged side by side in a non-intersecting configuration (e.g., parallel) and a plurality of second conductive traces arranged side by side in a non-intersecting configuration (e.g., parallel). The first conductive traces may be oriented transversely (e.g., perpendicular) to the second conductive traces. The first and second traces may be disposed on different parts of one side or surface of the substrate ("single-sided") to be wrapped around a rigid substrate so that the first conductive traces and a portion of the flexible substrate on which the first conductive traces are located form a first layer overlying a first surface of the rigid substrate and the second conductive traces and a portion of the flexible substrate on which the second conductive traces are located form a second layer that overlies the first layer.

Alternatively, the wrapped fingerprint sensor assembly may comprise a flexible circuit subassembly having a flexible substrate with first and second conductive traces on its opposed surfaces ("dual-sided") and wrapped around only one side of a rigid substrate. The flexible circuit subassembly is wrapped partially around the rigid substrate so that the first and second conductive traces disposed on opposite surfaces of a first end of the flexible substrate overlie a first surface of the rigid substrate, a middle portion of the flexible substrate wraps around only one edge of the rigid substrate, and a second end of the flexible substrate (a portion on which, for example, a circuit element, such as an ASIC, might be mounted as described below) overlies a second surface of the rigid substrate.

In an embodiment, the first and second traces form a sensor area in the form of a grid to detect surface features of a proximally located object at a plurality of locations, such as features of a fingerprint of a finger placed on the sensor area. One set of traces forms a plurality of drive traces, or lines, which are each connectable to a drive source capable of producing a drive single, and the other set of traces forms a plurality of pickup traces, or lines, oriented transversely (preferably substantially perpendicular) to the drive lines and separated from the drive lines by at least one layer of the flexible substrate.

Each drive line may thus be capacitively coupled to an overlapping pickup line through a dielectric layer. In the embodiment, the pickup lines can form one axis (e.g., X-axis) of the grid, while the drive lines form another axis (e.g., Y-axis) of the grid. Each location where a drive line and a pickup line overlap may form an impedance-sensitive electrode pair whereby the overlapping portions of the drive and pickup lines form opposed plates of a capacitor separated by a dielectric layer or layers. This impedance-sensitive electrode pair may be treated as a pixel (e.g., an X-Y coordinate) at which a surface feature of the proximally located object is detected. The grid forms a plurality of pixels that can collectively create a map of the surface features of the proximally located object. For instance, the pixels of the grid can map locations where there are ridge and valley features of the finger surface touching the electronic sensor. Additional details of a fingerprint sensor with overlapping drive lines and pickup lines as well as the drive, sense, and scanning electronics, are discussed in U.S. Pat. No. 8,421,890, entitled "Electronic imager using an impedance sensor grid array and method of making," and U.S. Pat. No. 8,866,347, entitled "Biometric sensing", the respective disclosures of which are incorporated by reference in their entirety. Further improvements and enhancements to the devices, methods, and circuitry used to improve the sensitivity of the measurement principal employing a sensor grid comprised of overlapping drive lines and pickup lines separated by a dielectric including the drive, sense, scanning, and noise reduction electronics, are described in U.S. patent application Ser. No. 14/582,359 (U.S. Pat. No. 9,779,280), entitled "Fingerprint Sensor Employing an Integrated Noise Rejection Structure" the disclosure of which is incorporated by reference in its entirety.

In operation, a selected drive line is activated, with a voltage source for example, and a selected pickup line is connected to a receiving circuit, such as an amplifier/buffer circuit, so that the resulting electric field emitted by the active drive line can be captured by the active pickup line. An electric field extends from the drive line to the pickup line through the intermediate dielectric insulating layer. If an object is present at the pickup line, some or all of the electric field may be absorbed by the object, changing the manner in which the electric field is received by the pickup line. This changes the resulting signal that is captured and processed by the pickup line and receiving circuit, and thus is indicative of the presence of an object, and the features and characteristics of the object may be sensed and identified by processing the signal to determine the relative amount the received signal is changed at each crossover location (i.e., pixel). This processing may be done by some form of logic or processing circuitry.

Given the grid of pixels that can be activated at individual pairs, each pixel may be captured in a number of ways. In one embodiment, a drive line may be activated, and pickup lines crossing over the active drive lines may be turned on and off in a sequence to capture a line of pixels. This sequencing may operate as a scanning sequence. Here a first drive line is activated by connecting it to a signal source, and then one pickup line at a time is connected to capture circuitry, such as amplifier/buffer circuitry, the information from the pixel formed at the crossing of the two lines is captured, and then the pickup line is disconnected and connected to ground potential. Then, a next pixel is processed in sequence, then another, then another, until the entire array of pickup lines crossing the active drive line is processed. The drive line is then deactivated, and another drive line is activated, and the pickup lines are again scanned with this active drive line by connecting them to the capture circuitry. These may be done one at a time in sequence, several non-adjacent pixels may be processed simultaneously, or other variations are possible for a given application. After the grid of pixels is processed, then a rendering of object information will be possible.

In various embodiments, the flexible circuit subassembly may further include a circuit element, such as a controller chip (also referred to as a driver chip), which may comprise an integrated circuit, such as an application specific integrated circuit ("ASIC"), or a discrete electronic circuit, mounted to the flexible substrate and connected to the conductive traces by conductive interconnects. The ASIC may embody one or more of a signal source element configured to generate a voltage or current signal source, switch elements for electively connecting the signal source to each trace of the first or second traces, buffer(s) and amplifier(s), and switch elements for selectively connecting each trace of the other of the first or second traces to the buffer(s) and amplifier(s) whereby the buffer(s) and amplifier(s) generate a signal indicative of a characteristic, such as the magnitude, of an electric field captured by a trace selectively connected to the trace.

In an embodiment, the rigid substrate 104 comprises a dielectric core, such as a glass or ceramic, having flat, opposed upper and lower surfaces. An ASIC 106 is mounted on one side of the flexible circuit subassembly 102. The flexible circuit subassembly 102 is wrapped around and attached to the rigid substrate 104 so that the ASIC 106 overlies one surface of the rigid substrate 104. A sensing surface of the flexible circuit subassembly 102 overlies a surface of the rigid substrate 104 opposite the ASIC 106 and may comprises single-sided or dual-sided configuration for the flexible circuit subassembly.

In other flexible sensor subassemblies, the sensor elements may comprise ultrasonic, thermal, optical, etc. sensors disposed on a suitable flexible substrate and configured to be wrapped around a rigid or substantially rigid substrate.

Figure 2:
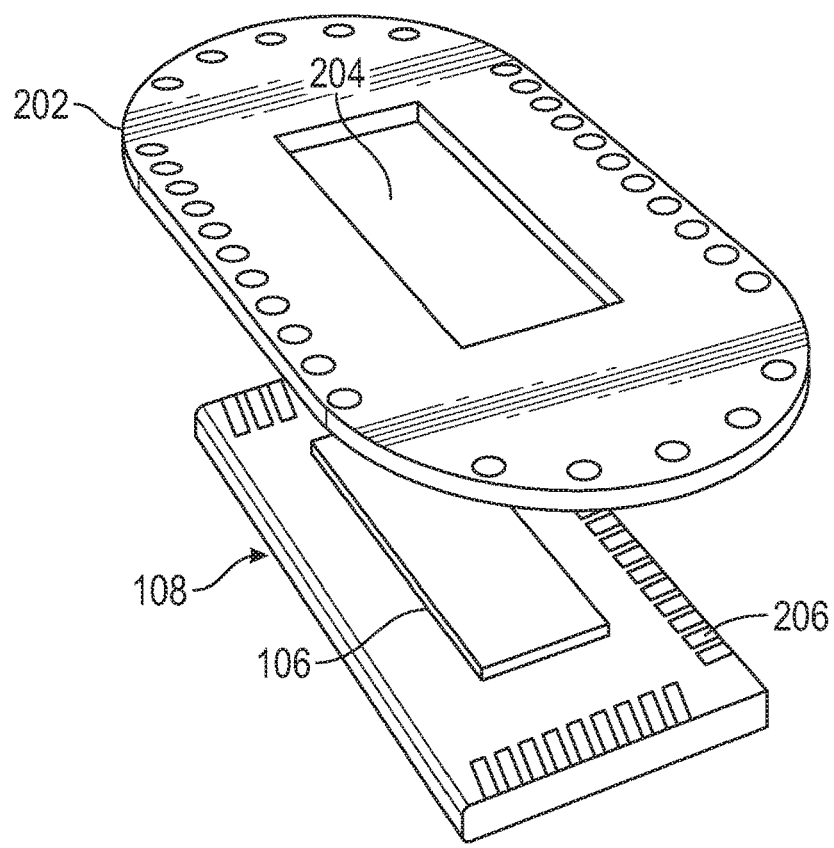
FIG. 2 is an exploded perspective view of the wrapped fingerprint sensor assembly and the PCB of the fingerprint sensor stack.

FIG. 2 illustrates a fingerprint sensor stack comprising the wrapped fingerprint sensor assembly 108 and a PCB 202 in accordance with an exemplary embodiment. The PCB 202 is connected to the wrapped fingerprint sensor assembly 108. The PCB 202 has a cutout 204 to receive the ASIC 106 of the wrapped fingerprint sensor assembly 108. The wrapped fingerprint sensor assembly 108 has interconnect pads 206, preferably on three edges of the face of the wrapped fingerprint sensor assembly 108 that carries the ASIC 106, excluding the wrapped edge. Having the interconnect pads 206 distributed on three edges helps improve the stability and reliability of the connection between the wrapped fingerprint sensor assembly 108 and the PCB 202 and assists in preventing the assembly 108 from tilting during surface mount assembly to the PCB. In an embodiment, "dummy pads" can be added in convenient locations close to the wrapped edge of the wrapped fingerprint sensor assembly 108, which are not restricted by trace routing. These dummy pads serve no electrical connection purpose, but simply enable the PCB 202 to be connected to the sensor in a more stable manner. In some embodiments, the wrapped fingerprint sensor assembly 108 is in a rectangular form thereby providing a longer routing edge opposite of the wrapped edge on the face the wrapped fingerprint sensor assembly 108 that carries the ASIC 106.

Suitable interconnect technologies for interconnecting the wrapped fingerprint sensor assembly to the PCB include anisotropic conductive film (ACF), anisotropic conductive adhesives (ACA), patterned isotropic conductive adhesives (ICA), land grid array (LGA), solder paste/surface mount technology. ACF materials are relatively expensive and require die or laser cutting. ACAs in paste form are less expensive than ACFs and can be applied locally (although the application must be precisely located) (e.g. dispensed, jetted, printed), reducing the quantity used vs. ACFs. Bonding may be local to the interconnect pads 206 only, or may also be interstitial to interconnects for mechanical robustness. Interstitial bonding adhesive may conceivably be achieved by using a non-conductive adhesive between the conductive interconnections to reduce cost. PCB warpage can impact joining yield for all interconnect technologies. For this reason, a two layer PCB would preferably have a balanced construction to minimize warpage. In addition, the flexible circuit subassembly may be wrapped around a very flat, rigid substrate in a means that presents a very flat, planar surface for mounting the wrapped fingerprint sensor assembly to the PCB.

The PCB 202 can be pre-cut to the same size and shape as a desired button (or other package) shape, or may be slightly larger than the ultimate button shape and be ground/milled to shape at a later stage. In addition, for low cost manufacturing it may be most efficient for the PCB pattern to be stepped and repeated on a large panel format. In this process, wrapped fingerprint sensor assemblies 108 can be picked, placed, and connected to the PCB 202 in panel format. Subsequently, the panel is cut to smaller strips or sub-panels for the encapsulation process, and then subsequently milled, punched, laser machined, or otherwise cut to final sensor shape if needed. This manufacturing process is described further below.

Figure 3:
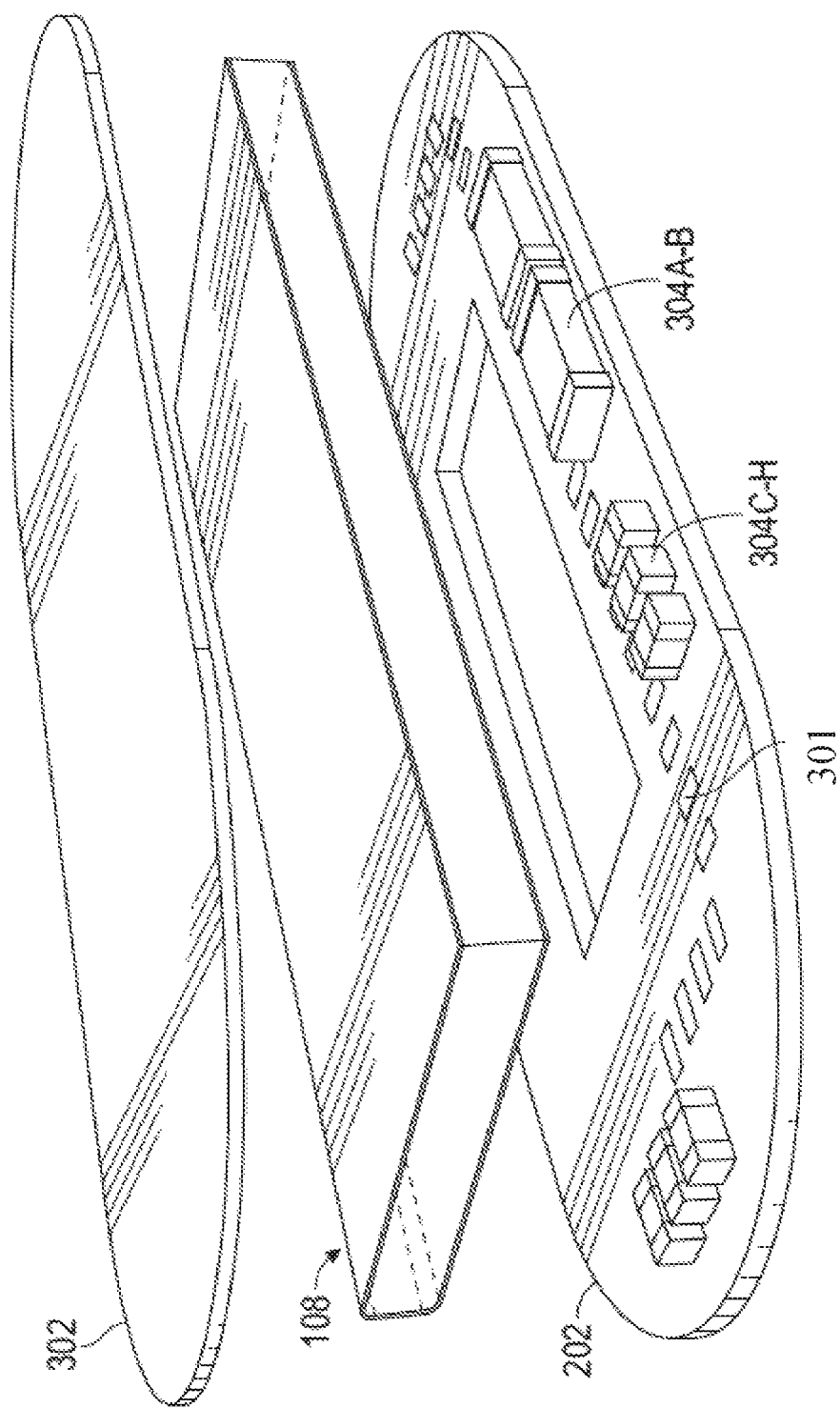
FIG. 3 is an exploded top perspective view of a fingerprint sensor stack comprising the wrapped fingerprint sensor assembly, the PCB, and a cover panel.

FIG. 3 illustrates an exploded view of the fingerprint sensor stack comprising the wrapped fingerprint sensor assembly 108, the PCB 202, and a cover panel 302. The PCB 202 may comprise two or more circuit layers. The surface of the PCB 202 that attaches to the surface of the wrapped fingerprint sensor assembly 108 includes connector pads 301 so as to match up with the interconnect pads 206 (see FIG. 2) so that the wrapped fingerprint sensor assembly 108 is mounted on the PCB 202. The connector pads 301 on the PCB 202 may be electrically connected to the corresponding pads 206 on the wrapped fingerprint sensor assembly 108 using a conductive joining process, such as SMT soldering, hot bar soldering, or conductive adhesive joining processes.

In an embodiment, passive components 304A-H are mounted on the surface of the PCB 202 that attaches to the surface of the wrapped fingerprint sensor assembly 108 in a region of the PCB 202 not covered by the fingerprint sensor assembly 108. Accordingly, the passive components 304A-H are mounted on the surface of the PCB 202 that receives the wrapped fingerprint sensor assembly 108, such that the passive components 304A-H are positioned between an edge of the fingerprint sensor assembly 108 and an edge of the PCB 202 and sandwiched between the PCB 202 and the cover panel 302. In an embodiment, the passive components 304A-H comprise one or more inductors 304A-B (two in the illustrated embodiment) and two or more capacitances 304C-H (six in the illustrated embodiment). In another embodiment, the passive components 304A-H are mounted on both surfaces of the PCB 202. Exemplary passive components may have JEDEC industry standard package size of 0603 or 201 (imperial code).

Figure 4:
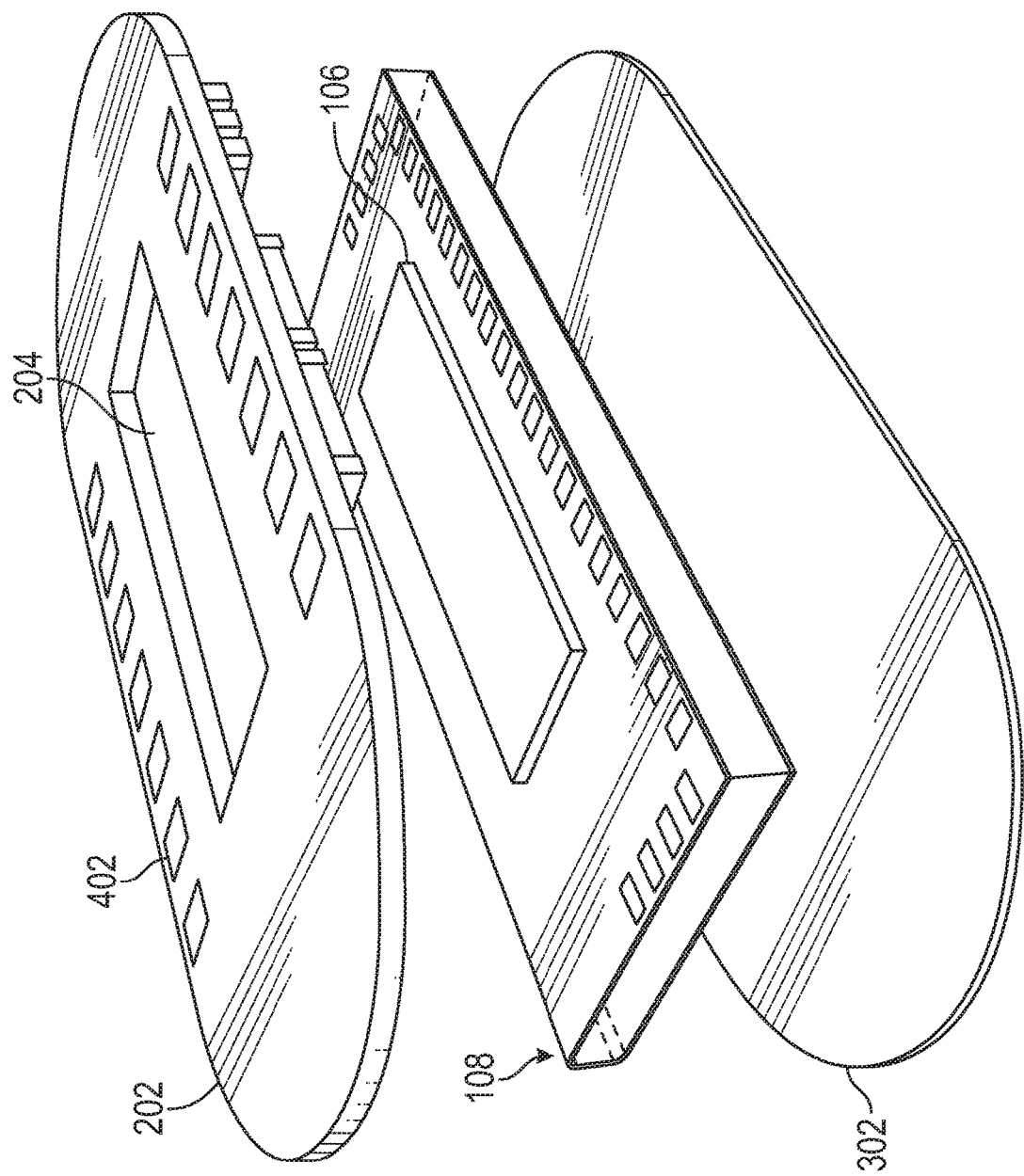
FIG. 4 is an exploded bottom perspective view of the fingerprint sensor stack.

FIG. 4 illustrates an exploded view of the fingerprint sensor stack, including the wrapped fingerprint sensor assembly 108, the PCB 202, and the cover panel 302. In some embodiments, the PCB 202 comprises ball grid array (BGA) or land grid array (LGA) assembly pads 402 to allow the finished sensor module to be interconnected to the host device, such as through a flex cable. The PCB 202 has a cutout 204 to accommodate the ASIC 106 on the wrapped fingerprint sensor assembly 108. The cutout 204 can be substantially the same shape as the ASIC 106, but the cutout 204 may be slightly larger than the ASIC 106 to prevent interference and to accommodate dimensional and alignment tolerances.

Figure 5:
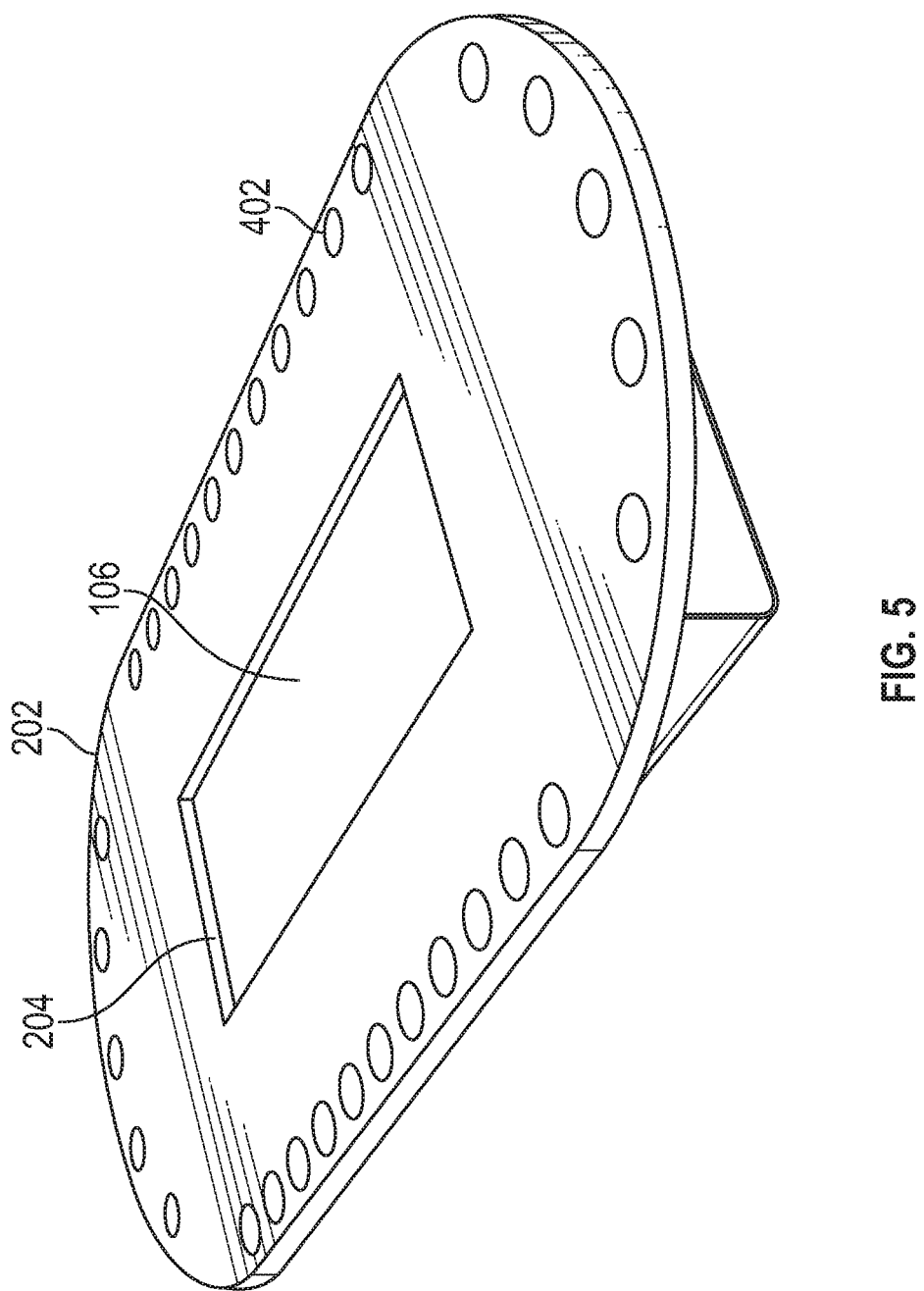
FIG. 5 is a bottom perspective view of the PCB attached to the wrapped fingerprint sensor assembly to form the fingerprint sensor stack.

The PCB 202 can be attached and interconnected to the wrapped fingerprint sensor assembly 108 with commercially available conductive adhesive, or by surface mount soldering, or by other conventional means. As illustrated in FIG. 5, the ASIC 106 may be recessed with respect to the PCB 202 in the cutout 204 depending on the relative thickness of the PCB 202 and the ASIC 106 including the respective heights of the interconnectors 206, 302. In other embodiments, the ASIC 106 may be flush with or protrude above the PCB 202 through the cutout 204.

Figure 6:
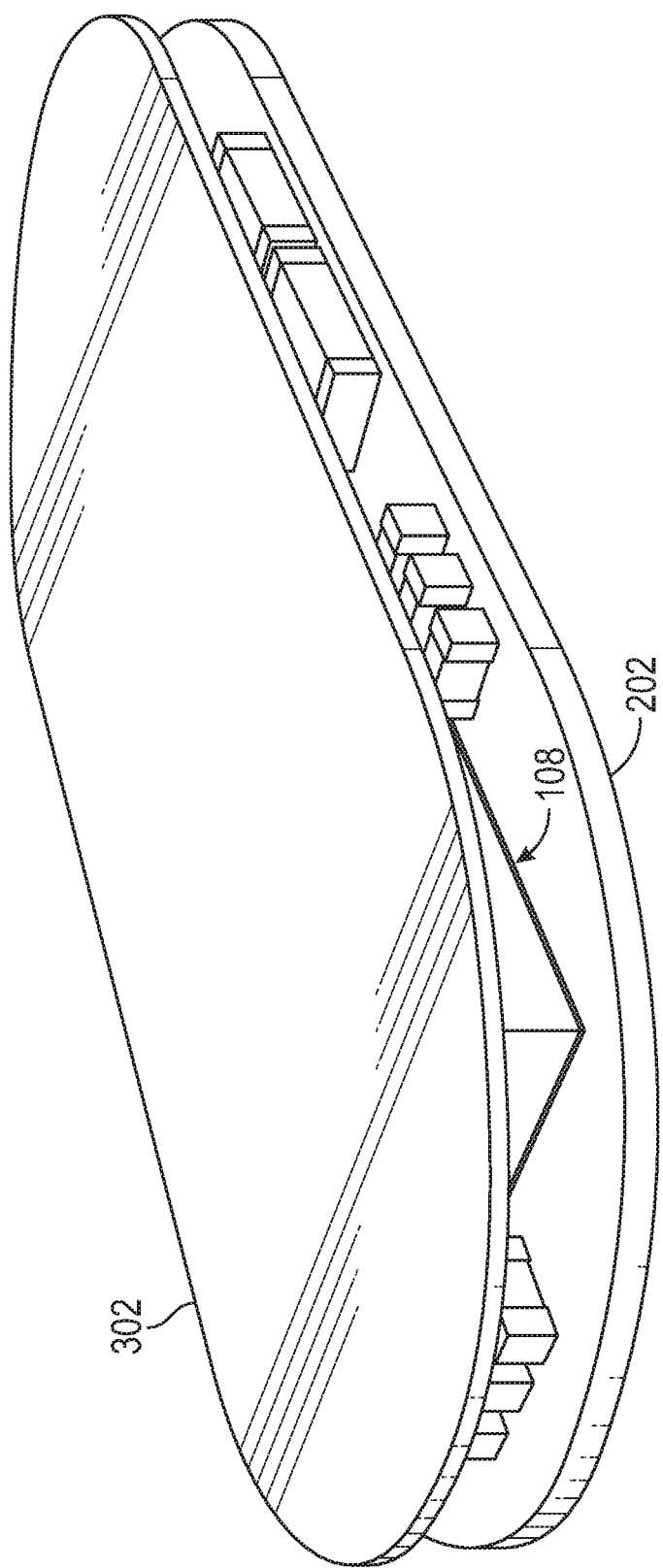
FIG. 6 is a top perspective view of the fingerprint sensor stack comprising that wrapped fingerprint sensor assembly, the PCB, and the cover panel.

Referring to FIGS. 3, 4, and 6, the fingerprint sensor stack may also include cover panel 302 attached over the imaging area of the wrapped fingerprint sensor assembly 108 using commercially available adhesives. The cover panel 302 may be made from glass, ceramic, zirconia or other hard material. In another embodiment, there may be more than one cover panel, e.g. a first ceramic cover panel can be placed over the wrapped fingerprint sensor assembly 108 to add strength and then a second glass cover panel added on top to match the aesthetics of the host device. The cover panel 302 will typically be the same size and shape as the desired button shape (or other package form factor), or may be slightly larger than the ultimate button shape and be ground or milled to the desired shape at a later stage. It is desirable that the cover panel 302 and the adhesive bond line used to attach it be as thin as possible to maximize image quality for the sensor, within the constraints of ensuring the cover panel 302 is sufficiently robust and adequately. The cover panel 302 can be attached over the imaging area of the wrapped fingerprint sensor assembly 108 before or after the encapsulation process as further described below.

FIG. 6 illustrates the fingerprint sensor stack comprising the wrapped fingerprint sensor assembly 108 (alternatively an unwrapped fingerprint sensor assembly) and the PCB 202 with the cover panel 302 disposed over the wrapped fingerprint sensor assembly 108. The wrapped fingerprint sensor assembly 108, the PCB 202, and the cover panel 302 are combined to form the fingerprint sensor module by encapsulation with an encapsulant, such as a non-conductive dielectric material as described herein.

Figure 7A:
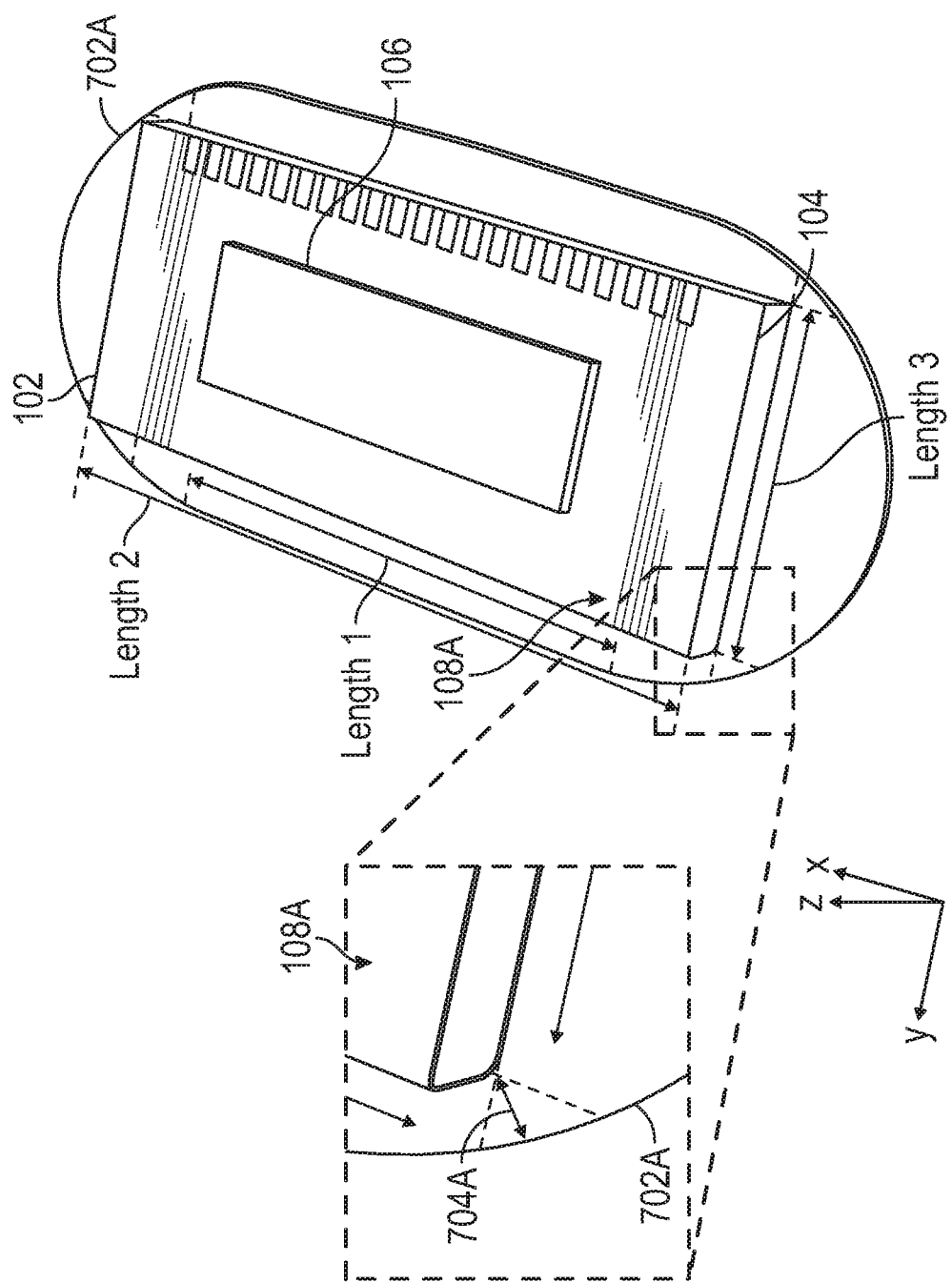
FIGS. 7A-7B illustrate wrapped fingerprint sensor assemblies, each customized in size and shape to a different package form factor.
Figure 7B:
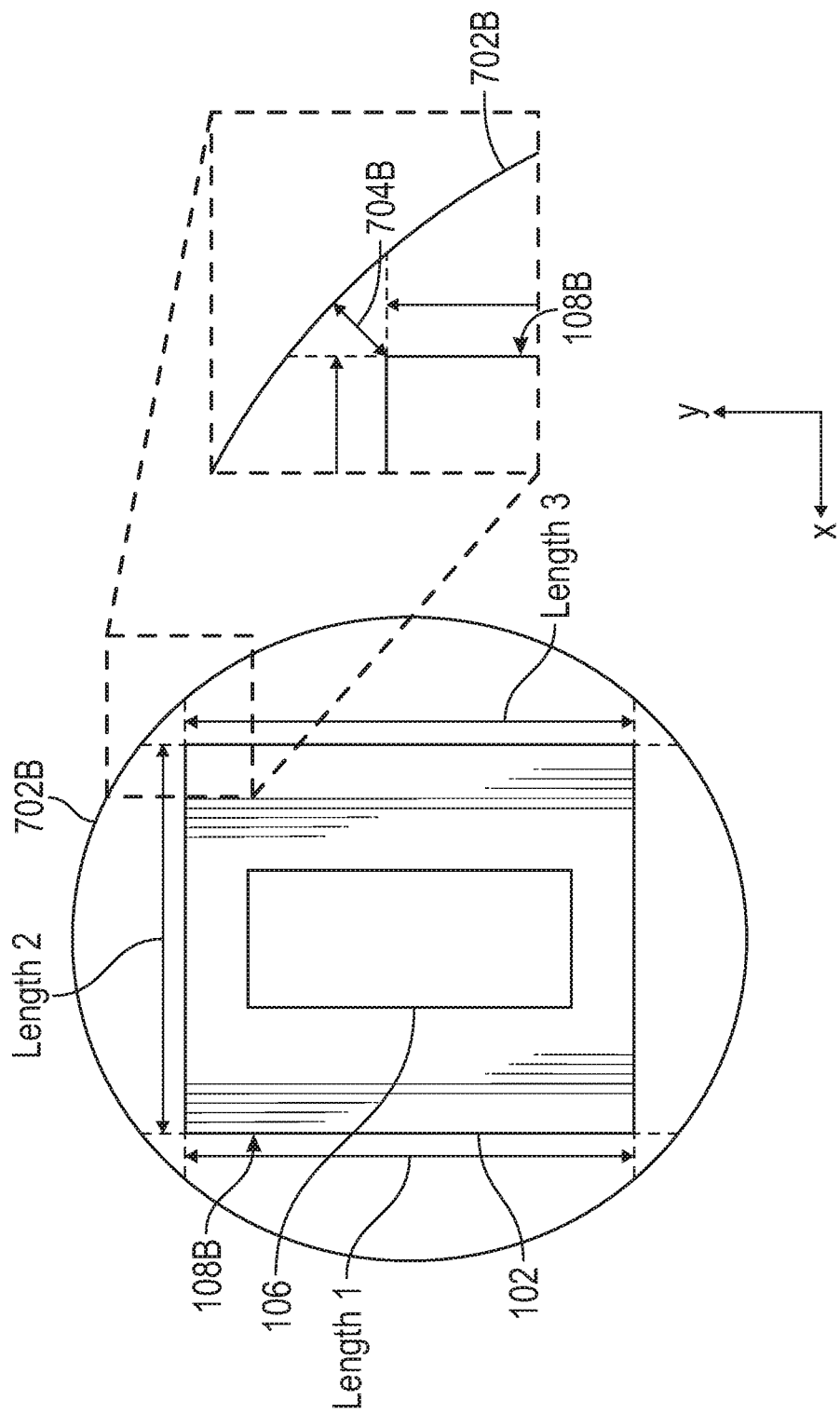

FIGS. 7A-7B illustrate wrapped fingerprint sensor assemblies 108A, 108B, each with a sensor area shaped and sized so as to fit within a package form factor (also referred to as a "button shape") in accordance with the exemplary embodiment. Each of the wrapped fingerprint sensor assemblies 108A, 108B comprise the flexible circuit subassembly 102 wrapped around the rigid substrate 104 and the ASIC 106. In an embodiment, the package form factor is the shape and size of a perimeter of the package to be integrated into a panel of a host device, such as a display panel or screen or a touch panel or screen. For example, the package shape can be a "lozenge" shape 702A (i.e., straight and parallel sides of length "Length 1" and curved ends that may be semicircular of a specified radius) of FIG. 7A or a circular shape 702B of a specified diameter of FIG. 7B. Each wrapped fingerprint sensor assembly 108A, 108B is configured so that an outer peripheral dimension on the horizontal plane (e.g., length and width in an x-y plane) fits within an outer peripheral dimension of the button (package) shape 702A, 702B, preferably so as to provide at least a minimum marginal gap 704A, 704B between an edge of the button and a portion of the fingerprint sensor assembly that is closest to the edge of the button (the dotted lines shown in FIGS. 7A-7B indicate the margins between an edge of the button and a portion of the fingerprint sensor assembly). In an embodiment, the wrapped fingerprint sensor assembly 108A, 108B may be substantially centered in the button shape 702A, 702B so that the marginal gaps 704A, 704B at the four corners of the fingerprint sensor assembly 108A, 108B are substantially equal.

Figure 7C:
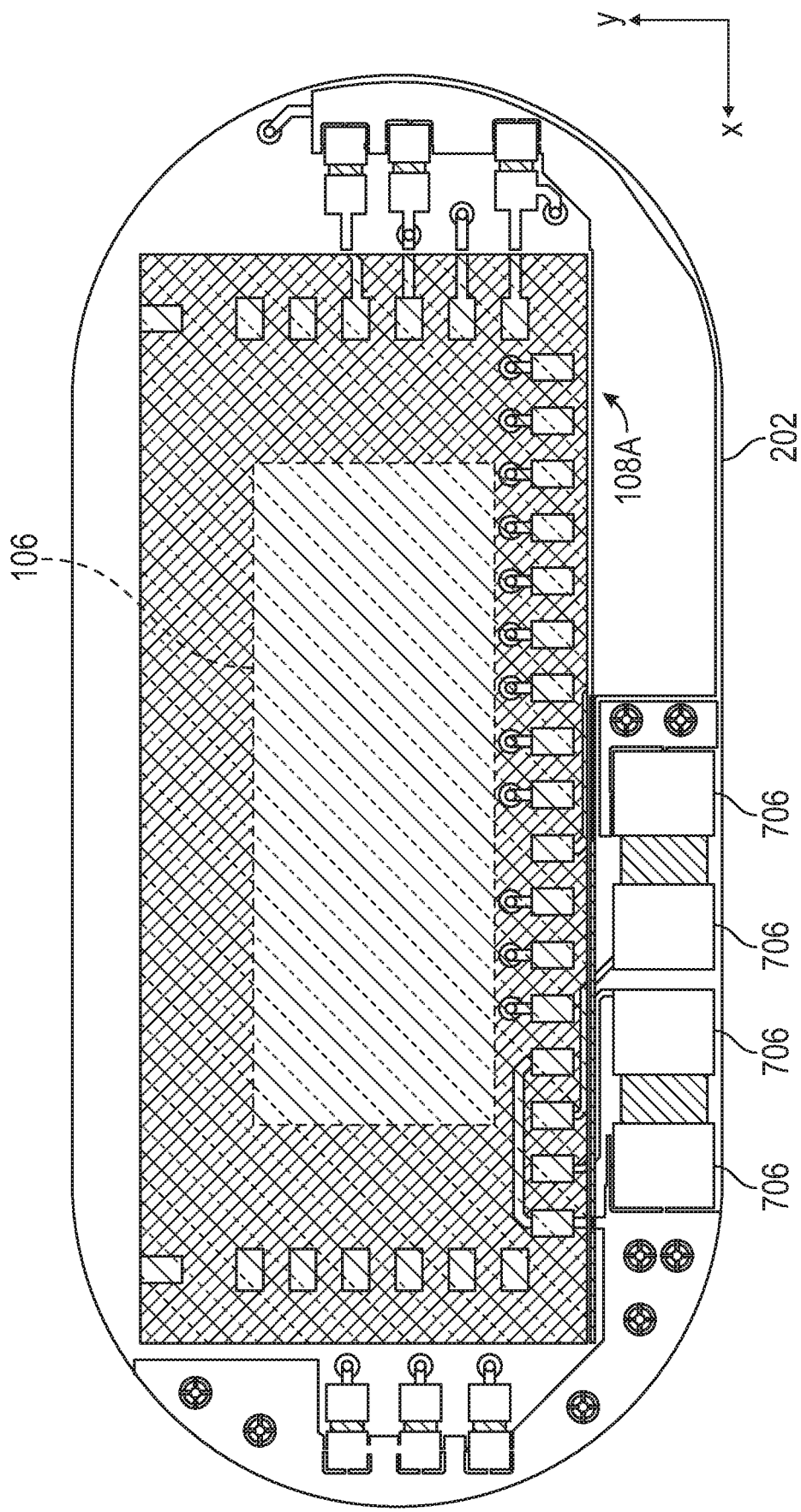
FIG. 7C is a top plan view showing a wrapped fingerprint sensor assembly superimposed on a PCB.

The wrapped fingerprint assembly 108A, 108B may be centered on the PCB, so as to define consistent marginal spaces between edges of the fingerprint assembly and edges of the PCB around the entire fingerprint assembly 108A, 108B. Alternatively, referring to FIG. 7C, the shape of a PCB 202 to which the wrapped fingerprint sensor assembly 108A is attached may correspond to the button (or package) shape such as button shape 702A of FIG. 7A. In another embodiment, the PCB 202 may have a circular shape such as button shape 702B of FIG. 7B. The wrapped fingerprint sensor assembly 108A may be attached to the PCB 202 in a non-centered position with respect to the edges of the PCB 202, for example to facilitate placement of Surface Mount Technology (SMT) passive components 706, such as inductors, capacitors, resistors, etc., on the PCB 202 by providing a larger marginal space and the routing of conductive traces and ground connections for the wrapped fingerprint sensor assembly 108A. In an embodiment, the wrapped fingerprint sensor assembly 108A may be centered along the x-axis of the PCB 202 and off-center along the y-axis of the PCB 202 to provide a larger marginal space on one side of the fingerprint sensor assembly 108A in which SMT components 706 can be mounted on the PCB 202. Alternatively, the wrapped fingerprint sensor assembly 108A may be off-center along the x-axis and centered on the y-axis or off-center along both the x and y axes. That is, the wrapped fingerprint sensor assembly need not be centred on the PCB 202, but rather can be moved left/right and up/down to the optimal position to facilitate placement of components, routing of traces, and ground connections.

Referring back to FIGS. 7A-B, in an embodiment, the length of the wrapped fingerprint sensor assembly 108A, 108B in the "x" direction, including the length of the flexible circuit subassembly 102 and the rigid substrate 104, is maximized compared to the package shape 702A-B to maximize the sensor area (and hence fingerprint image size) for the physical button or the area on the host device cover panel (i.e., the package) dedicated to fingerprint sensing. Specifically, maximizing the sensor area allows more conductive traces, which enhance the fingerprint image size. For example, Length 2 in the x-direction of the wrapped fingerprint sensor assembly 108A, 108B is as large as possible compared to Length 3 in the y-direction of the button shape 702A-B for both the lozenge package shape 702A and circular package shape 702B, while allowing a margin, or gap, between edges of the wrapped fingerprint assembly 108A, 108B and the edges of the package form factor 702A, 702B.

A particular package shape implies an "aspect ratio" for a sensor, e.g., a circular package as in FIG. 7B implies 1:1 aspect ratio, i.e., square sensor, and a lozenge-shaped package as in FIG. 7A could imply a 2:1 ratio, i.e. a rectangular sensor. At the same time, consideration must be given as to how to collect enough "ridge to valley" transitions in a fingerprint image in order to be able to identify a finger. In the general population, ridge-valley transitions range from 350-1100 microns apart. For a given aspect ratio, if x is too small compared to y, or y is too small compared to x (i.e., the sensing area becomes narrow and elongated), then the sensing area may not pick up enough ridge-valley transitions to permit reliable identification or authentication. For example, an average pitch between fingerprint features is 600 microns. Therefore, if the pitch between pixels of the sensing area is below 3000 microns, the sensing area may pick up fewer than five transitions, so it is difficult for the algorithm to recognize the fingerprint.

Extending the length of the sensing area in the x-direction in a lozenge-shaped package will maximize the number of pickup lines in the sensing area.

Often a package form factor, e.g., that of a button, is asymmetrical, sometimes with at least twice as much horizontal dimension as vertical dimension. Thus, the first traces extending in the horizontal direction will be longer in length and fewer in number than the second traces extending in the vertical direction. A design consideration, therefore, is whether to make the first traces drive lines and the second traces pickup lines or vice versa. Since pickup lines are more sensitive to loading and noise pickup than drive lines, it is often preferred to employ long drive lines along the horizontal direction and shorter pickup lines along the vertical direction. In addition, by having fewer traces extending horizontally, fewer interconnects extending along the edges of the flexible substrate will be necessary, and thus the routing area becomes smaller, leaving more room for the sensing area. There is, however, a point of diminishing return if the horizontal length is extended and the vertical length is contracted too much in the sensing area. If the vertical dimension reduced to be less than approximately 3 mm, the sensing area would become more like a 'slit' than a rectangle. In the case of a 3 mm rectangle, a worst case ridge-valley spacing of 1 mm for a large finger would mean that the sensing area would image only 3 ridge-valley transitions in the sensing area, which is on the lower limit of statistical performance for the current technology capabilities of fingerprint matcher technology. Accordingly, a width of at least 4 mm in the vertical dimension is often preferred.

Margins are provided around the wrapped fingerprint sensor assembly 108A, 108B that will be filled with an encapsulant, which, in an embodiment, is a non-conductive dielectric material, during an encapsulation process to make up the difference between the final fingerprint sensor module outer shape and dimensions and the wrapped fingerprint sensor assembly outer dimensions. As described below, the fingerprint sensor module may be formed by placing a fingerprint sensor stack in a mold and injecting an encapsulating material into the mold. The margins between the edges of the wrapped fingerprint assembly 108A, 108B and the edges of the package 702A, 702B, which may or may not correspond to the edges of the PCB, are needed in order facilitate the flow of encapsulating material around the wrapped fingerprint assembly 108A, 108B. The margin, or gap, varies depending on the chosen size of the actual sensor and can be as small as hundreds of microns, depending on the nature of the encapsulating material and the process and tooling used to introduce it. In an embodiment, the minimum margin 704A, 704B between the wrapped fingerprint assembly 108A, 108B and the edges of the PCB defining the desired button shape 702A, 702B is ¼-⅓ of a millimeter.

The margin between the edge of the package and the edge of the rigid substrate also allows for a loose side-wrap (or "service loop") of the flexible circuit subassembly around the rigid substrate, which has the advantage of minimizing stress on the fine circuit traces of the flexible circuit subassembly in the bend region by increasing the bend radius relative to a sharp bend, for example, as described in U.S. Provisional Application Nos. 62/258,284; 62/349,256; and 62/374,339, and U.S. Non-Provisional application Ser. No. 15/354,426 (U.S. Patent Application Publication No. 2017/0147852) "Electronic Sensor Supported on Rigid Substrate."

Figure 8A:
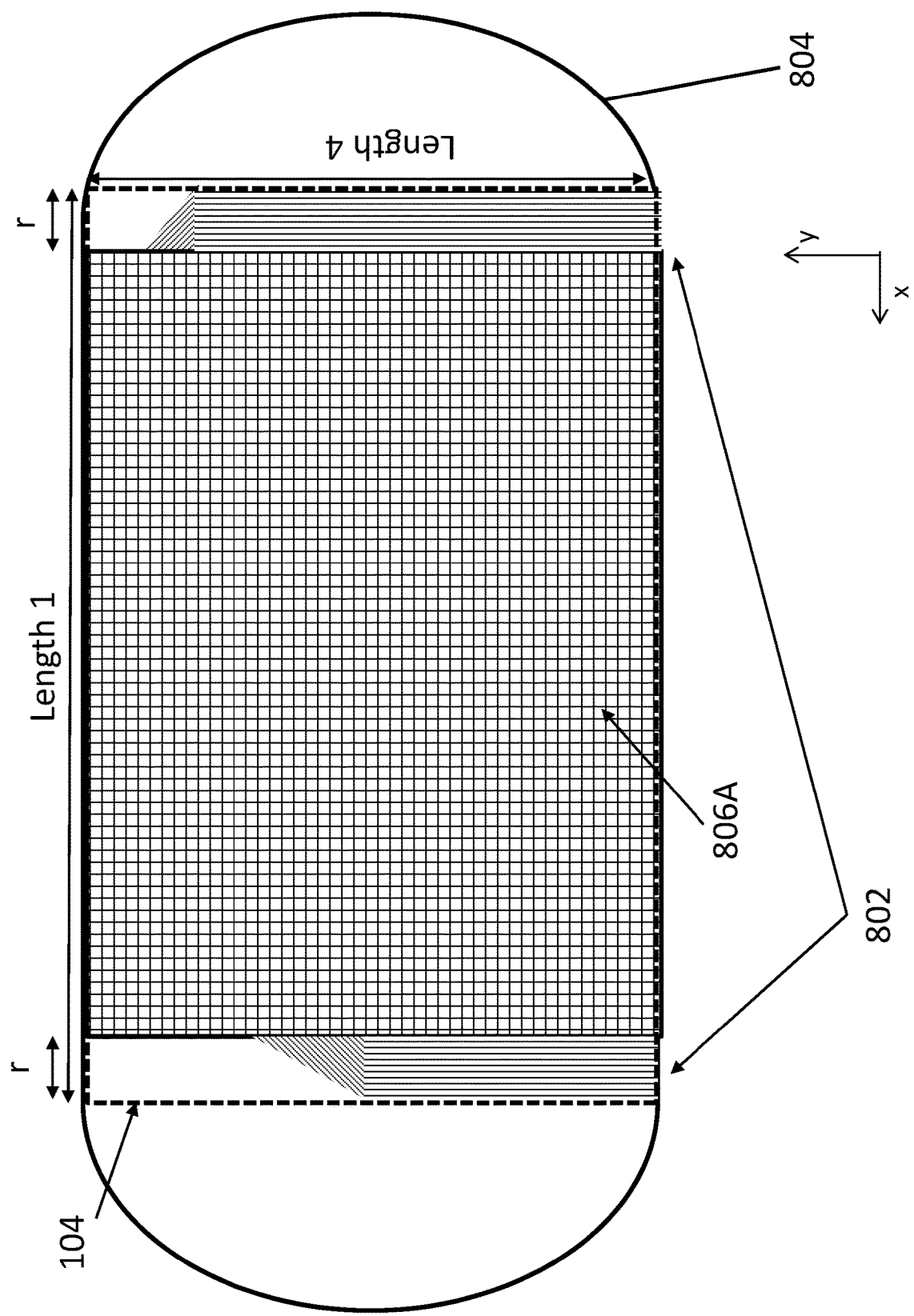
FIGS. 8A-8B are top plan views showing an imaging area of the wrapped fingerprint sensor assembly superimposed on a button outline.

FIG. 8A is a top plan view of a wrapped fingerprint sensor assembly in which the length of the flexible circuit subassembly (defined by the imaging area 806A and the routing areas 802, wherein the routing areas 802 are interconnects connecting the horizontal (x-direction) traces to the ASIC) in the x direction is limited to the portion of the package shape 804 having straight and parallel edges defined by length "Length 1" and the length of the imaging area 806A in the y dimension is "Length 4". The width of each routing area 802 is defined by dimension "r" so the length of the imaging area in the x-direction is Length 1−2r. Thus the imaging area 806A of the sensor of FIG. 8A is (Length 1−2r)×Length 4. Note that the routing areas 802 must be outside the imaging area 806A to avoid capacitive coupling between the interconnects in the routing areas and the vertical (y-direction) traces.

The length of the rigid substrate 104 in the x-direction is Length 1 and the width of the rigid substrate 104 in the y-direction is Length 4.

Figure 8B:
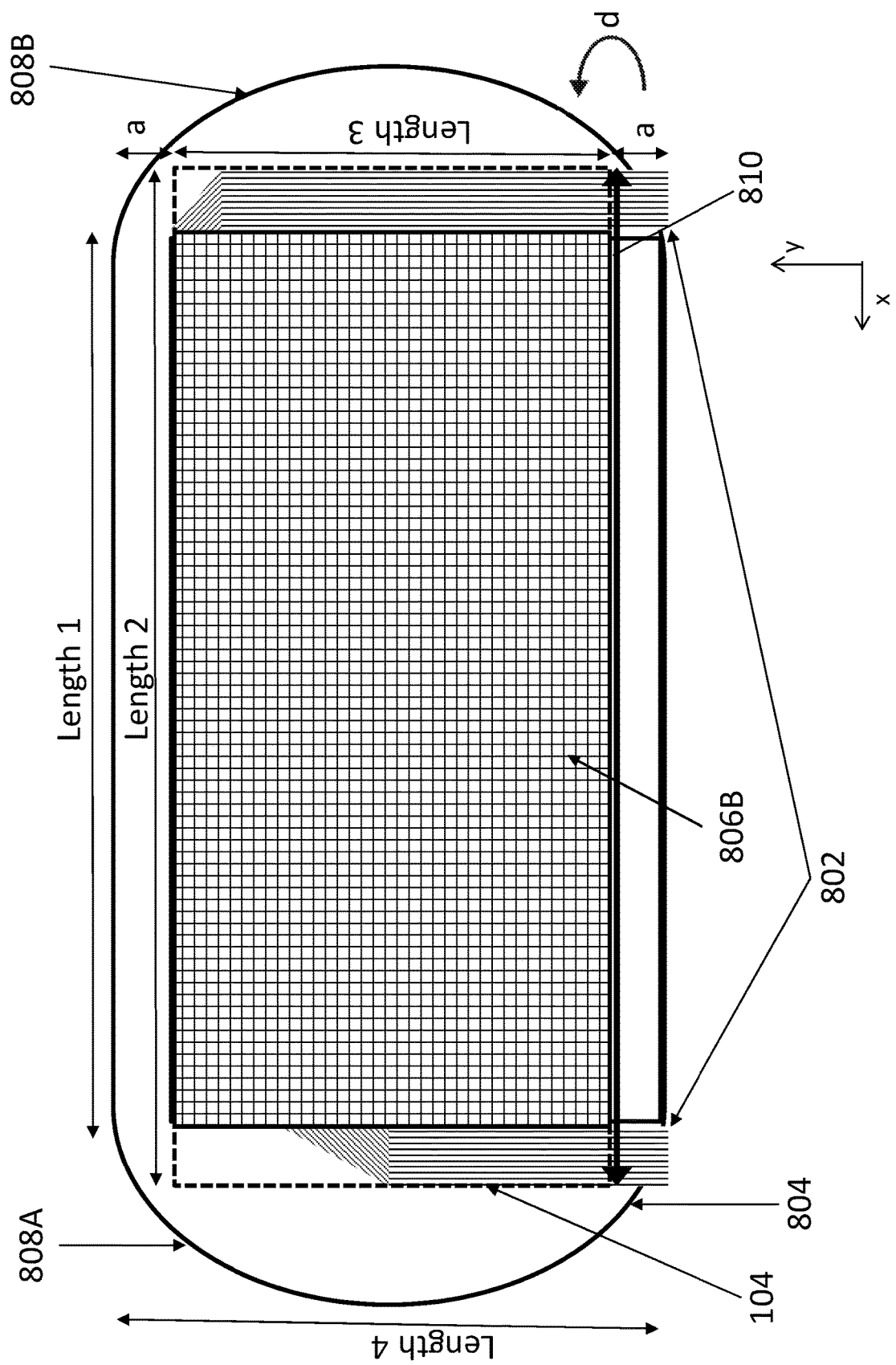

FIG. 8B is a top plan view of an alternative wrapped fingerprint sensor assembly in which the length of the flexible circuit subassembly (defined by the imaging area 806B and the routing areas 802) in the x-direction is "Length 2" extending beyond the portion of the package shape 804 having straight and parallel edges defined by length "Length 1" and into the curved areas 808A-B. Each distance between a longitudinal edge of the rigid substrate 104 and a longitudinal edge of the package shape 804 along the x-direction is defined by dimension "a" so the length of the package shape 804 in the y-direction is Length 3+2a. To maintain the sensor assembly within the perimeter of the package shape 804, however, the length of the imaging area 806B in the y-direction is "Length 3", corresponding to "Length 4" reduced by 2a. The length of the imaging area 806B in the x-direction is Length 1. Thus the imaging area of the sensor of FIG. 8B is (Length 1)×Length 3=(Length 1)×(Length 4−2a).

The length of the rigid substrate 104 in the x-direction is Length 2 and the width of the rigid substrate 104 in the y-direction is Length 3.

The imaging area 806B of the sensor assembly of FIG. 8B is greater than the imaging area 806A of the sensor assembly of FIG. 8A if:

Length 1×a<Length 4×r.

Accordingly, in the embodiment of FIG. 8B, the "imaging area," i.e. the area where traces overlap and fingerprint measurements are made, within the "rigid substrate" area is maximized compared to the package shape, increasing the number of sensor traces.

FIG. 8B shows a top plan view of the maximized imaging area 806B of the wrapped fingerprint sensor assembly superimposed on a button shape 804 (i.e., package shape). The rigid substrate 104 shape is illustrated by the dotted line, defined by Length 2 and Length 3, and a portion of the flexible circuit subassembly is superimposed on the rigid substrate 104 shape. As shown in FIG. 8B, flexible circuit subassembly is wrapped around the rigid substrate 104 along the fold line 810 in direction "d". The imaging area 806B is formed by the portion of the flexible circuit subassembly defined by Length 1 and Length 3. In an embodiment, the rigid substrate 104 is configured to be of a rigid substrate shape which is maximized within the perimeter of the button shape 804 by extending Length 2 along the x-axis and reducing Length 3 along the y-axis. Accordingly, the imaging area 806B can be maximized with a longer corresponding Length 1 and reduced Length 3 so that the imaging area 806B extends into the curved areas 808A, 808B on the button shape 804.

Figure 8C:
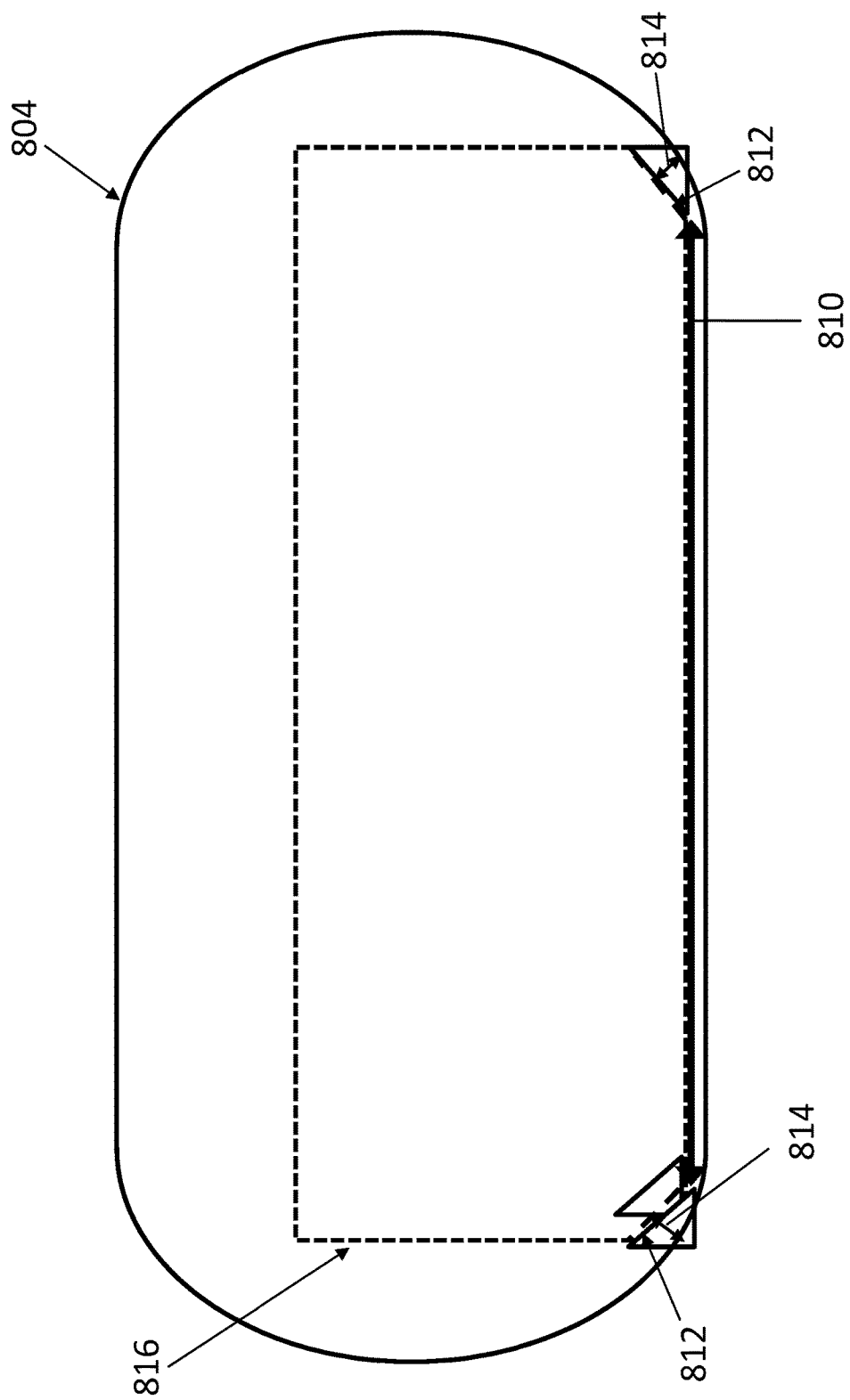
FIG. 8C is a top plan view of a wrapped fingerprint sensor assembly with chamfered corners superimposed on a package form factor.

FIG. 8C is a top plan view of a wrapped fingerprint sensor assembly 816 with chamfered corners superimposed on a button outline. As illustrated in FIG. 8C, the corners 812 of the wrapped fingerprint sensor assembly 816 at the folding edges along the fold line 810 may be chamfered. In some embodiments, the wrapped fingerprint sensor assembly 816 comprises a rigid substrate with chamfered corners and a flexible circuit subassembly configured to accommodate the rigid substrate with chamfered corners. The chamfered corners 812 allow the wrapped fingerprint sensor assembly 816 to be extended further into the curved areas of the button shape 804, enabling a larger imaging area and facilitating placement of passive components on the PCB (i.e., providing more space for the passive components), easier routing of conductive traces, and ground connections. The chamfered corners 812 have the additional advantage of facilitating the encapsulation process. Chamfering the corners 812 with the narrowest distance between the edges of the wrapped fingerprint assembly 816 and the edges of the button shape 804 provides a larger margin 814 in which the non-conductive dielectric material can flow more freely around the wrapped fingerprint assembly 816 to encapsulate the wrapped fingerprint assembly 816. As can be appreciated from FIG. 8C, chamfering also permits the wrapped fingerprint assembly 816 to be placed further off-center on the PCB.

Figure 8D:
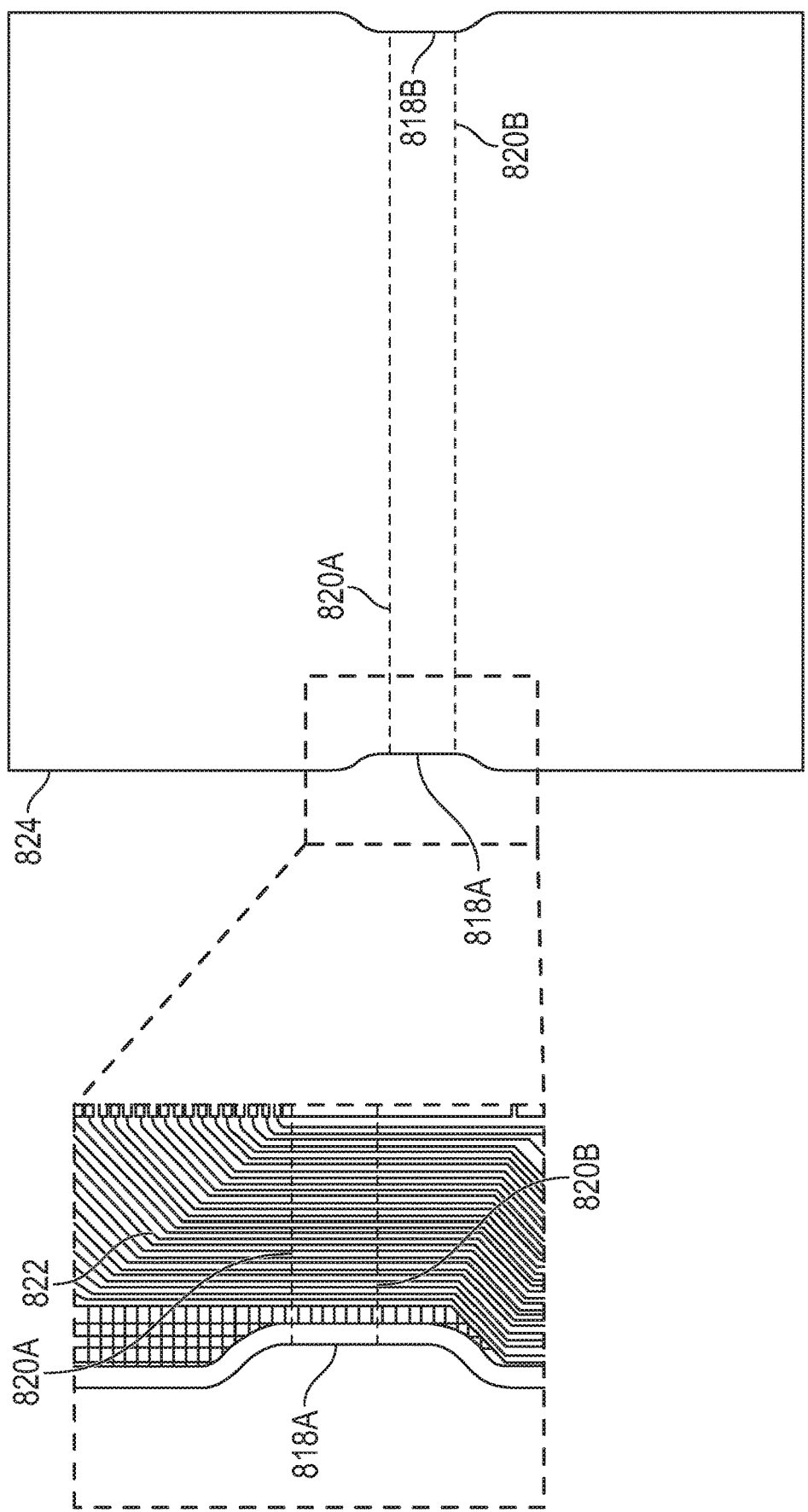
FIG. 8D is a top plan view of a flexible substrate configured to accommodate a rigid substrate with chamfered corners.

FIG. 8D is a top plan view of the flexible circuit subassembly 824 configured to accommodate a rigid substrate with chamfered corners. As illustrated in FIG. 8D, both sides of the unwrapped flexible circuit subassembly 824 have cutouts 818A-B around the area of the fold lines 820A-B. As shown in FIG. 8D, the flexible circuit subassembly 824 may comprise conductive interconnects 822 routed inwardly from the chamfer cutouts 818A-B.

Figure 9A:
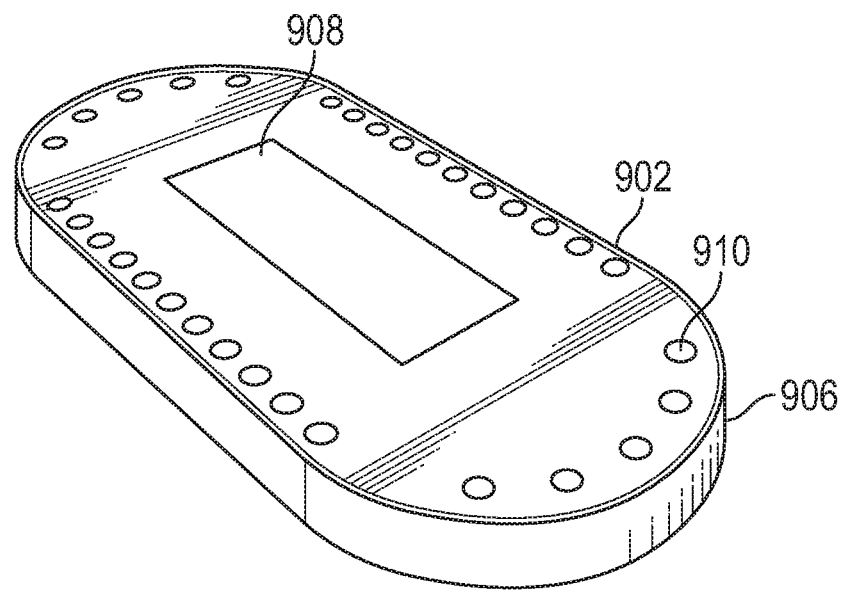
FIGS. 9A-9B are perspective views showing the bottom and top, respectively, of the fingerprint sensor module comprising a fingerprint sensor stack encapsulated in an encapsulating material.
Figure 9B:
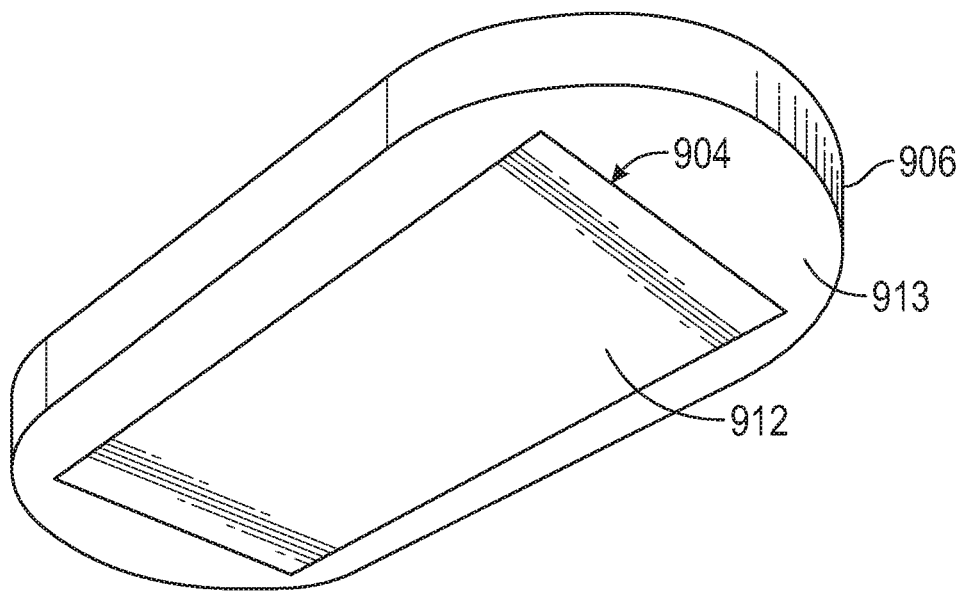

FIGS. 9A-9B are perspective views showing the bottom and top, respectively, of a fingerprint sensor module comprising the PCB and the wrapped fingerprint sensor assembly encapsulated in a non-conductive dielectric material. Specifically, FIGS. 9A-9B illustrates the PCB 902 (which may correspond to PCB 202 shown in FIGS. 2-6) and the wrapped fingerprint sensor assembly 904 (which may correspond to wrapped fingerprint sensor assembly 108 shown in FIGS. 1-6) encapsulated in material 906 in accordance with various exemplary embodiments. ASIC 908 (which may correspond to ASIC 106) may extend into or through a cutout formed in the PCB 902. The encapsulating material may comprise a non-conductive dielectric, such as liquid crystal polymer, an epoxy, or a composite material injected or pressure injected in and around the fingerprint sensor stack through the utilization of precision hard tooling. A process such as Film-Assisted Molding is preferred in order to prevent any molding compound from encroaching onto the sensing surface of the wrapped fingerprint sensor assembly 904 or onto the BGA, LGA (or other interconnect) pads 910. The Film-Assisted Molding process allows the imaging surface 912 of the wrapped fingerprint sensor assembly 904 and the BGA assembly pads 910 to be exposed. In an embodiment, the Film-Assisted Molding process creates a recessed imaging surface 912, such that molded surface 913 is elevated above the surface 912 of the imaging area.

Figure 9C:
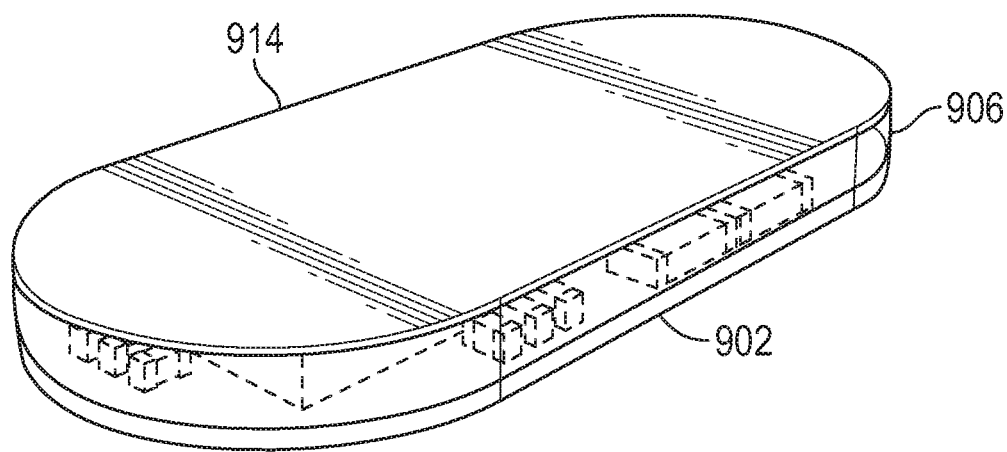
FIG. 9C is a perspective view of the top of the fingerprint sensor module with the cover panel attached to the encapsulated fingerprint sensor stack.

FIG. 9C illustrates a cover panel 914 (which may correspond to cover panel 302) attached to the PCB 902 and the wrapped fingerprint sensor assembly encapsulated with dielectric 906. The cover panel 914 is attached over the imaging area of the wrapped fingerprint sensor assembly 904 before or after an encapsulation process. The cover panel 914 may be added before the encapsulation process so that it is possible to encapsulate the edges of the glass of the cover panel 914 to improve robustness of the module. In an embodiment, any excess non-conductive dielectric material, the cover panel, and the PCB can be ground or milled to produce a finished fingerprint sensor module.

Figure 10:
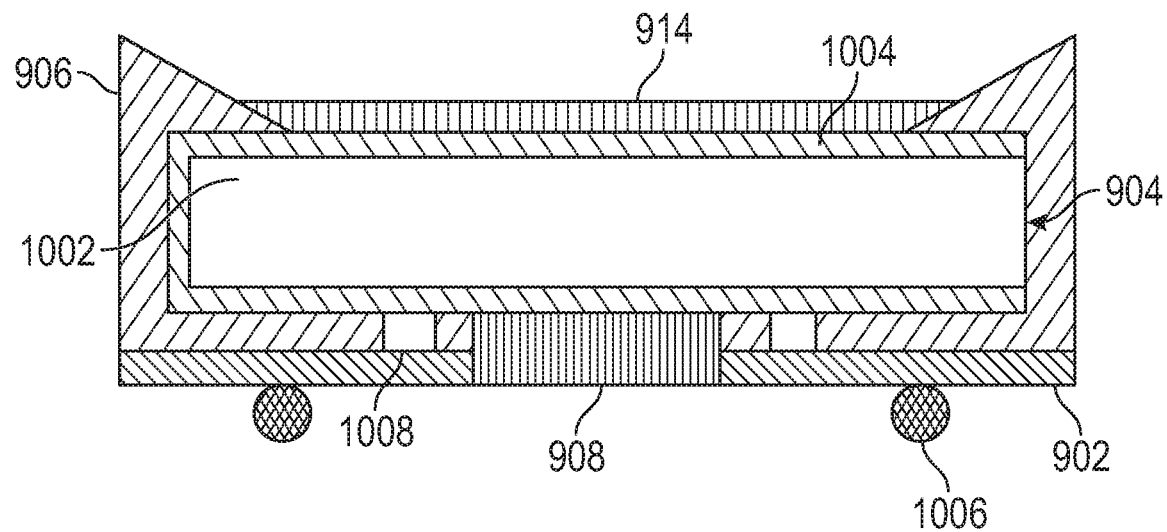
FIG. 10 is a transverse cross sectional view of the fingerprint sensor module.

FIG. 10 illustrates a cross sectional view of a fingerprint sensor module (e.g., a transverse cross section of the fingerprint sensor module of FIGS. 9A-9C) including the wrapped fingerprint sensor assembly 904 including the ASIC 908 attached to the PCB 902 and the cover panel 914 encapsulated by dielectric material (encapsulant) 906. The wrapped fingerprint sensor assembly 904 may comprise a rigid substrate 1002 (which may correspond to rigid substrate 104 in FIGS. 1-6) on which is wrapped a flexible circuit subassembly 1004 (which may correspond to flexible circuit subassembly 102 in FIGS. 1-6). In the embodiment shown in FIG. 10, the edges of the cover panel 914 are covered by the encapsulant 906 and the cover panel 914 is recessed with respect to the perimeter of the encapsulant 906. In some embodiments, the top surface of the cover panel 914 may be flush with a top surface of the encapsulant 906. Alternatively, the cover panel 914 may be added after the encapsulant is applied and attached to a top surface of the encapsulant 906. In some embodiments, the PCB 902 may comprise ball grid arrays (BGA) 1006—or alternatively land grid arrays (LGA)—on a bottom surface. In some embodiments, the wrapped fingerprint sensor assembly 904 may be electrically connected to the PCB 902 through a conductive joint 1008, e.g. a SMT joint.

Figure 11A:
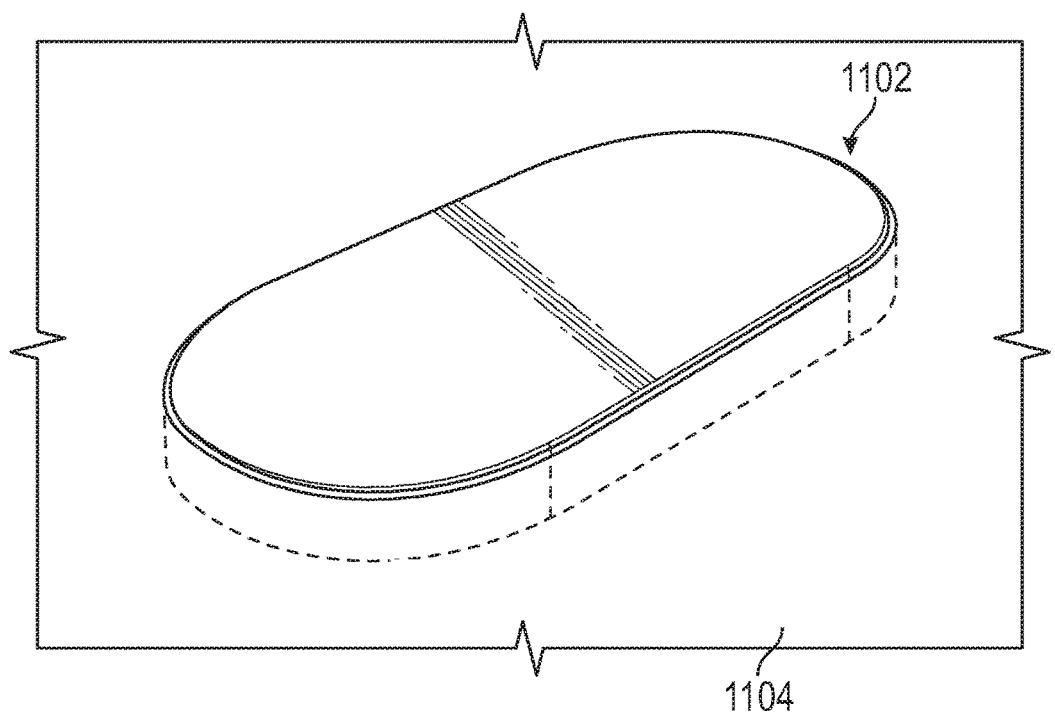
FIG. 11A is a top perspective view of the fingerprint sensor module in a cutout of a host device panel.
Figure 11B:
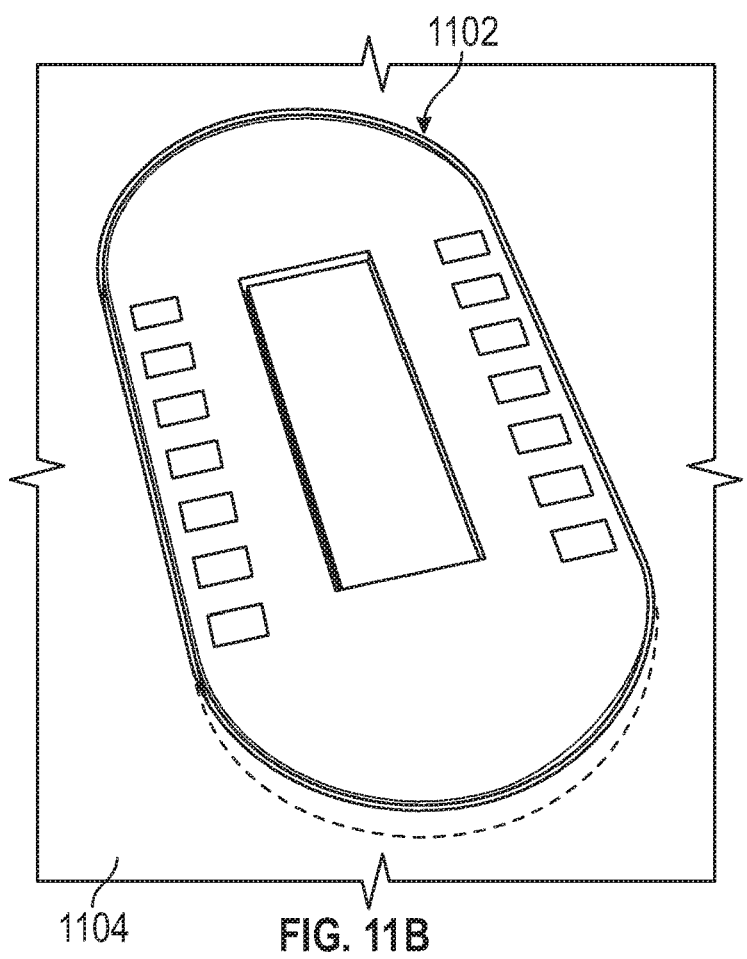
FIG. 11B is a bottom perspective view of the fingerprint sensor module in the cutout of the host device panel.

FIGS. 11A-11B illustrates a top view and a bottom view, respectively, of a fingerprint sensor module 1102 installed in a cutout in a host device panel 1104. In some embodiments, the fingerprint sensor module 1102 may be surrounded by a gap filler. The gap filler surrounds the fingerprint sensor module 1102 to secure the module 1102 securely into the cutout. Suitable filler materials for the gap filler include epoxy, molding compound, acrylics, modified acrylics, silicones, and other non-conductive or conductive polymers. In one embodiment, an electrically conductive filler may be used, and may also serve to provide a bleed path to ground for ESD (electrostatic discharge) build up.

Figures 12A, 12B:
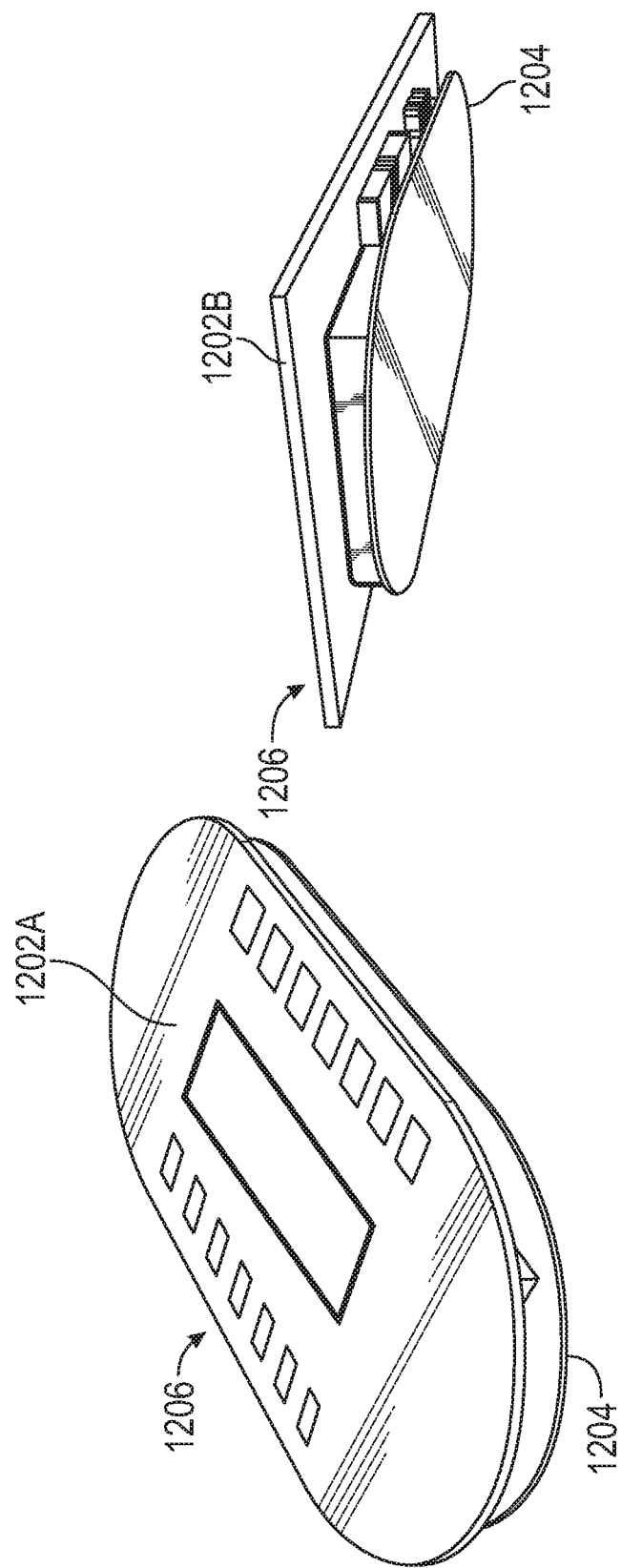
FIG. 12A is a bottom perspective view of a fingerprint sensor stack with an oversized lozenge-shaped PCB (relative to the package form factor) and a lozenge-shaped cover panel.
FIG. 12B is a perspective view of a fingerprint sensor assembly with a rectangular oversized PCB (relative to the package form factor) and a lozenge-shaped cover panel.

FIGS. 12A-12B illustrate a fingerprint sensor assembly 1206 comprising a PCB 1202A-B that is oversized with respect to a cover panel 1204 and/or button configuration (not shown). In an embodiment, the PCB 1202A-B is configured to have a larger area than the cover panel 1204 and is larger than a cutout formed in a host device panel 1208 in which the fingerprint sensor module is installed so that the PCB 1202A-B extends underneath the host device panel 1208, as illustrated in FIGS. 12C-12D.

FIGS. 12C-12D illustrate bottom perspective views of the fingerprint sensor module 1206 with an oversized PCB 1202A-B in a cutout in the host device panel 1208 in accordance with various exemplary embodiments. The size of the cutout is smaller than the size of the PCB 1202A-B, so that when the fingerprint sensor module 1206 is installed in the host device panel, the outer perimeter of the PCB 1202A-B bears against the back of the host glass panel 1208 around the cutout. In an embodiment, the oversized PCB 1202A-B can be any shape larger than the cover panel 1204. For example, the PCB 1202A is lozenge-shaped in FIGS. 12A,12 C, and the PCB 1202B is rectangular in FIGS. 12B,12D.

Figure 12E:
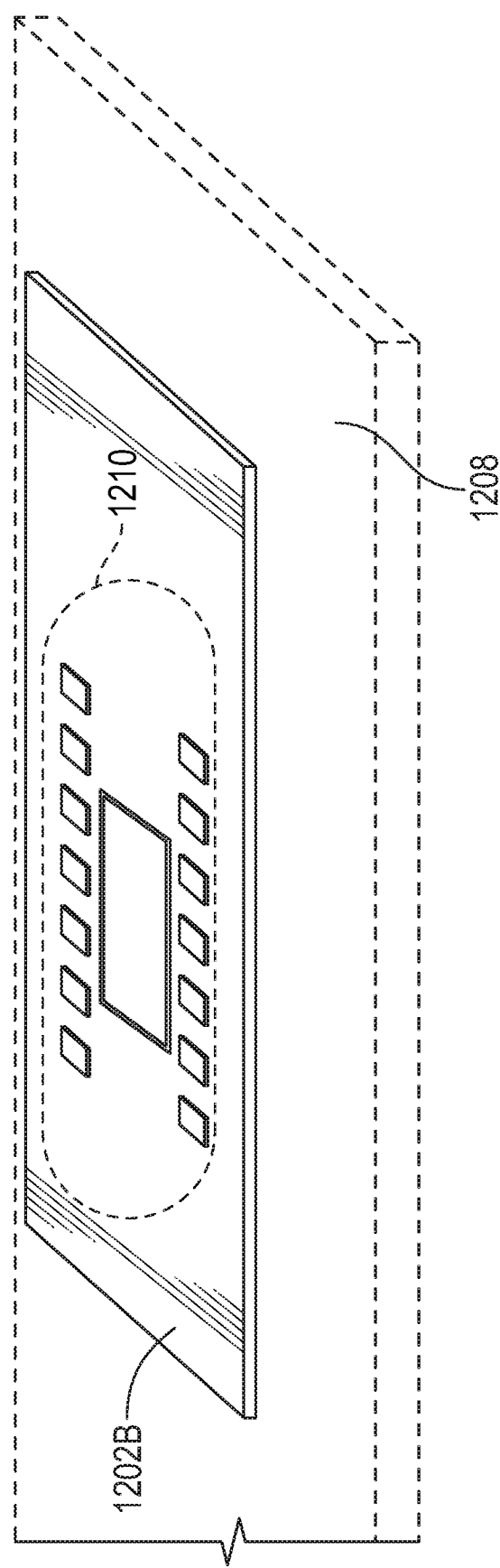
FIG. 12E is a bottom view of the fingerprint sensor module with an oversized PCB in a glass cutout in a host device panel.

Referring to FIG. 12E, the front side of the oversized PCB 1202B sits against the back side of the host device panel 1208. The shape of the cutout 1210 in the host device panel 1208 is substantially similar to the cover panel 1204 (see FIGS. 12A, 12B). The portions of the oversized PCB 1202*b* which are larger than the cover panel 1204 extends beyond the cutout 1210 in the host glass panel 1208. The front side of the oversized PCB 1202*b* provides "mounting datum." In an embodiment, the inside of the host glass panel 1208 includes molded flanges that allow tight tolerance "mounting datum," a repeatable sensor surface distance from back of display. In an embodiment, the tolerance of the "mounting datum" can be adjusted so that the surface of the fingerprint sensor module located on the front side the oversized PCB 1202B is flush with or just about flush with the front side surface of the host glass panel 1208. In another embodiment, the molded flange used as a mounting datum may be located on the edges of the PCB, outside the area of the host glass panel cover opening or cut out, such that the flange is molded over the edges of the PCB during the molding process already used to mold the body of the fingerprint sensor module.

Figure 12F:
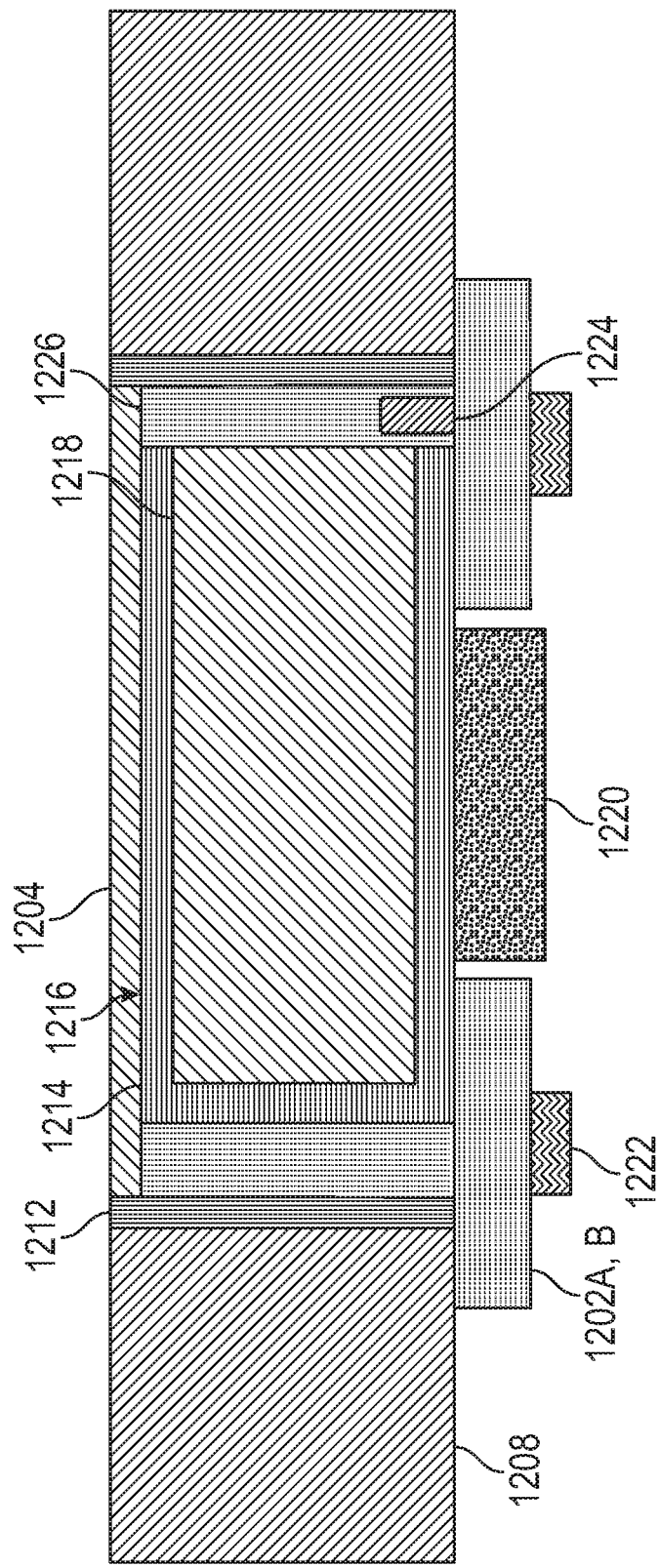
FIG. 12F is a cross sectional view along the line F-F in FIG. 12C or FIG. 12D showing the fingerprint sensor module with an oversized PCB in a cutout formed in a host device panel.

FIG. 12F is a cross sectional view along the line F-F in FIG. 12C or FIG. 12D showing the fingerprint sensor module with an oversized PCB 1202A, B in a cutout formed in the host device panel 1208. The fingerprint sensor module comprises a rigid core 1218 (which may correspond to rigid substrate 104 in FIGS. 1-6) on which is wrapped a flexible circuit subassembly 1214 (which may correspond to flexible circuit subassembly 102 in FIGS. 1-6) to form the wrapped fingerprint sensor assembly 1216 (which may correspond to wrapped fingerprint sensor assembly 108 in FIGS. 1-6). A PCB 1202A, B on which the wrapped fingerprint sensor assembly 1216 is mounted includes a cutout to receive an ASIC 1220 (which may correspond to ASIC 106 in FIGS. 1-6) of the wrapped fingerprint sensor assembly 1216 and passive components 1224 (which may correspond to passive components 304A-H in FIG. 3) mounted to the PCB 1202A, B at positions outside of the fingerprint sensor assembly 1216. Land grid arrays (LGA) 1222 (which may correspond to LGA 402 in FIG. 4)—or alternatively ball grid arrays (BGA)—are formed on a bottom surface of the PCB 1202A, B. An encapsulant 1226 (e.g., a non-conductive dielectric material which may correspond to encapsulate 906 in FIGS. 9A-9C) surrounds the fingerprint sensor assembly 1216 and defines the package form factor that is installed in the cut out of the host panel 1208. A cover panel 1204 is positioned over the fingerprint sensor assembly 1216 and the encapsulating material 1226, and a gap filler 1212 may be provided to fill gaps between the fingerprint sensor module and the cutout of the host panel 1208. The PCB 1202A, B is larger than the cutout and the cover panel 1204 (which defines the package form factor) and bears against a back surface of the host panel 1208 adjacent the cutout.

Figure 12G:
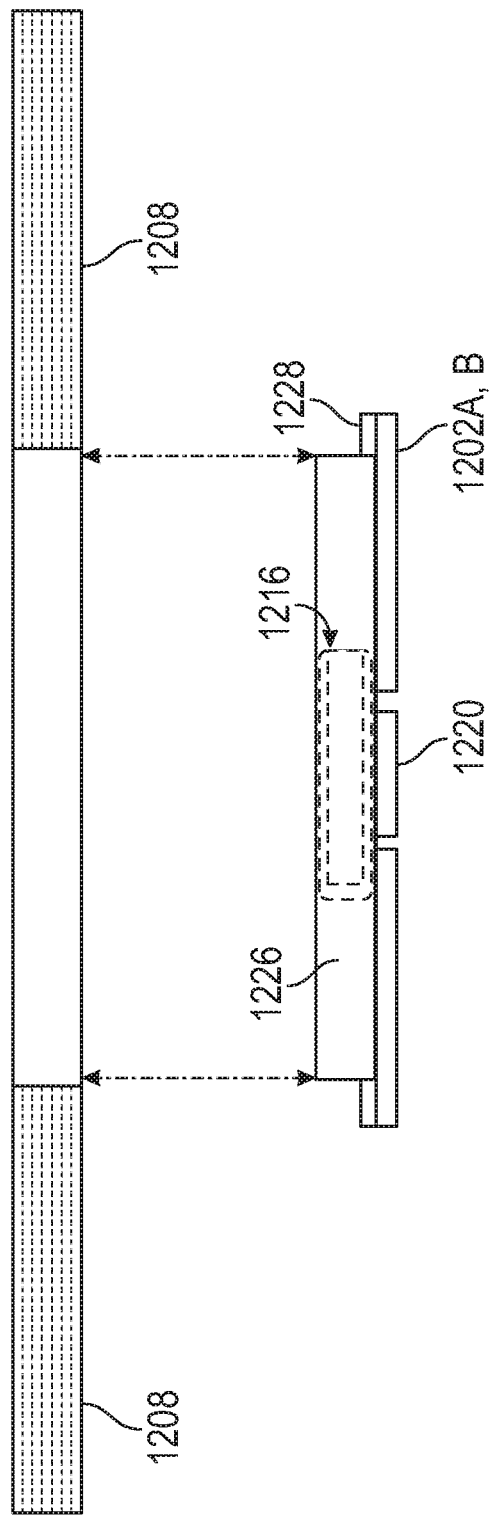
FIG. 12G shows an exploded cross-section of a fingerprint sensor module with an oversized PCB and a molded flange installed in a cutout formed in a host device pane.

FIG. 12G shows an exploded cross-section of a fingerprint sensor module with an oversized PCB and a molded flange installed in a cutout formed in a host device panel. As shown in FIG. 12G, a molded flange 1228 is formed on the peripheral portions of the PCB 1202A, B extending beyond the encapsulant 1226 (module body). In some embodiments, the molded flange 1228 is a unitary structure with the encapsulant 1226. The molded flange 1228 with respect to the fingerprint sensor module will be described in further detail below in FIG. 12I.

Figure 12H:
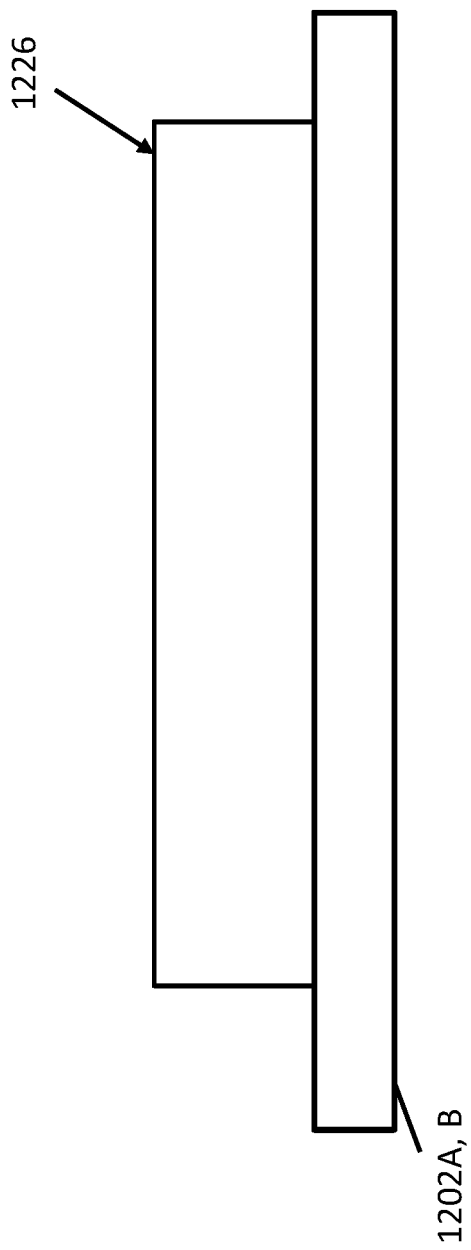
FIGS. 12H-12I show end views of two embodiments of a fingerprint sensor module with an oversized PCB.
Figure 12I:
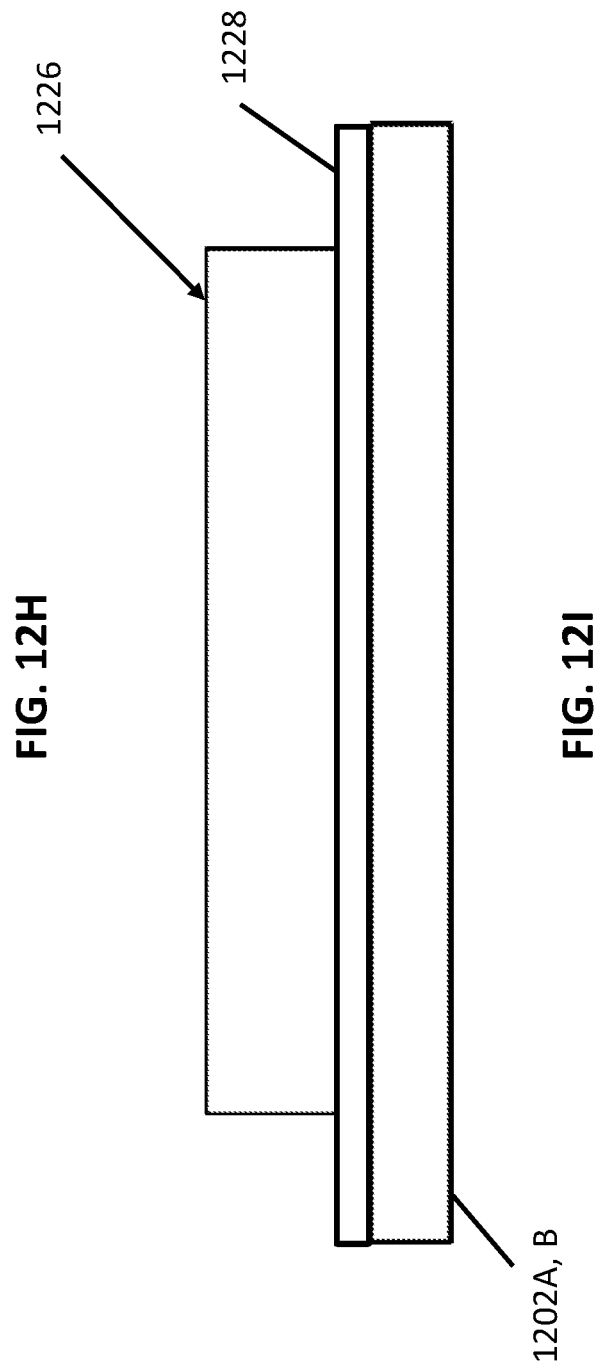

FIGS. 12H-12I show end views of two embodiments of a fingerprint sensor module with an oversized PCB. FIG. 12H shows an embodiment in which the encapsulant 1226 (module body) is formed on a PCB 1202A, B that is wider than the module body 1226, and the PCB 1202A, B provides a mounting datum against the back of the host device panel in which the module is installed. FIG. 12I shows an embodiment in which the encapsulant 1226 (module body) is formed on a PCB 1202A, B that is wider than the module body 1226, and a molded flange 1228 is formed on the peripheral portions of the PCB 1202A, B extending beyond the module body 1226. The molded flange 1228 provides a tight tolerance mounting datum against the back of the host device panel in which the module is installed and can facilitate a repeatable sensor surface distance from the back of the host device panel.

FIGS. 13A-13M illustrates beginning, intermediate, and finals steps of a manufacturing process for the fingerprint sensor module, as disclosed above, in a cost effective manner. The disclosed manufacturing process is cost effective and is capable of manufacturing large panels of fingerprint sensor modules at the same time and enables easy fingerprint sensor module form factor customization.

A process of manufacturing the fingerprint sensor module comprises manufacturing the wrapped fingerprint sensor assembly as described in U.S. Provisional Application Nos. 62/258,284; 62/349,256; and 62/374,339, and U.S. Non-Provisional application Ser. No. 15/354,426 (U.S. Patent Application Publication No. 2017/0147852) "Electronic Sensor Supported on Rigid Substrate." In the process of manufacturing a wrapped fingerprint sensor assembly, a flexible circuit subassembly with an ASIC mounted on it is wrapped around and secured to a rigid substrate.

The process of manufacturing the fingerprint sensor module with a wrapped fingerprint sensor assembly comprises: (1) attach the individual wrapped fingerprint sensor assemblies to a PCB panel with cutouts to accommodate the ASIC of each wrapped fingerprint sensor assembly; (2) attach a cover panel to each wrapped fingerprint sensor assembly; (3) encapsulate the wrapped fingerprint sensor assembly and the PCB in a non-conductive dielectric material; (4) attach solder balls; and (5) singulate individual fingerprint sensor modules.

Figure 13B:
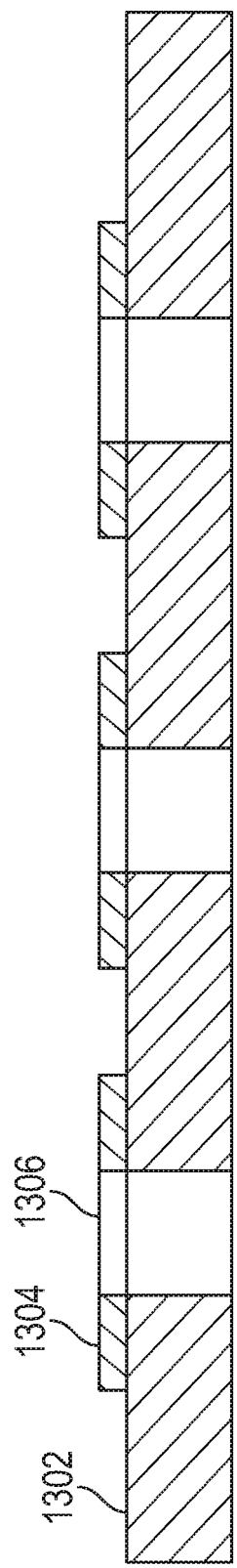

FIGS. 13A-13B illustrates a top and a cross sectional view of a first step of the process for manufacturing the fingerprint sensor module in accordance with an exemplary embodiment. A PCB panel 1302, which may comprise a two layer panel, includes electrical interconnects 1304, cutouts 1306, and passive components attached to the PCB panel 1302. An exemplary size of the PCB panel 1302 is 18 by 24 inches but other sizes are within the scope of this disclosure. In an embodiment, the PCB panel 1302 is a multiple layer panel and of different sizes. The electrical interconnects 1304 are printed on the PCB panel 1302 and may comprise copper traces to provide electrical interconnection for the individual fingerprint sensor modules and other electrical components. Electrical components include BGA or LGA assembly pads which allow the ultimate interconnection between the fingerprint sensor modules and the host device. The cutouts 1306 in the PCB panel 1302 accommodate the ASICs on the wrapped fingerprint sensor assemblies. Passive components attached to the PCB panel 1302 may include capacitors and inductors.

Figure 13C:
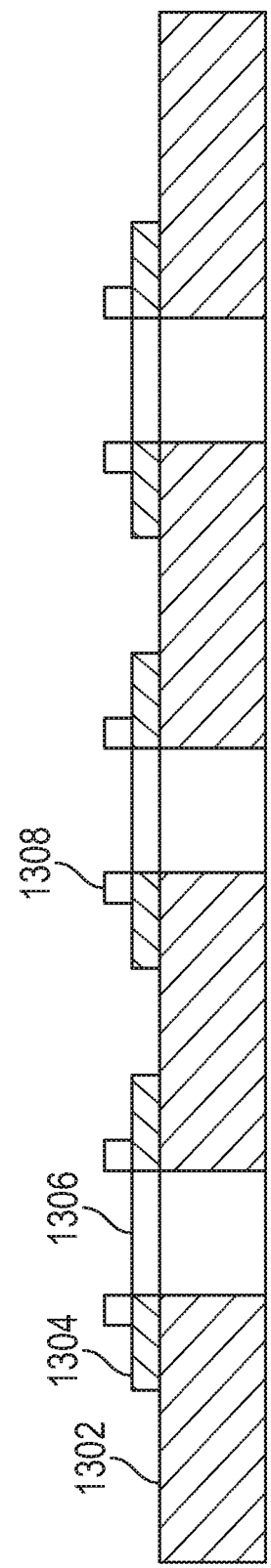

FIG. 13C illustrates a cross sectional view of a second step of the process for manufacturing the fingerprint sensor module in accordance with an exemplary embodiment. Solder paste 1308 is printed on the PCB panel 1302, specifically on top of the electrical interconnects 1304 and adjacent to the cutouts 1306.

Figure 13D:
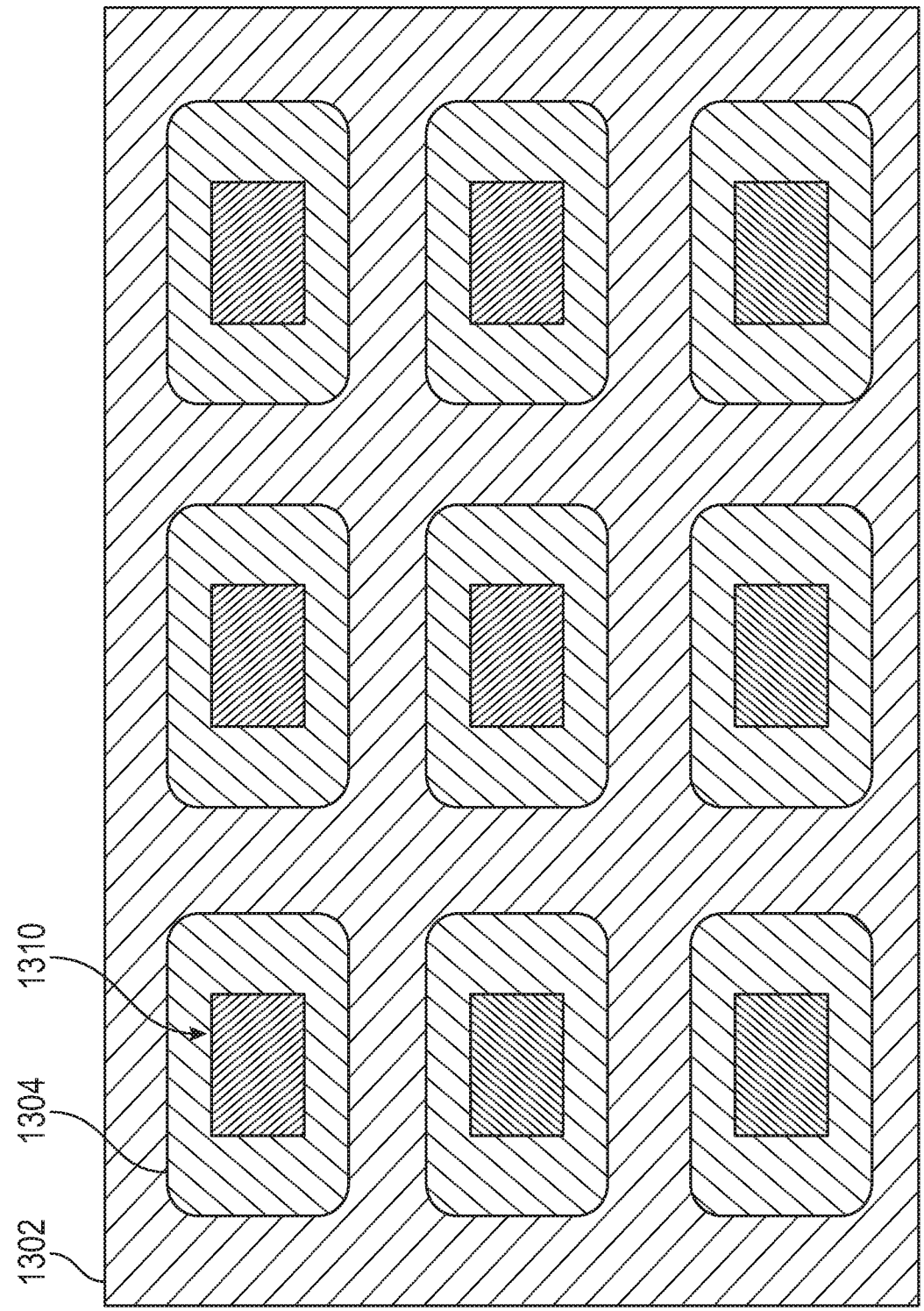

FIGS. 13D-13E illustrates a top view and a cross sectional view of a third step of the process for manufacturing the fingerprint sensor module in accordance with an exemplary embodiment. Wrapped fingerprint sensor assemblies 1310 are placed on the PCB so that the ASIC 1312 of the wrapped fingerprint sensor assemblies 1310 fall into the cutouts 1306 and interconnect pads on the wrapped fingerprint sensor assemblies 1310 meet with the corresponding electrical interconnects 1304 on the PCB panel 1302. The solder paste 1308 is reflowed to establish electrical interconnects between the PCB panel 1302 and the wrapped fingerprint sensor assemblies 1310, which are themselves interconnected to ASICs 1312.

FIG. 13F illustrates a cross sectional view of a fourth step of the process for manufacturing the fingerprint sensor module in accordance with an exemplary embodiment. An adhesive 1314 is applied on top of the wrapped fingerprint sensor assemblies 1310. In an embodiment, the adhesive 1314 is jet dispensed. In another embodiment, the adhesive is a high modulus UV adhesive or a high modulus "snap" thermal cure adhesive.

Figure 13G:
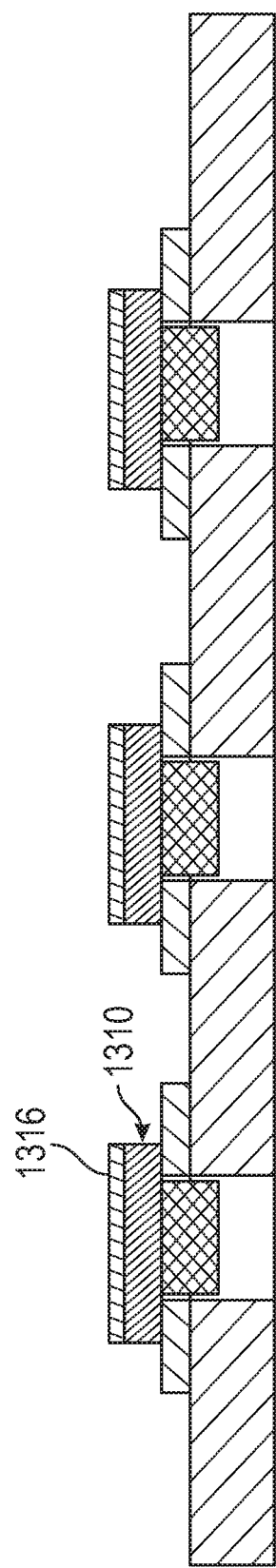

FIG. 13G illustrates a cross sectional view of a fifth step of the process for manufacturing the fingerprint sensor module in accordance with an exemplary embodiment. Cover panels 1316 are placed on top of the wrapped fingerprint sensor assemblies 1310. The cover panels 1316 are attached to the top of the wrapped fingerprint sensor assemblies 1310 by the adhesive 1314. Sufficient pressure is applied to the cover panels ensure that the cover panels 1316 are adhered firmly to the wrapped fingerprint sensor assemblies 1310 with no air bubbles or gaps. In one embodiment, the assemblies are cured in a vacuum oven or autoclave to minimize entrapment of air in the bond line. The adhesive is subsequently cured. In another embodiment, the cover panels 1316 are attached to the wrapped fingerprint sensor assemblies 1310 after an eighth step of the process for manufacturing the fingerprint sensor module described below.

Figure 13H:
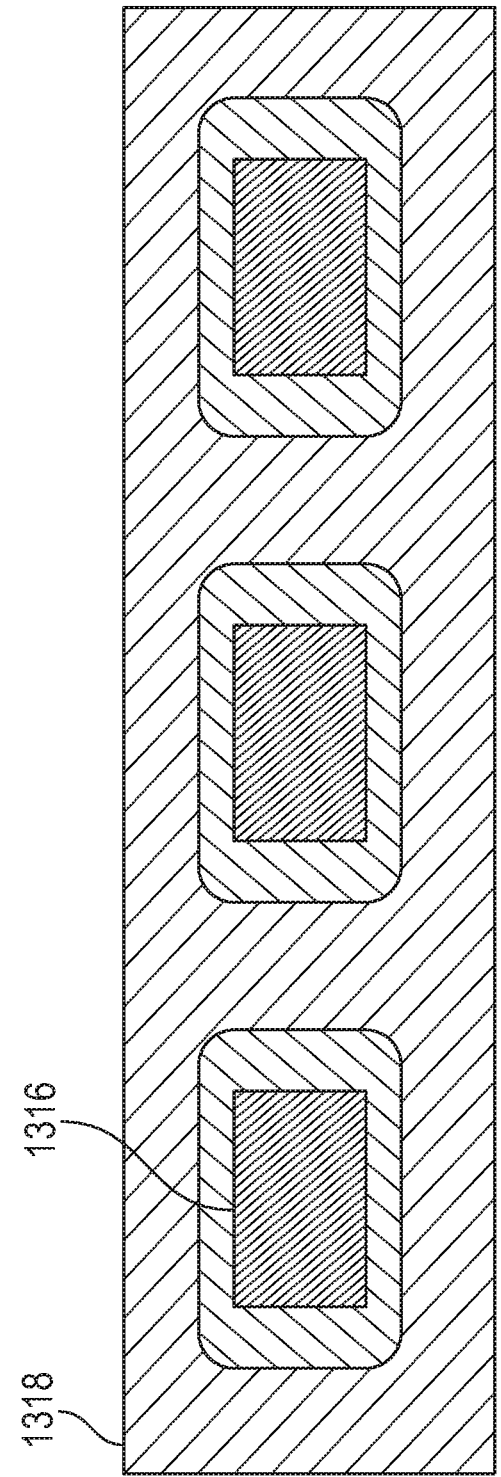

FIG. 13H illustrates a top view of a sixth step of the process for manufacturing the fingerprint sensor module in accordance with an exemplary embodiment. The PCB panel 1302 is cut down into multiple PCB strips 1318, each containing one or more rows of the wrapped fingerprint sensor assemblies 1310 mechanically and electrically connected to the PCB. In an embodiment, the PCB panel 1302 is cut down into multiple PCB subpanels 1318 containing more than two rows of the wrapped fingerprint sensor assemblies 1310. Cutting down the PCB panel 1302 into multiple PCB strips 1318 allows the use of precision hard injection molding tools when encapsulating each of the wrapped fingerprint sensor assemblies 1310 with a non-conductive dielectric material.

Figure 13I:
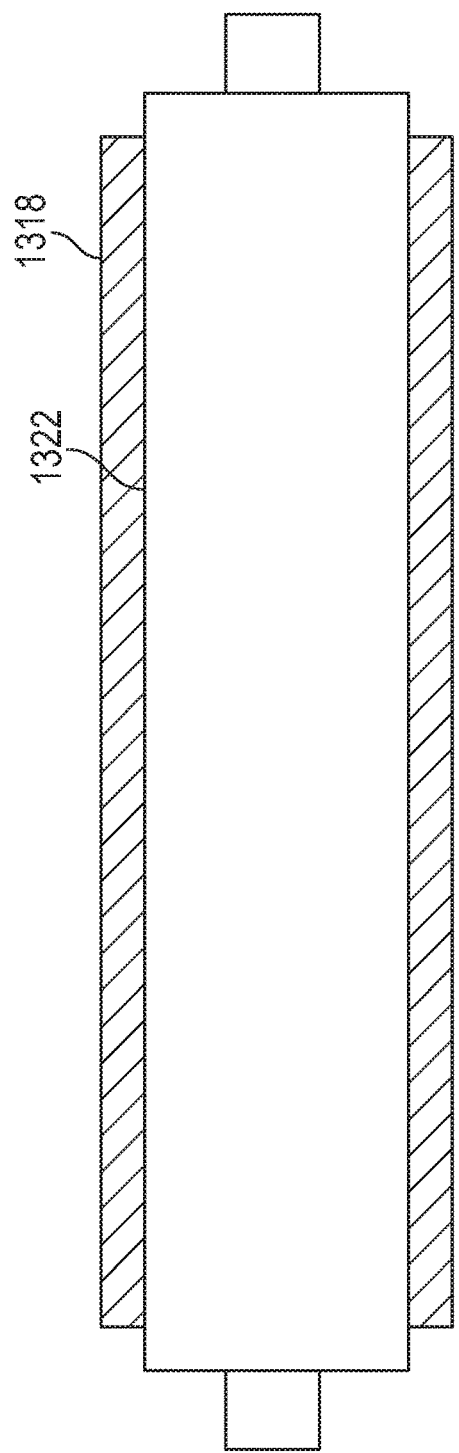
Figure 13J:
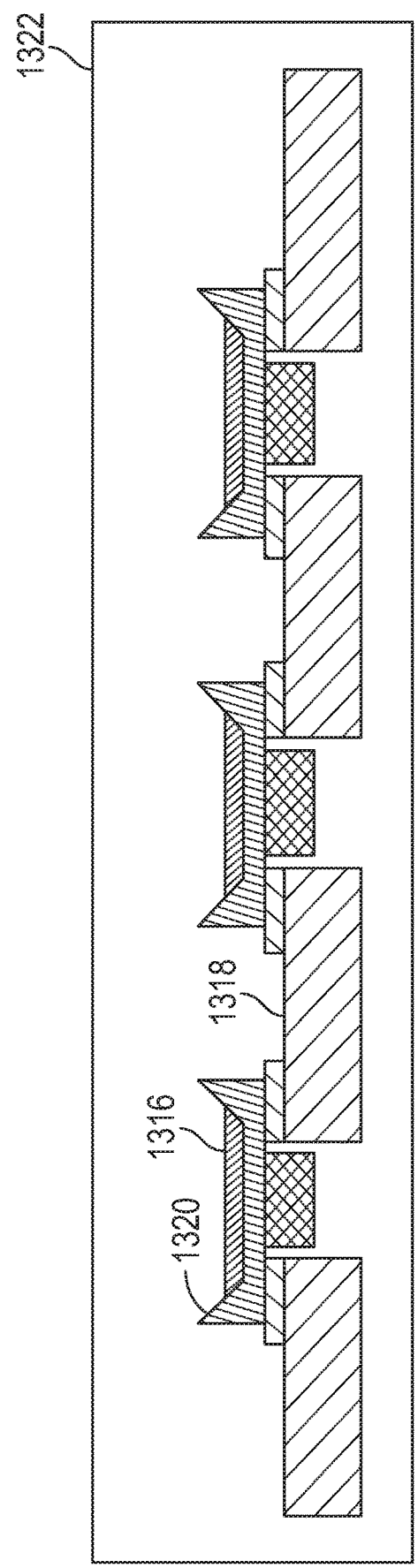

FIGS. 13I-13J illustrates a top view and a cross sectional view of a seventh step of the process for manufacturing the fingerprint sensor module in accordance with an exemplary embodiment. The wrapped fingerprint sensor assemblies 1310, the PCB strip 1318, and the passive components attached to the PCB strip 1318 are encapsulated with a non-conductive dielectric material 1320. Film-Assisted Molding is utilized in order to prevent any non-conductive dielectric material from encroaching onto the sensing surface or onto the BGA (or other interconnect) pads of the wrapped fingerprint sensor assemblies 1310. In an embodiment, the molding tool 1322 has a separate molding cavity for each wrapped fingerprint sensor assembly 1310, each cavity thereby defining the shape of the fingerprint sensor modules, specifically the x, y footprint. In the illustrated embodiment, as shown in FIG. 13J, the mold cavities of the molding tool 1322 form the dielectric encapsulant so that it encapsulates and extends above the edges of the cover panel so that the cover panel is recessed with respect to the encapsulant. In other embodiments, the mold cavities may be configured so that the cover panel is not encapsulated by the dielectric material and/or the cover panel is flush with or extends above the dielectric encapsulant. In other embodiments, the cover panel may be attached to the sensor's sensing surface after the molding operation.

When using the molding tool 1322, subsequent milling or grinding is not required to shape the outline of the encapsulated wrapped fingerprint sensor modules (although subsequent machining or milling of the PCB outline may be required if the molding is performed in panel or strip format). In another embodiment, there is a single molding cavity for multiple wrapped fingerprint sensor assemblies 1310. In this embodiment, the ultimate shape of the wrapped fingerprint sensor modules, specifically the outer shape and dimensions, are defined subsequently through a milling, machining, sawing, or laser machining process.

Figure 13K:
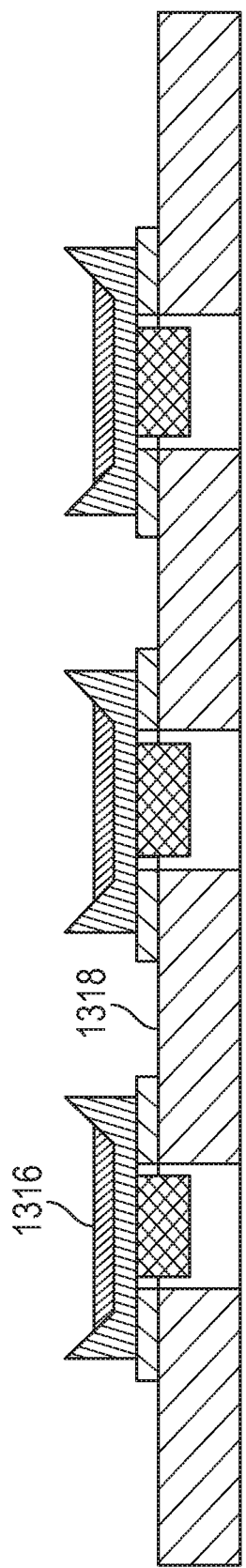

FIG. 13K illustrates a cross sectional view of an eighth step of the process for manufacturing the fingerprint sensor module in accordance with an exemplary embodiment. The PCB strip 1318 is removed from the mold 1322.

Figure 13L:
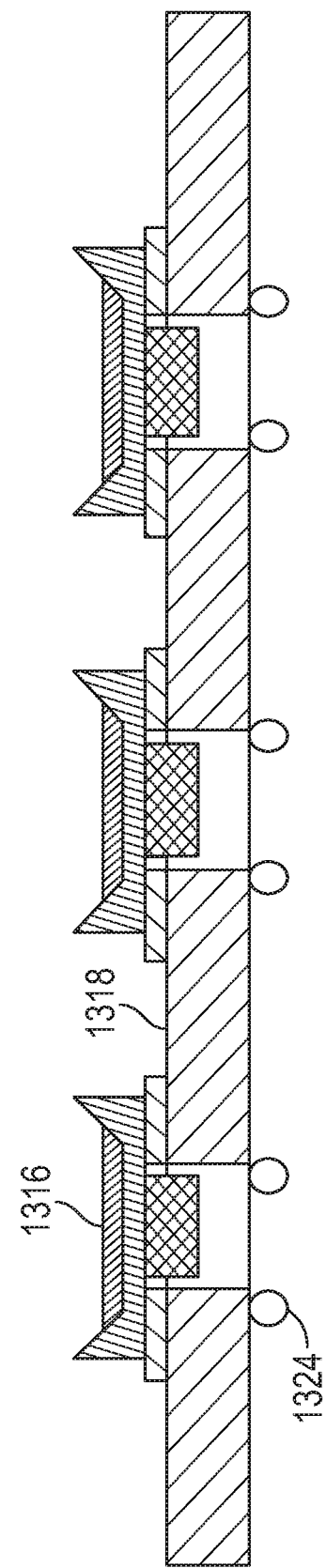

FIG. 13L illustrates a cross sectional view of a ninth step of the process for manufacturing the fingerprint sensor module in accordance with an exemplary embodiment. Solder balls 1324 are mounted onto the PCB strip 1318 in the case where the fingerprint sensor module is a BGA module.

Figure 13M:
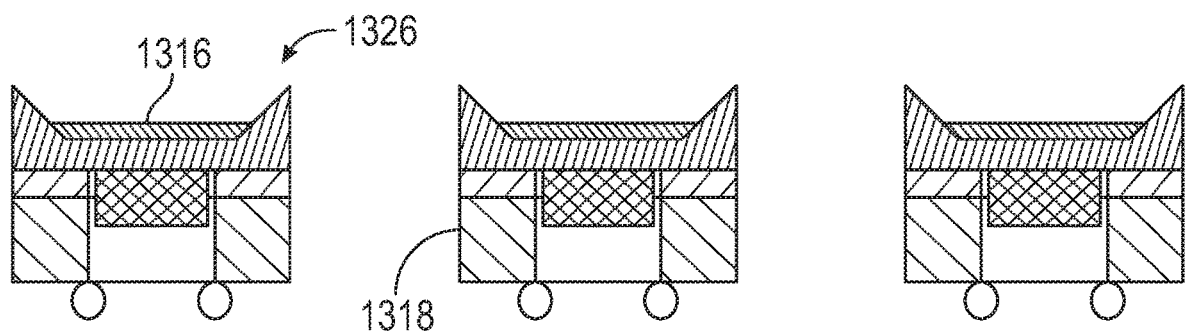

FIG. 13M illustrates a cross sectional view of a tenth step of the process for manufacturing the fingerprint sensor module in accordance with an exemplary embodiment. The PCB strip 1318 with encapsulated wrapped fingerprint sensor assemblies is singulated into individual fingerprint sensor modules 1326. Subsequent machining or milling is carried out if a different desired module shape is required. FIG. 13M illustrates a cross sectional view of the finished fingerprint sensor module 1326 in accordance with an exemplary embodiment.

Figure 13N:
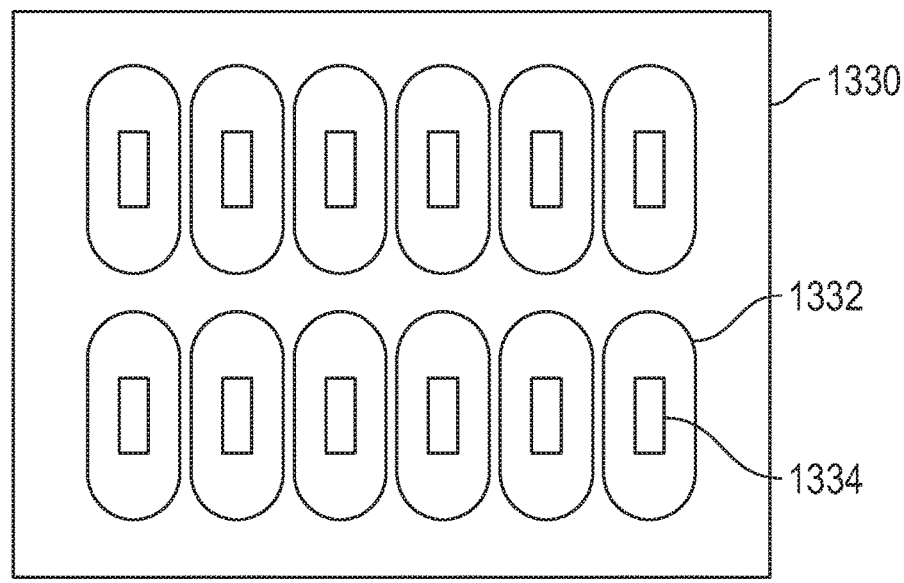
FIG. 13N illustrates a PCB panel with sensor PCB outlines and cutouts for sensor ASICS.
Figure 13O:
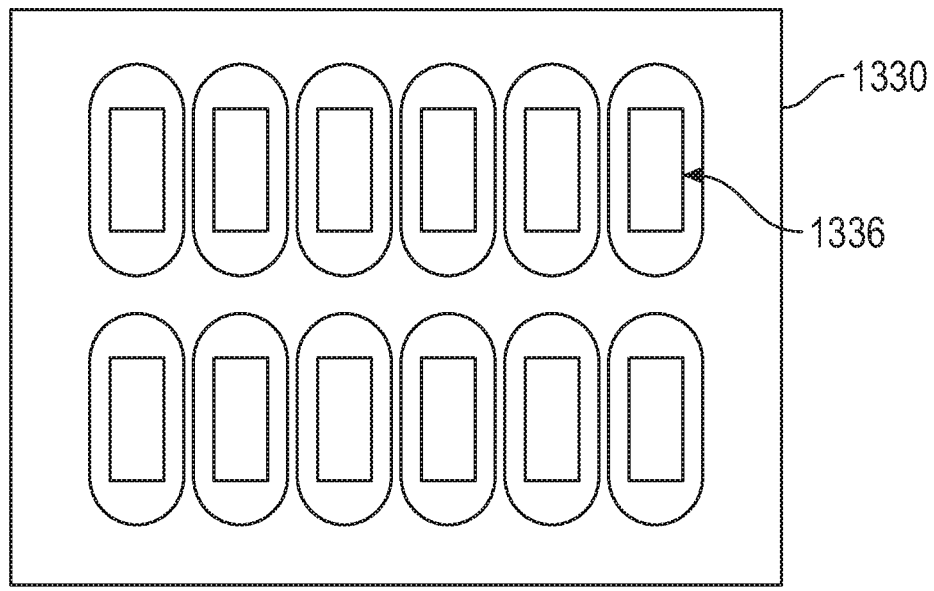
FIG. 13O illustrates the PCB panel with fingerprint sensor assemblies placed on the sensor PCB outlines.
Figure 13P:
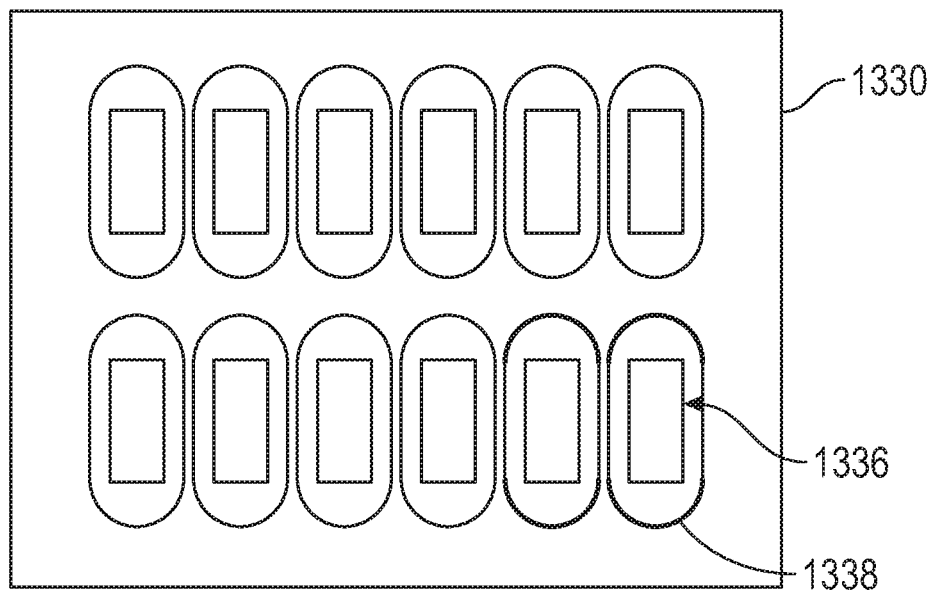
FIG. 13P illustrates the PCB panel with fingerprint sensor assemblies placed on the sensor PCB outlines and the rounded ends of the PCB outlines precut prior to encapsulation/molding.
Figure 13Q:
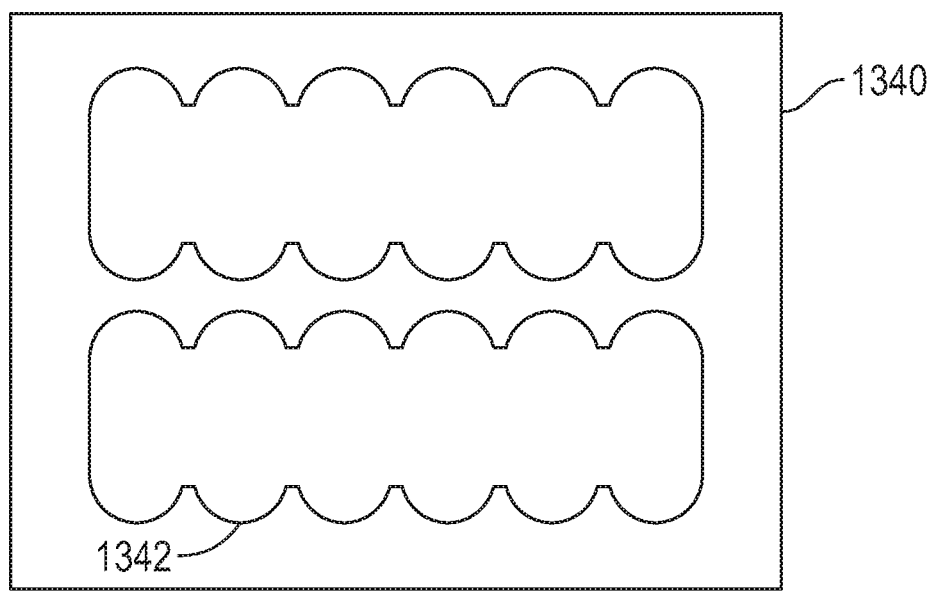
FIG. 13Q shows a mold tool with combined cavities for molding multiple fingerprint sensor module bodies.
Figure 13R:
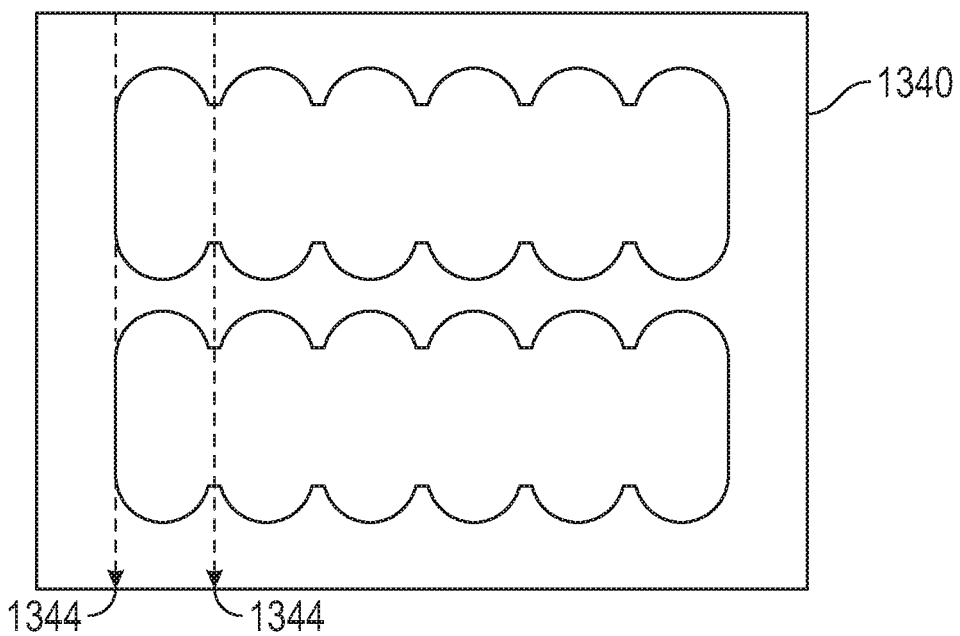
FIG. 13R shows the mold tool with combined cavities for molding multiple fingerprint sensor module bodies and cut lines superimposed on the mold cavities showing the cut locations for separating the PCBs and module bodies into individual sensor modules.

In FIGS. 13N-13R show a PCB panel and molding tooling for an alternate method using grouped cavities for forming multiple module bodies. FIG. 13N illustrates a PCB panel 1330 with sensor PCB outlines 1332 and cutouts 1334 for sensor ASICS. FIG. 13O illustrates the PCB panel with fingerprint sensor assemblies 1336 (e.g., wrapped fingerprint sensor assemblies) placed on the sensor PCB outlines. FIG. 13P illustrates the PCB panel 1330 with fingerprint sensor assemblies 1336 placed on the sensor PCB outlines 1332 and the rounded ends 1338 of the sensor PCB outlines 1332 are precut prior to encapsulation/molding. In the embodiment shown in FIG. 13P, only two units on the bottom right have been precut. That is, the PCB panel 1330 comprises 2 sensor PCB outlines 1332 with precut rounded ends 1338. FIG. 13Q shows a mold tool 1340 comprising mold cavities 1342. In some embodiments, the mold cavities 1342 comprise multiple cavities joined at the longitudinal edges for molding multiple fingerprint sensor module bodies. FIG. 13R shows the mold tool 1340 with the combined cavities 1342 for molding multiple fingerprint sensor module bodies and cut lines superimposed on the combined mold cavities 1342 showing the cut locations, i.e. cut lines 1344, for separating the PCBs and module bodies into individual sensor modules. The long, straight edge of each the sensor module is defined by machining or perhaps a dicing saw along the cut lines 1344 to separate the individual modules. One or both rounded ends of each module's PCB may be pre-cut prior to the molding process.

Figure 14A:
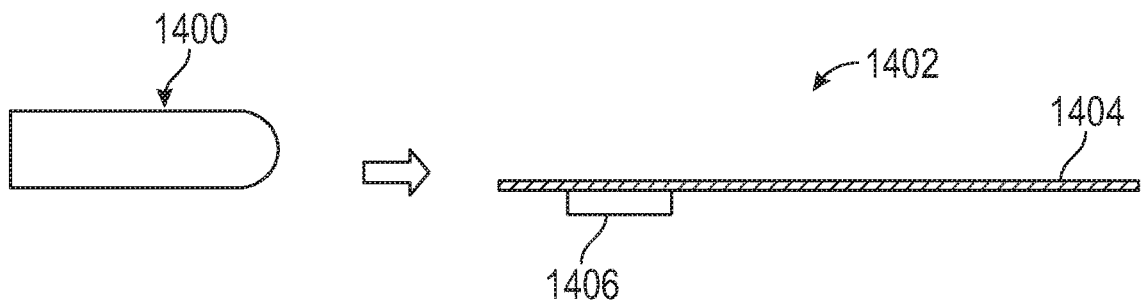
FIGS. 14A-14F illustrate steps for forming a fingerprint sensor module.

FIGS. 14A-14F illustrate cross sectional views of a manufacturing process for the fingerprint sensor module with a two sided PCB and ball grid assembly ("BGA") assembly pads in accordance with an exemplary embodiment. FIG. 14A shows a first step in which a rigid substrate 1400 is placed onto a flexible circuit subassembly 1402. In the embodiment of FIG. 14, which shows the rigid substrate 1400 in a transverse cross-section, the rigid substrate 1400 comprises a glass or ceramic core having a flat top and bottom surface, a straight left edge, and a rounded right edge. The flexible circuit subassembly 1402 includes a flexible substrate 1404 on which an ASIC (or other circuit element) 1406 is mounted.

Figure 14B:
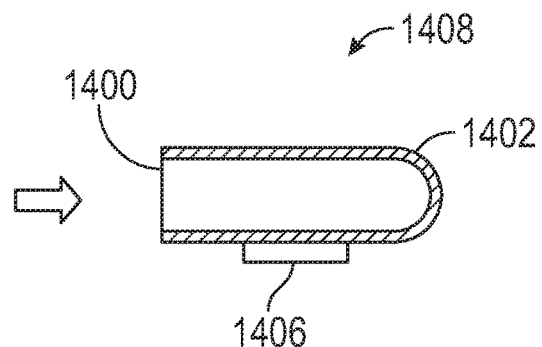

FIG. 14B shows a second step in which the flexible circuit subassembly 1402 is wrapped from the bottom surface of the rigid substrate 1400, around the rounded right edge, and over the top surface and secured to the rigid substrate 1400 to form a wrapped fingerprint sensor assembly 1408.

Figure 14C:
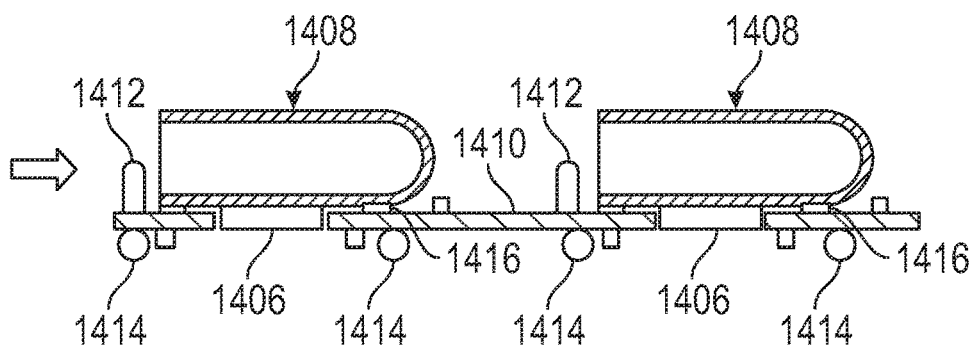

FIG. 14C shows a third step in which the wrapped fingerprint sensor assemblies 1408 are attached to a printed circuit board panel 1410 with the ASIC 1406 of each wrapped fingerprint sensor assembly 1408 extending through an opening formed in the PCB 1410. The printed circuit board 1410 is connected to the wrapped fingerprint sensor assembly 1408 by means of interconnects 1416. Passive circuit elements 1412 are attached to both sides of the printed circuit board and BGAs 1414 are attached to a lower surface of the PCB.

Figure 14D:
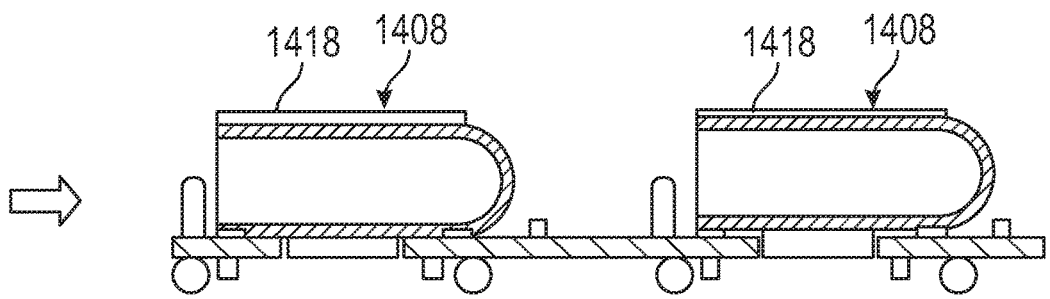

FIG. 14D shows a fourth step in which a cover element 1418 is attached to a top surface (i.e. the sensing surface) of each wrapped fingerprint sensor assembly 1408.

Figure 14E:
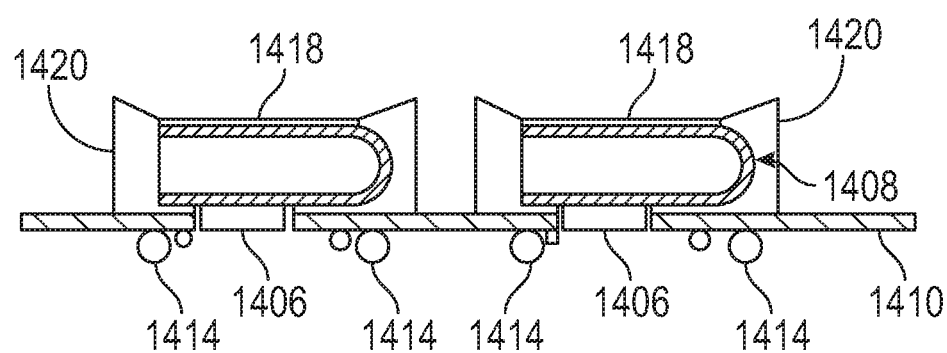

FIG. 14E shows a fifth step in which the fingerprint sensor assembly, comprising the wrapped fingerprint sensor assembly 1408 attached to the printed circuit board 1410 is encapsulated by a dielectric material 1420 covering the edges of the wrapped fingerprint sensor assembly 1408 and a portion of the printed circuit board 1410, leaving the sensor cover 1418 and the bottom surface of the printed circuit board including the ball grid arrays BGAs 1414 exposed.

Figure 14F:
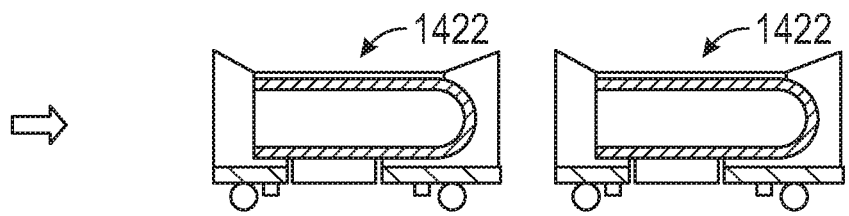

FIG. 14F shows a sixth step in which the PCB panel is cut to separate each encapsulated fingerprint sensor assembly from each other to form individual fingerprint sensor modules 1422.

In some embodiments, the manufacturing process depicted in FIGS. 14A-F14 may use a low profile PCB and LGA assembly pads instead of the two sided PCB and BGA assembly pads. In such embodiments, the LGA assembly pads eliminate the need for BGAs to provide clearance for passive components on the bottom side of the PCB. Accordingly, the process for manufacturing the fingerprint sensor module with the low profile PCB and LGA assembly pads is essentially identical to the process shown in FIGS. 14A-14F and described above, except that the passive components are attached to the top side of the PCB and the LGAs are disposed onto a lower surface of the PCB instead of BGAs.

Figure 15:
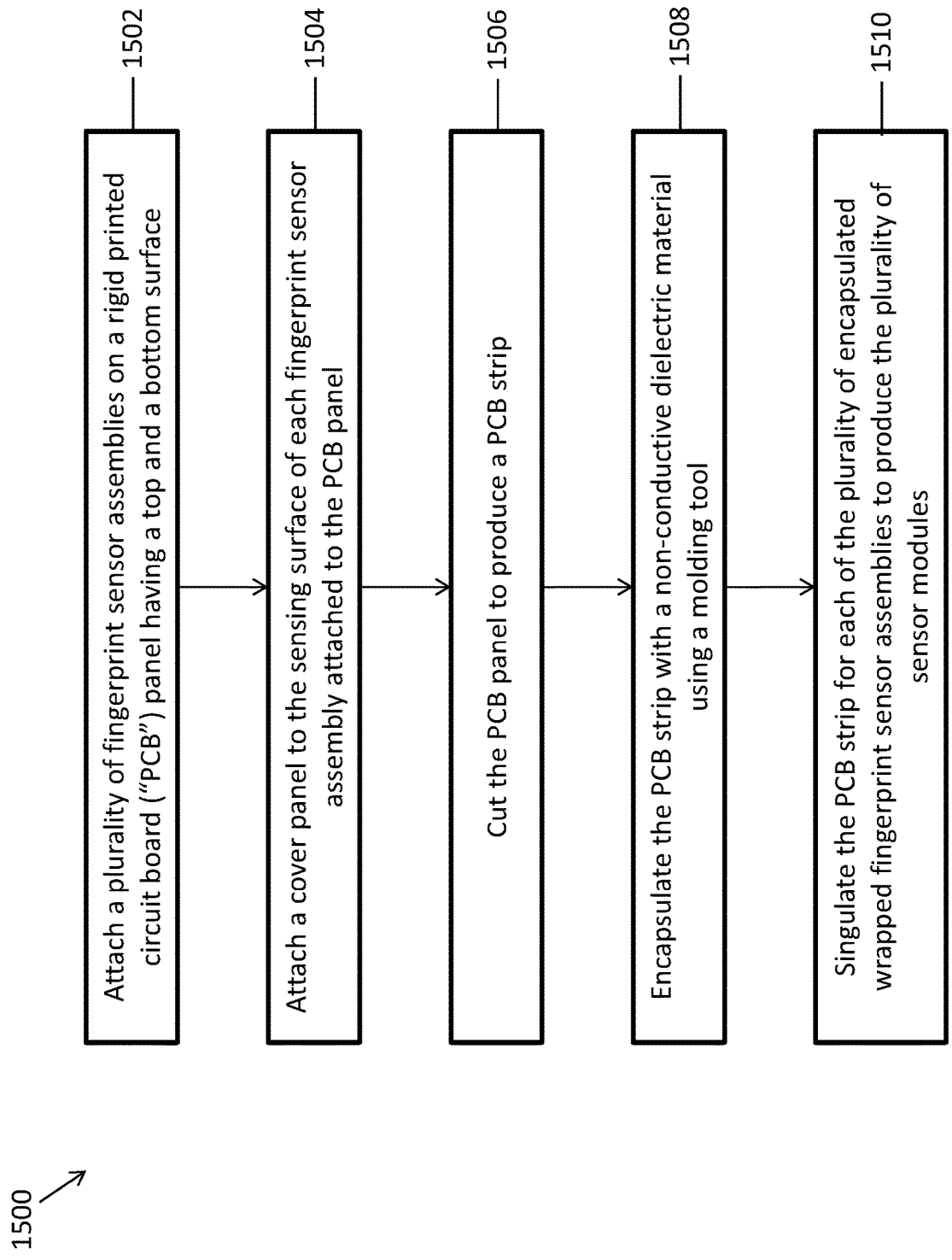
FIG. 15 illustrates a flow chart showing a process for forming a fingerprint sensor module.

FIG. 15 is a flow chart illustrating a process 1500 for manufacturing a plurality of sensor modules, according to some embodiments.

Process 1500 may being with step 1502 in which a plurality of fingerprint sensor assemblies is attached on a rigid printed circuit board ("PCB") panel having a top and a bottom surface. In some embodiments, each fingerprint sensor assembly includes opposed first and second surfaces and an integrated circuit disposed on the first surface and wherein the second surface is a sensing surface. In some embodiments, the PCB panel comprises a cutout for each fingerprint sensor assembly, the cutout providing a clearance for each of the integrated circuits disposed on each of the plurality of fingerprint sensor assemblies when attached to the top surface of the PCB panel.

In step 1504, a cover panel is attached to the sensing surface of each fingerprint sensor assembly attached to the PCB panel. In some embodiments, the cover panel is attached to the sensing surface after the encapsulating step 1508.

In step 1506, the PCB panel is cut to produce a PCB strip. In some embodiments, the PCB strip includes a row of the attached fingerprint sensor assemblies. In some embodiments, the PCB panel is cut to produce a PCB subpanel, wherein the PCB subpanel includes one or more rows of the attached wrapped fingerprint sensor assemblies.

In step 1508, the PCB strip is encapsulated with a non-conductive dielectric material using a molding tool. In some embodiments, the non-conductive dielectric material does not cover the sensing surfaces of the plurality wrapped fingerprint sensor assemblies attached to the PCB strip and the non-conductive dielectric material does not cover the bottom surface of the PCB strip. In some embodiments, the molding tool comprises a separate molding cavity for each of the plurality of wrapped fingerprint sensor assemblies attached to the PCB strip. In some embodiments, the molding tool comprises a single molding cavity for the plurality of wrapped fingerprint sensor assemblies attached to the PCB strip.

In step 1510, the PCB strip is singulated for each of the plurality of encapsulated wrapped fingerprint sensor assemblies to produce the plurality of sensor modules.

In some embodiments, the process 1500 may include a further step of mounting solder balls onto the bottom surface of the PCB strip. In some embodiments, the process 1500 may include a further step of attaching each cover panel to the sensing surface of the each fingerprint sensor assembly attached to the PCB panel after the encapsulating step 1508. In some embodiments, the step of attaching a cover panel to the sensing surface of each fingerprint sensor assembly (e.g., step 1504) may be omitted in a process for assembling fingerprint assemblies that do not include cover panels.

FIGS. 16-20 describe a second embodiment of the fingerprint sensor module.

Figure 16A:
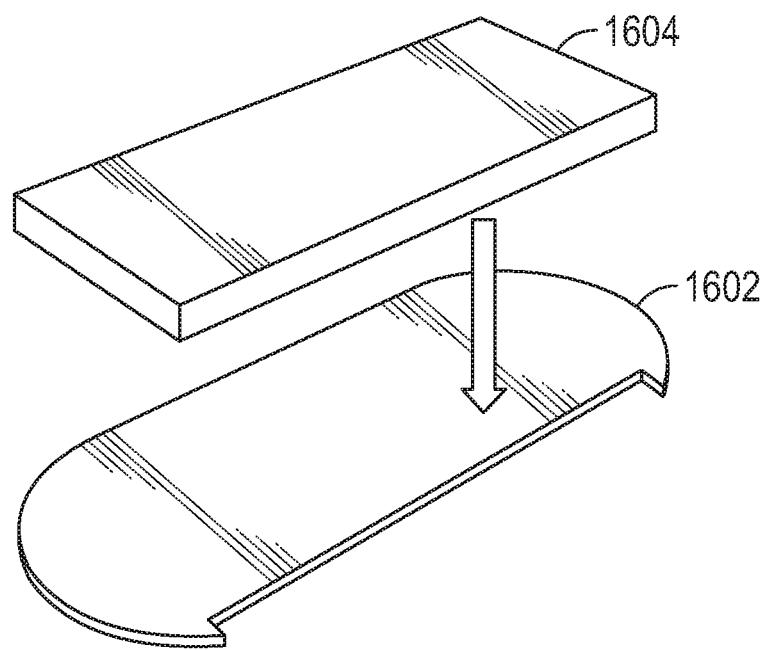
FIGS. 16A-16B are perspective views showing a rigid substrate mated with a notched PCB
Figure 16B:
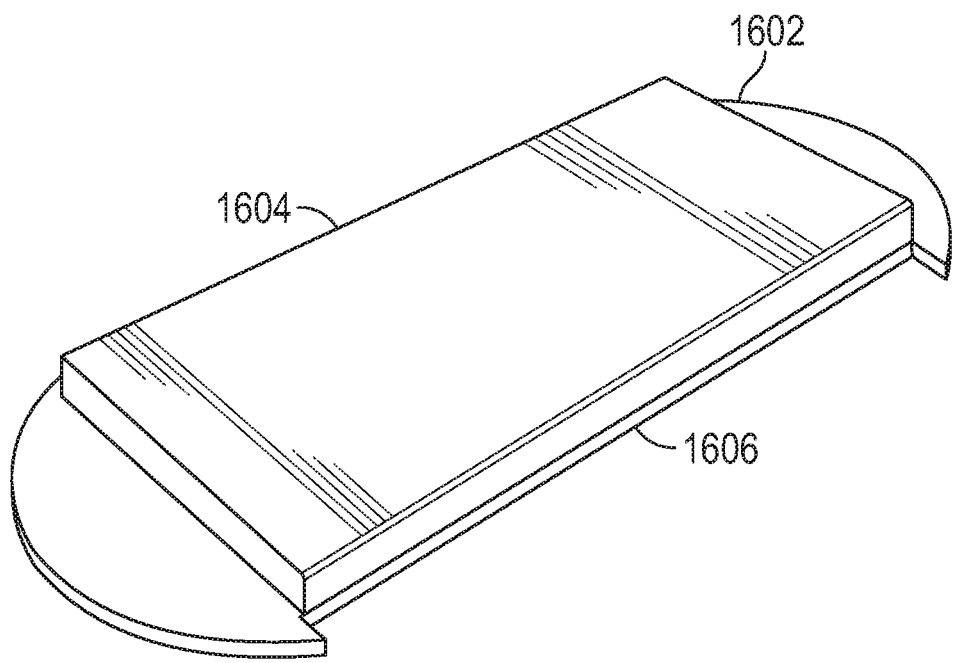

FIGS. 16A-16B illustrates an alternative configuration of a fingerprint sensor assembly whereby the rigid substrate is attached to the PCB before the flexible circuit subassembly is wrapped around and attached to the rigid substrate. A rigid substrate 1604 is attached to a PCB 1602. In some embodiments, a pressure sensitive sheet adhesive or epoxy sheet adhesive is used to attach the rigid substrate 1604 to the PCB 1602. Sheet adhesives provide a uniform z-height (thickness) which is ideal in some applications. The PCB 1602 may be substantially the same size and shape as a desired button shape for a host device. In an embodiment, the PCB 1602 is slightly larger than the desired button shape and can be ground or milled to be conformed accordingly at a later stage. The PCB 1602 may comprise two or more layers. In an embodiment, the PCB 1602 is multi layered. The length of the rigid substrate 1604 is maximized compared to the desired button shape in order to create the largest possible sensor area. The rigid substrate 1604 is attached to the PCB 1602 so that one long edge of the rigid substrate 104 aligns with a notch 1606 formed along one edge of the PCB 1602.

Figure 17A:
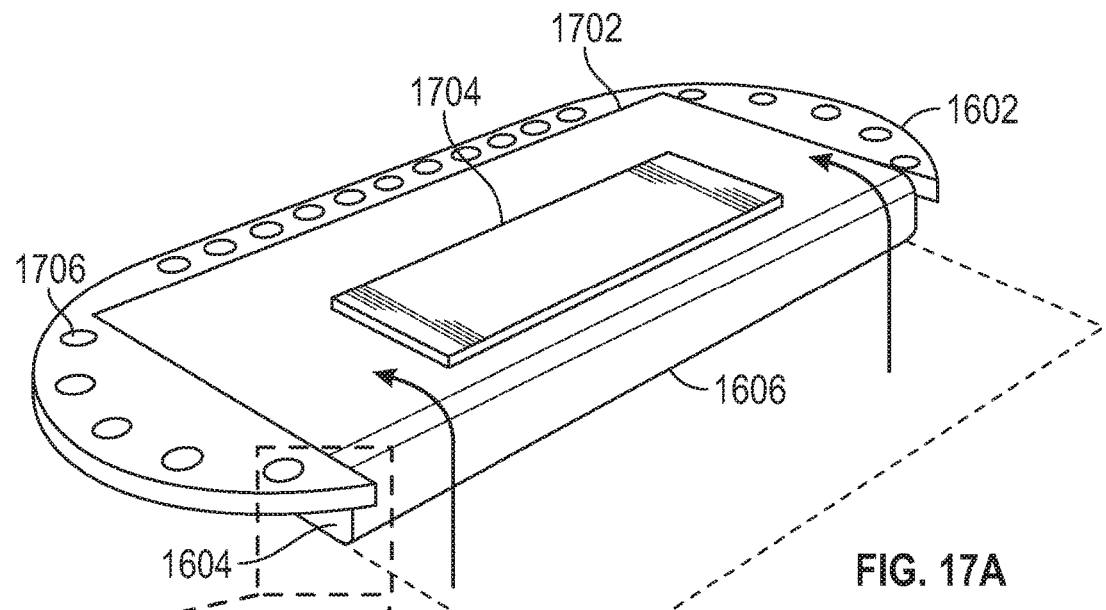
FIGS. 17A-17B are perspective views showing a fingerprint sensor stack comprising a flexible circuit subassembly wrapped around the rigid substrate and the notched PCB to which the rigid substrate is mated.
Figure 17B:
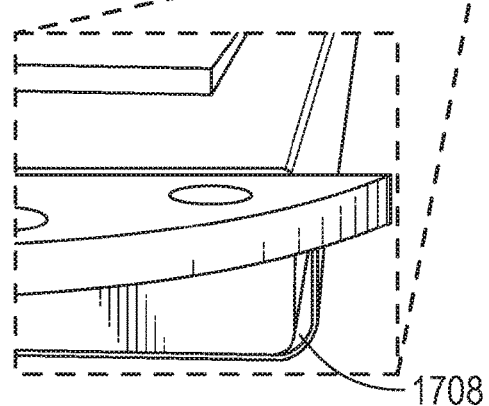

FIGS. 17A-17B illustrates a flexible circuit subassembly 1702 wrapped around the rigid substrate 1604 attached to the PCB 1602 in accordance with an exemplary embodiment. The side of the PCB 1602 that will meet with the flexible circuit subassembly 1702 has connector pads arranged in order to match up with the connector pads on the flexible circuit subassembly 1702 so that the flexible circuit subassembly 1702 is mounted centrally on the PCB 1602 along its length.

The notch 1606 on the side of the PCB 1602 allows the flexible circuit subassembly 1602 to attach directly to the PCB 1602 and the rigid substrate 1604. The portion of the flexible circuit subassembly 1702 with the imaging area (e.g., with conductive sensor elements) is attached to the rigid substrate 1604 and the portion of the flexible circuit subassembly 1702 with the ASIC 1704 is wrapped around an edge of the rigid substrate 1604 and attached to the bottom surface of the PCB 1602. In an embodiment, the portion of the flexible circuit subassembly 1702 with the ASIC 1704 is attached to the bottom surface of the PCB 1602 and then the portion of the flexible circuit subassembly 1702 with the imaging area is wrapped around and attached to the surface of the rigid substrate 1604. As described in U.S. Provisional Application Nos. 62/258,284; 62/349,256; and 62/374,339, and U.S. Non-Provisional application Ser. No. 15/354,426 (U.S. Patent Application Publication No. 2017/0147852) "Electronic Sensor Supported on Rigid Substrate," the wrapping is carried out deliberately loosely at the short edge to create a side-gap 1708 or "service loop" to reduce stress on conductive traces of the flexible circuit subassembly and the soldermask. Adhesion to the surfaces of the rigid substrate 1604 and the PCB 1602 is tight and flat.

In an embodiment, the bottom surface of the PCB 1602 has BGA assembly pads 1706 that allow the finished fingerprint sensor module to be connected to a host device. In an embodiment, passive components are mounted on the top surface of the PCB 1602. As described in FIGS. 2-4, the flexible circuit subassembly 1702 attaches to the PCB 1602 using interconnects on three sides, excluding the wrapped edge.

Figure 18:
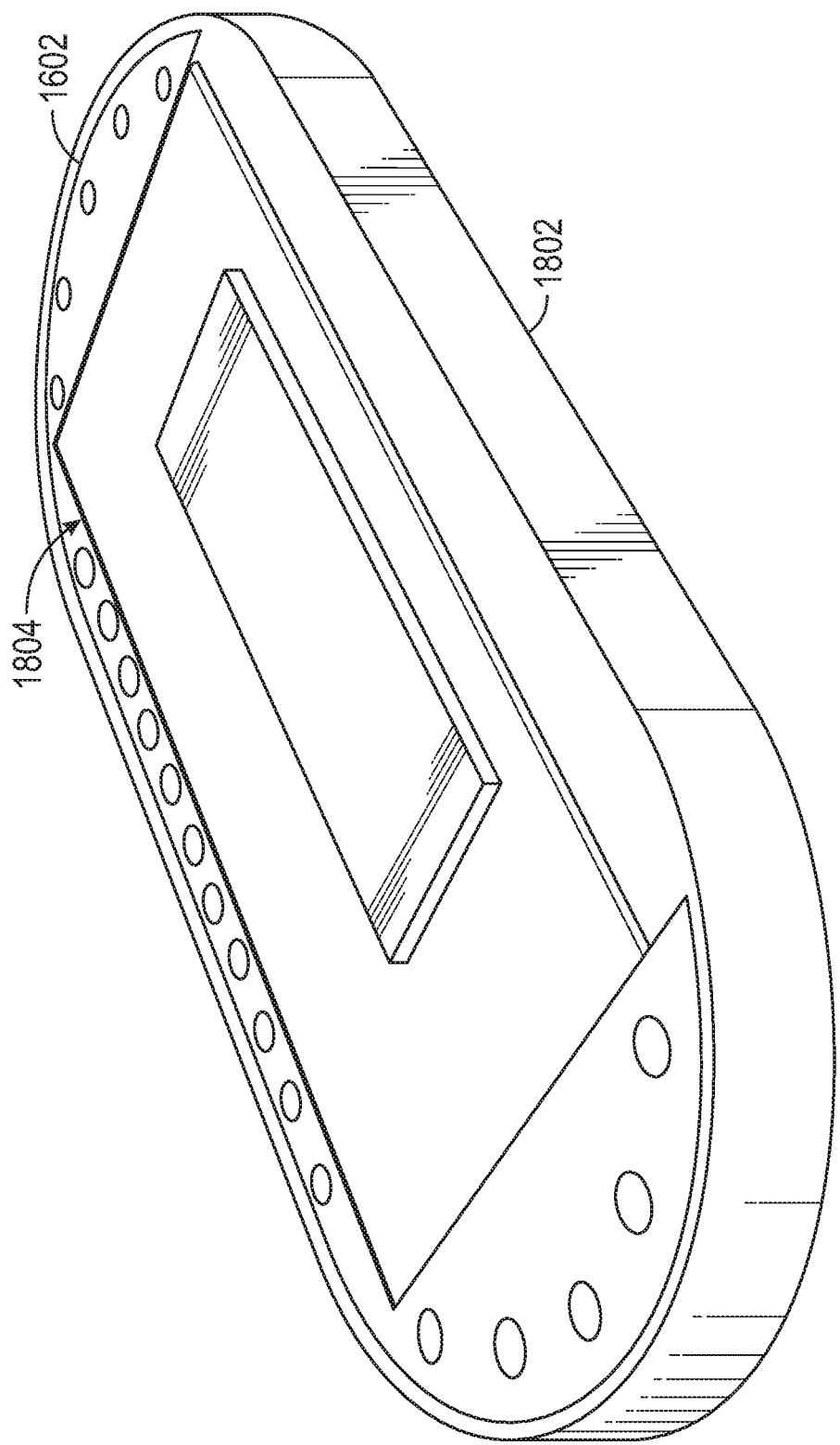
FIG. 18 is a perspective view showing a fingerprint sensor module comprising the fingerprint sensor stack of FIGS. 17A-17B encapsulated in an encapsulating material

FIG. 18 illustrates the PCB 1602 and the wrapped fingerprint sensor assembly 1804 encapsulated in a non-conductive dielectric material 1802. As described in FIGS. 9A-9B, the PCB 1602 and the wrapped fingerprint sensor assembly 1804 are encapsulated in a non-conductive dielectric material 1802. In an embodiment, the encapsulant 1802 "fills" the notch 1606 to form a shape generally conforming to the un-notched side of the PCB.

Figure 19A:
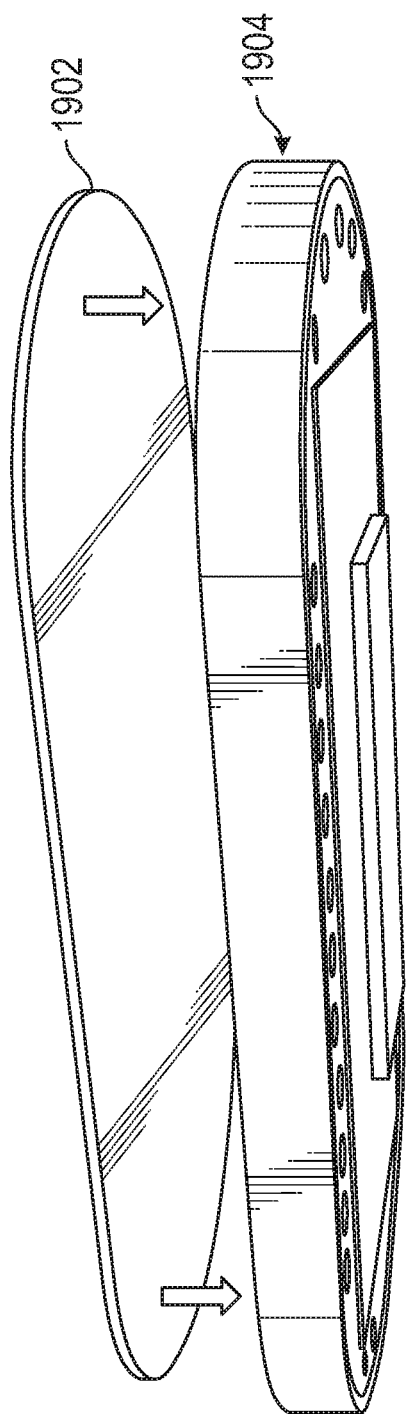
FIG. 19A is an exploded perspective view showing the fingerprint sensor module of FIG. 18 and a cover panel.
Figure 19B:
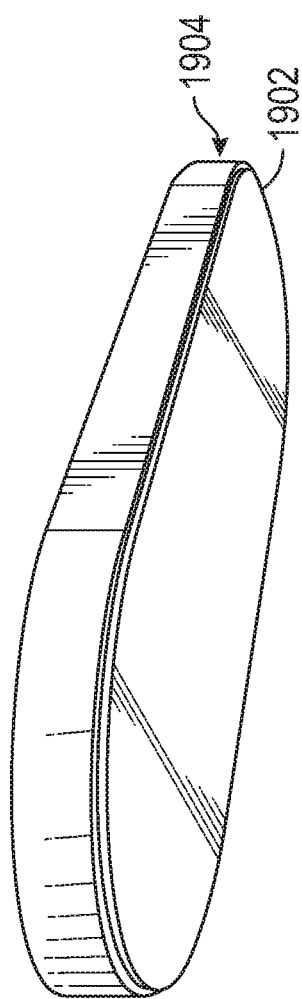
FIG. 19B is a perspective view showing the top of a fingerprint sensor module of FIG. 18 and a cover panel.

FIGS. 19A-19B illustrate a cover panel 1902 attached to the encapsulated PCB and the wrapped fingerprint sensor assembly 1904. As described in FIGS. 4 and 9A-9C, the cover panel 1902 is attached to the encapsulated PCB and the wrapped fingerprint sensor assembly 1904 to produce the fingerprint sensor module 2002, as illustrated in FIG. 20.

In current methods, the footprint of the "lobes" of the flex substrate sensing element, for example, as described in U.S. Provisional Application Nos. 62/258,284; 62/349,256; and 62/374,339, and U.S. Non-Provisional application Ser. No. 15/354,426 (U.S. Patent Application Publication No. 2017/0147852) "Electronic Sensor Supported on Rigid Substrate," matched the ultimate sensor body outline, which typically was oval or had rounded ends, thus utilizing a larger area of flex than that required for the sensing function itself—which would be most efficiently achieved in a rectangular footprint. However, each different sensor form factor requires a new flex design, and the larger area of flex substrate requires additional costs to the sensor. The current invention explains that the wrapped edge length of the rectangular wrapped fingerprint sensor assembly and rigid core is maximized compared to the shorter flat portion of length of an oval or rounded sensor or button of the host device. The disclosed fingerprint sensor module therefore allows more sensor elements compared to conventional sensors, thus, enabling the largest possible sensor area (and hence image size) for a given physical button size.

The shape and size of the cover panel (and optionally the PCB) together with the encapsulant is determined by the final package shape (e.g., lozenge-shaped, circular, etc.). In an embodiment, the outer peripheral dimension of the fingerprint sensor module is determined by the package form factor, i.e. a "lozenge" shape or a circular shape of specified size. In an embodiment, the encapsulating material, the cover panel, and the PCB can be ground or milled to configure the outer peripheral dimension of the fingerprint sensor module to substantially match the package form factor. In an embodiment, the PCB is a different shape and larger than the package shape, as illustrated and described in FIGS. 12D-12E. In such an embodiment, the PCB is configured to have a larger size in one or more dimensions than the package form factor, and only the outer peripheral dimension of the encapsulating material and the cover panel are configured to substantially match the package shape.

Different package form factors only require changes to the cover panel, overmolding tool, (and optionally the PCB shape), but not to the wrapped fingerprint sensor assembly itself. Hence, the disclosed fingerprint sensor module allows quick and easy sensor form factor customization at low costs because a "standard" fingerprint sensor assembly can be employed in many different package form factors.

Different button shapes only require changes to the cover panel and the overmolding tool, (and optionally to the PCB shape), not to the wrapped fingerprint sensor assembly itself. Hence, the disclosed fingerprint sensor module allows quick and easy sensor form factor customization at low costs.

Further, by encapsulating the wrapped fingerprint sensor assembly between a PCB and rigid cover panel as described by the current invention, a homogenous and mechanically stable block is created that can be easily incorporated into the host device cutout panel.

EXEMPLARY EMBODIMENTS

Aspects of the disclosure are summarized by the following numbered embodiments.

Embodiment 1

A sensor module comprising:
a fingerprint sensor assembly having first and second surfaces, wherein an integrated circuit is disposed on the first surface and the second surface comprises a sensing surface;
a printed circuit board (PCB) having a top and a bottom surface, wherein the first surface of the fingerprint sensor assembly is attached to the top surface of the printed circuit board, wherein the printed circuit board has a cutout formed therein to receive a portion of the fingerprint sensor assembly, and wherein outer peripheral dimensions of the printed circuit board are larger than outer peripheral dimensions of the fingerprint sensor assembly, thereby forming a peripheral margin between edges of the fingerprint sensor assembly and edges of the printed circuit board; and
an encapsulating material within the peripheral margin between edges of the fingerprint sensor assembly and edges of the printed circuit board and partially encapsulating the fingerprint sensor assembly and the PCB substrate, wherein the encapsulating material does not cover the sensing surface of the fingerprint sensor assembly and the bottom surface of the PCB substrate.

Embodiment 2

The sensor module of Embodiment 1, wherein the PCB is rigid.

Embodiment 3

The sensor module of Embodiment 1 or 2, wherein the encapsulating material comprises a nonconductive dielectric material.

Embodiment 4

The sensor module of any one of Embodiments 1 to 3, wherein the encapsulating material fills the peripheral margin to the edges of the printed circuit board.

Embodiment 5

The sensor module of any one of Embodiments 1 to 4, wherein the encapsulating material forms a package shape having a first length in a first dimension and a first width in a second dimension perpendicular to the first dimension, and wherein the package shape includes two straight and parallel sides each of a second length in the first dimension and spaced apart by the first width in the second dimension, and wherein the fingerprint sensor assembly has a rectangular shape with a third length in the first dimension that is less than the first length and greater than the second length and has a width in the second dimension that is less than the first width.

Embodiment 6

The sensor module of Embodiment 5, wherein the fingerprint sensor assembly comprises a plurality of conductive drive lines and a plurality of conductive pickup lines overlapping the drive lines, wherein each of the drive lines are generally parallel to one another, each of the pickup lines are generally parallel to one another, the pickup lines are oriented transversely to the drive lines and the pickup lines are separated from the drive lines by a layer of dielectric material, and wherein the drives lines are oriented in the first dimension and the pickup lines are oriented in the second dimension.

Embodiment 7

The sensor module of any one of Embodiments 1 to 6, wherein the fingerprint sensor assembly comprises a wrapped fingerprint sensor assembly comprising a flexible circuit subassembly wrapped at least partially around a rigid substrate, wherein the rigid substrate comprises a dielectric core having continuous flat opposed surfaces.

Embodiment 8

The sensor module of any one of Embodiments 1 to 7, wherein the fingerprint sensor assembly comprises interconnect pads on one or more edges of the first surface.

Embodiment 9

The sensor module of any one of Embodiments 1 to 8, wherein the fingerprint sensor assembly comprises one or more chamfered corners.

Embodiment 10

The sensor module of any one of Embodiments 1 to 9, wherein the outer peripheral dimension of the printed circuit board is substantially the same as an outer peripheral dimension of a package shape for a host device.

Embodiment 11

The sensor module of any one of Embodiments 1 to 9, wherein the outer peripheral dimension of the printed circuit board is larger than an outer peripheral dimension of a package shape for a host device.

Embodiment 12

The sensor module of any one of Embodiments 1 to 11, further comprising a cover panel attached over the sensing surface of the wrapped fingerprint sensor assembly

Embodiment 13

The sensor module of Embodiment 12, wherein the outer peripheral dimension of the cover panel is substantially the same as an outer peripheral dimension of a package shape for a host device.

Embodiment 14

The sensor module of Embodiment 10 or 11, wherein the package shape for the host device corresponds to a perimeter of a physical button inserted into a cover panel of the host device.

Embodiment 15

The sensor module of Embodiment 10 or 11, wherein the package shape for the host device corresponds to a shape of an area of a cover panel of the host device dedicated to fingerprint sensing.

Embodiment 16

The sensor module of any one of Embodiments 1 to 15, wherein the printed circuit board comprises two or more circuit layers.

Embodiment 17

The sensor module of any one of Embodiments 1 to 16, wherein the top surface of the printed circuit board comprises connectors pads to attach to the fingerprint sensor assembly.

Embodiment 18

The sensor module of any one of Embodiments 1 to 17, further comprising one or more passive components attached to a surface of the printed circuit board such that the one or more passive components do not interfere with attachment between the printed circuit board and the fingerprint sensor assembly.

Embodiment 19

The sensor module of Embodiment 12 or 13, further comprising one or more passive components attached to a surface of the printed circuit board such that the one or more passive components do not interfere with attachment between the printed circuit board and the fingerprint sensor assembly, and wherein the one or more passive components is attached to top surface of the printed circuit board such that the plurality of passive components are positioned between the printed circuit board and the cover panel.

Embodiment 20

The sensor module of any one of Embodiments 18 or 19, wherein the one or more passive components are attached to a surface of the printed circuit board such that the plurality of passive components are positioned within the outer peripheral dimension of the package shape for the host device.

Embodiment 21

The sensor module of Embodiments 18 to 20, wherein the one or more passive components are attached to both surfaces of the printed circuit board.

Embodiment 22

The sensor module of any one of Embodiments 18 to 21, wherein the one or more passive components include at least one of capacitors and inductors.

Embodiment 23

The sensor module of any one of Embodiments 1 to 22, wherein the printed circuit board comprises ball grid array ("BGA") assembly pads on the bottom surface of the printed circuit board to allow the sensor module to be interconnected with a host device.

Embodiment 24

The sensor module of any one of Embodiments 1 to 22, wherein the printed circuit board comprises land grid array ("LGA") assembly pads on the bottom surface of the printed circuit board to allow the sensor module to be interconnected with a host device.

Embodiment 25

The sensor module of Embodiment 12 or 13, wherein the cover panel is made of glass, ceramic, a composite polymer material, or zirconia.

Embodiment 26

The sensor module of any one of Embodiments 1 to 25, wherein the non-conductive dielectric material comprises liquid crystal polymer or an epoxy.

Embodiment 27

The sensor module of any one of Embodiments 1 to 26, wherein the first and second surfaces of the fingerprint sensor assembly are opposed to one another.

Embodiment 28

The sensor module of any one of Embodiments 1 to 27, wherein the integrated circuit is disposed in the cutout formed in the printed circuit board.

Embodiment 29

The sensor module of Embodiment 28, wherein an outer peripheral dimension of the cutout is substantially similar to an outer peripheral dimension of the integrated circuit.

Embodiment 30

The sensor module of Embodiment 28 or 29, wherein the integrated circuit is recessed with respect to the printed circuit board in the cutout.

Embodiment 31

The sensor module of Embodiment 28 or 29, wherein the integrated circuit is flush with or protrudes above the bottom surface of the printed circuit board in the cutout.

Embodiment 32

A method for manufacturing a plurality of sensor modules, the method comprising:
attaching a plurality of fingerprint sensor assemblies on a rigid printed circuit board ("PCB") panel having a top and a bottom surface, wherein each fingerprint sensor assembly includes opposed first and second surfaces and an integrated circuit disposed on the first surface and wherein the second surface is a sensing surface;
wherein the PCB panel comprises a cutout for each fingerprint sensor assembly, the cutout providing a clearance for each of the integrated circuits disposed on each of the plurality of fingerprint sensor assemblies when attached to the top surface of the PCB panel,
cutting the PCB panel to produce a PCB strip, wherein the PCB strip includes a row of the attached fingerprint sensor assemblies;
encapsulating the PCB strip with a non-conductive dielectric material using a molding tool, wherein the non-conductive dielectric material does not cover the sensing surfaces of the plurality of fingerprint sensor assemblies attached to the PCB strip and the non-conductive dielectric material does not cover the bottom surface of the PCB strip; and
singulating the PCB strip for each of the plurality of encapsulated fingerprint sensor assemblies to produce the plurality of sensor modules.

Embodiment 33

The method of Embodiment 32, further comprising:
cutting the PCB panel to produce a PCB subpanel, wherein the PCB subpanel includes one or more rows of the attached fingerprint sensor assemblies.

Embodiment 34

The method of Embodiment 33 or 32, wherein the molding tool comprises a separate molding cavity for each of the plurality of fingerprint sensor assemblies attached to the PCB strip.

Embodiment 35

The method of any one of Embodiments 32 to 34, wherein the molding tool comprises a single molding cavity for the plurality of fingerprint sensor assemblies attached to the PCB strip.

Embodiment 36

The method of any one of Embodiments 32 to 35, further comprising: mounting solder balls onto the bottom surface of the PCB strip.

Embodiment 37

The method of any one of Embodiments 32 to 36, further comprising attaching a cover panel to the sensing surface of each fingerprint sensor assembly attached to the PCB panel.

Embodiment 38

The method of Embodiment 37, wherein the cover panel is attached to the sensing surface before the encapsulating step.

Embodiment 39

The method of Embodiment 37, wherein the cover panel is attached to the sensing surface after the encapsulating step.

Embodiment 40

A sensor module comprising:
a wrapped fingerprint sensor assembly comprising:
a rigid printed circuit board ("PCB") having a top surface and a bottom surface and a notch extending along one of two opposed edges of the PCB;
a rigid substrate attached on one surface thereof to the top surface of the PCB, wherein a first edge of the rigid substrate is aligned with an edge of the slot on the PCB;
a flexible substrate attached to a surface of the rigid substrate opposite the surface attached to the PCB and wrapped around the first edge of the rigid substrate through the slot and attached to the bottom surface of the PCB,
wherein the part of the flexible substrate attached to the surface of the rigid substrate is a sensing surface,
wherein an integrated circuit is disposed on the flexible substrate, and
wherein the integrated circuit is positioned on the bottom surface of the PCB substrate;
an encapsulating material partially encapsulating the fingerprint sensor assembly, wherein the encapsulating material does not cover the sensing surface and the flexible substrate attached to the bottom of the PCB substrate; and a cover panel attached over the sensing surface.

Embodiment 41

The sensor module of Embodiment 40, wherein the encapsulating material comprises a nonconductive dielectric material.

Embodiment 42

The sensor module of Embodiment 40 or 41, wherein the PCB has an outer peripheral dimension which is substantially the same as an outer peripheral dimension of a package shape for a host device.

Embodiment 43

The sensor module of any one of Embodiments 40 to 42, wherein an outer peripheral dimension of the cover panel is substantially the same as an outer peripheral dimension of a package shape for a host device.

Embodiment 44

The sensor module of any one of Embodiments 40 to 43, wherein the package shape for the host device corresponds to a perimeter of a physical button inserted into a cover panel of the host device.

Embodiment 45

The sensor module of any one of Embodiments 40 to 43, wherein the package shape for the host device corresponds to a shape of an area of a cover panel of the host device dedicated to fingerprint sensing.

Embodiment 46

The sensor module of any one of Embodiments 40 to 45, wherein the PCB comprises two or more circuit layers.

Embodiment 47

The sensor module of any one of Embodiments 40 to 46, further comprising one or more passive components attached to a surface of the PCB.

Embodiment 48

The sensor module of Embodiment 47, wherein the one or more passive components is attached to top surface of the PCB substrate such that the one or more passive components are positioned between the PCB and the cover panel.

Embodiment 49

The sensor of Embodiment 47 or 48, wherein the one or more passive components are attached to a surface of the printed circuit board such that the plurality of passive components are positioned within the outer peripheral dimension of the package shape for the host device.

Embodiment 50

The sensor module of Embodiment 47 to 38, comprising a plurality of passive components attached to both surfaces of the PCB.

Embodiment 51

The sensor module of any one of Embodiments 47 to 50, wherein the one or more passive components include at least one of capacitors and inductors.

Embodiment 52

The sensor module of any one of Embodiments 40 to 51, wherein the PCB comprises ball grid array ("BGA") assembly pads on the bottom surface to allow the sensor module to be interconnected with a host device.

Embodiment 53

The sensor module of any one of Embodiments 40 to 51, wherein the PCB comprises land grid array ("LGA") assembly pads on the bottom surface to allow the sensor module to be interconnected with a host device.

Embodiment 54

The sensor module of any one of Embodiments 40 to 53, wherein the cover panel is made of glass, ceramic, or zirconia.

Embodiment 55

The sensor module of any one of Embodiments 40 to 54, wherein the non-conductive dielectric material is liquid crystal polymer.

While the subject matter of this disclosure has been described and shown in considerable detail with reference to certain illustrative embodiments, including various combinations and sub-combinations of features, those skilled in the art will readily appreciate other embodiments and variations and modifications thereof as encompassed within the scope of the present disclosure. Moreover, the descriptions of such embodiments, combinations, and sub-combinations is not intended to convey that the claimed subject matter requires features or combinations of features other than those expressly recited in the claims. Accordingly, the scope of this disclosure is intended to include all modifications and variations encompassed within the spirit and scope of the following appended claims.

The invention claimed is:

1. A sensor module comprising:
 a fingerprint sensor assembly having first and second surfaces and comprising:
  a rigid substrate with a first surface and a second surface;
  a sensing surface on the first surface of the fingerprint sensor assembly that overlies first surface of the rigid substrate; and
  an integrated circuit disposed on the second surface of the fingerprint sensor assembly, and overlying the second surface of the rigid substrate;

a printed circuit board (PCB) having a top and a bottom surface, wherein the second surface of the fingerprint sensor assembly is attached to the top surface of the PCB, wherein the printed circuit board has a cutout formed therein to receive a portion of the fingerprint sensor assembly, and wherein outer peripheral dimensions of the PCB are larger than outer peripheral dimensions of the fingerprint sensor assembly, thereby forming a peripheral margin between edges of the fingerprint sensor assembly and edges of the PCB; and an encapsulating material within the peripheral margin between edges of the fingerprint sensor assembly and edges of the PCB and partially encapsulating the fingerprint sensor assembly and the PCB, wherein the encapsulating material does not cover the sensing surface of the fingerprint sensor assembly and the bottom surface of the PCB.

2. The sensor module of claim 1, wherein the PCB is rigid.

3. The sensor module of claim 1, wherein the encapsulating material comprises a nonconductive dielectric material.

4. The sensor module of claim 3, wherein the nonconductive dielectric material comprises liquid crystal polymer or an epoxy.

5. The sensor module of claim 1, wherein the encapsulating material fills the peripheral margin to the edges of the PCB.

6. The sensor module of claim 1, wherein the encapsulating material forms a package shape having a first length in a first dimension and a first width in a second dimension perpendicular to the first dimension, and wherein the package shape includes two straight and parallel sides each of a second length in the first dimension and spaced apart by the first width in the second dimension, and wherein the fingerprint sensor assembly has a rectangular shape with a third length in the first dimension that is less than the first length and greater than the second length and has a width in the second dimension that is less than the first width.

7. The sensor module of claim 6, wherein the fingerprint sensor assembly comprises a plurality of conductive drive lines and a plurality of conductive pickup lines overlapping the drive lines, wherein each of the drive lines are generally parallel to one another, each of the pickup lines are generally parallel to one another, the pickup lines are oriented transversely to the drive lines and the pickup lines are separated from the drive lines by a layer of dielectric material, and wherein the drives lines are oriented in the first dimension and the pickup lines are oriented in the second dimension.

8. The sensor module of claim 1, wherein the fingerprint sensor assembly comprises a wrapped fingerprint sensor assembly comprising a flexible circuit subassembly wrapped at least partially around the rigid substrate, wherein the rigid substrate comprises a dielectric core having continuous flat opposed surfaces.

9. The sensor module of claim 1, wherein the fingerprint sensor assembly comprises interconnect pads on one or more edges of the second surface.

10. The sensor module of claim 1, wherein the fingerprint sensor assembly comprises one or more chamfered corners.

11. The sensor module of claim 1, wherein the outer peripheral dimension of the PCB is substantially the same as an outer peripheral dimension of a package shape for a host device.

12. The sensor module of claim 11, wherein the package shape for the host device corresponds to a perimeter of a physical button inserted into a cover panel of the host device.

13. The sensor module of claim 11, wherein the package shape for the host device corresponds to a shape of an area of a cover panel of the host device dedicated to fingerprint sensing.

14. The sensor module of claim 1, wherein the outer peripheral dimension of the PCB is larger than an outer peripheral dimension of a package shape for a host device.

15. The sensor module of claim 1, further comprising a cover panel attached over the sensing surface of the fingerprint sensor assembly.

16. The sensor module of claim 15, wherein the outer peripheral dimension of the cover panel is substantially the same as an outer peripheral dimension of a package shape for a host device.

17. The sensor module of claim 15, further comprising one or more passive components attached to a surface of the PCB such that the one or more passive components do not interfere with attachment between the PCB and the fingerprint sensor assembly, and wherein the one or more passive components is attached to top surface of the PCB such that the plurality of passive components are positioned between the PCB and the cover panel.

18. The sensor module of claim 15, wherein the cover panel is made of glass, ceramic, a composite polymer material, or zirconia.

19. The sensor module of claim 1, wherein the PCB comprises two or more circuit layers.

20. The sensor module of claim 1, wherein the top surface of the PCB comprises connectors pads to attach to the fingerprint sensor assembly.

21. The sensor module of claim 1, further comprising one or more passive components attached to a surface of the printed circuit board such that the one or more passive components do not interfere with attachment between the PCB and the fingerprint sensor assembly.

22. The sensor module of claim 21, wherein the one or more passive components are attached to a surface of the PCB such that the plurality of passive components are positioned within the outer peripheral dimension of the package shape for the host device.

23. The sensor module of claim 21, wherein the one or more passive components are attached to both surfaces of the printed PCB.

24. The sensor module of claim 21, wherein the one or more passive components include at least one of capacitors and inductors.

25. The sensor module of claim 1, wherein the PCB comprises ball grid array ("BGA") assembly pads on the bottom surface of the PCB to allow the sensor module to be interconnected with a host device.

26. The sensor module of claim 1, wherein the PCB comprises land grid array ("LGA") assembly pads on the bottom surface of the PCB to allow the sensor module to be interconnected with a host device.

27. The sensor module of claim 1, wherein the first and second surfaces of the fingerprint sensor assembly are opposed to one another.

28. The sensor module of claim 1, wherein the integrated circuit is disposed in the cutout formed in the PCB.

29. The sensor module of claim 28, wherein an outer peripheral dimension of the cutout is substantially similar to an outer peripheral dimension of the integrated circuit.

30. The sensor module of claim 28, wherein the integrated circuit is recessed with respect to the PCB in the cutout.

31. The sensor module of claim 28, wherein the integrated circuit is flush with or protrudes above the bottom surface of the PCB in the cutout.

* * * * *

UNITED STATES PATENT AND TRADEMARK OFFICE
CERTIFICATE OF CORRECTION

PATENT NO. : 10,687,424 B2
APPLICATION NO. : 15/878600
DATED : June 16, 2020
INVENTOR(S) : Fred G. Benkley et al.

Page 1 of 1

It is certified that error appears in the above-identified patent and that said Letters Patent is hereby corrected as shown below:

In the Claims

Column 32, Line 63, Claim 1, replace "sensor assembly that overlies first surface of the rigid" with -- sensor assembly that overlies the first surface of the rigid --.

Signed and Sealed this
Twentieth Day of October, 2020

Andrei Iancu
*Director of the United States Patent and Trademark Office*